United States Patent
Nishido et al.

(10) Patent No.: US 9,735,222 B2
(45) Date of Patent: Aug. 15, 2017

(54) METHOD FOR MANUFACTURING CIRCUIT BOARD, METHOD FOR MANUFACTURING LIGHT-EMITTING DEVICE, AND LIGHT-EMITTING DEVICE

(71) Applicant: Semiconductor Energy Laboratory Co., Ltd., Atsugi-shi, Kanagawa-ken (JP)

(72) Inventors: Yusuke Nishido, Kanagawa (JP); Tatsuya Sakuishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/098,444

(22) Filed: Apr. 14, 2016

(65) Prior Publication Data

US 2016/0315134 A1 Oct. 27, 2016

(30) Foreign Application Priority Data

Apr. 22, 2015 (JP) ................................. 2015-087728

(51) Int. Cl.
*H01L 27/32* (2006.01)
*H01L 51/56* (2006.01)
*H01L 51/00* (2006.01)
*H05K 3/00* (2006.01)

(52) U.S. Cl.
CPC ...... *H01L 27/3276* (2013.01); *H01L 51/0097* (2013.01); *H01L 51/56* (2013.01); *H05K 3/0047* (2013.01); *H01L 2227/323* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 8,222,666 B2 | 7/2012 | Hatano et al. | |
| 8,956,891 B2 | 2/2015 | Chida | |
| 9,065,034 B2 | 6/2015 | Chida | |
| 2003/0032210 A1 | 2/2003 | Takayama et al. | |
| 2013/0240855 A1 | 9/2013 | Chida et al. | |
| 2014/0264425 A1 | 9/2014 | Chida | |
| 2014/0273317 A1 | 9/2014 | Chida | |
| 2015/0263314 A1 | 9/2015 | Sakuishi et al. | |
| 2016/0020355 A1 | 1/2016 | Aoyama et al. | |

FOREIGN PATENT DOCUMENTS

JP 2003-174153 A 6/2003

*Primary Examiner* — Asok K Sarkar
(74) *Attorney, Agent, or Firm* — Fish & Richardson P.C.

(57) ABSTRACT

A circuit board in which damage to an electrode is reduced or a light-emitting device in which damage to an electrode is reduced is manufactured. A method for manufacturing the circuit board or the light-emitting device includes the following steps: preparing a processing member including a circuit and a terminal electrode over a first substrate, a separation layer over the terminal electrode, a bonding layer over the separation layer, and a second substrate over the bonding layer; forming a groove in the processing member using a blade capable of cutting processing by being rotated; and removing part of the separation layer, part of the bonding layer, and part of the second substrate to expose part of the terminal electrode.

18 Claims, 51 Drawing Sheets

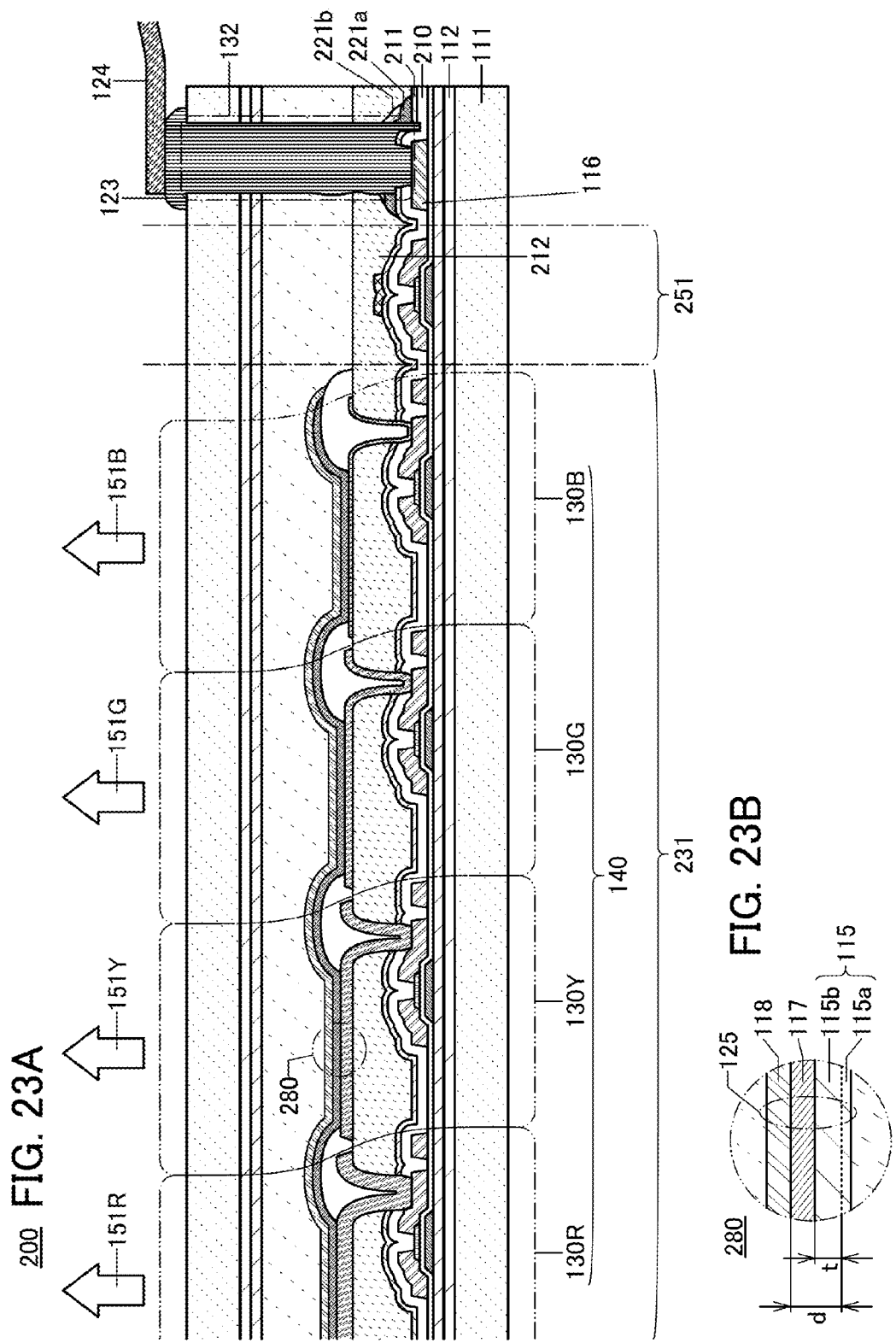

FIG. 26A1
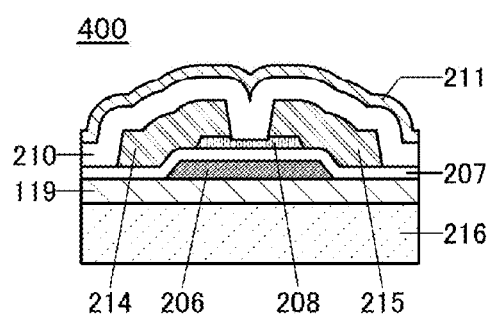
FIG. 26A2
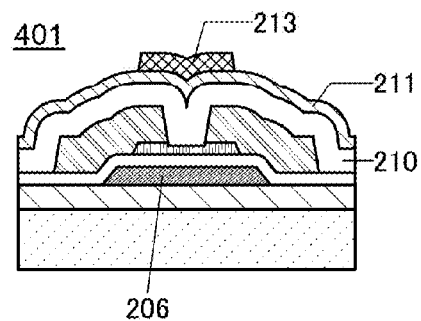
FIG. 26B1
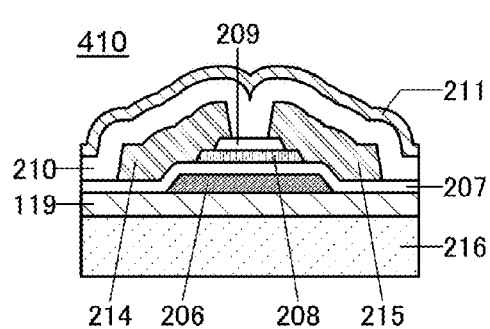
FIG. 26B2
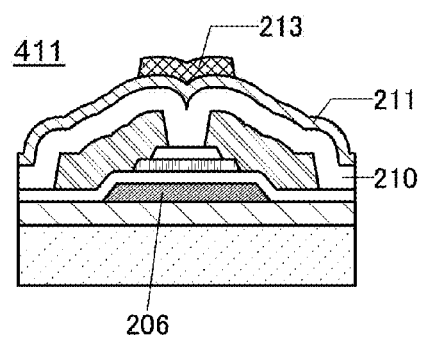
FIG. 26C1
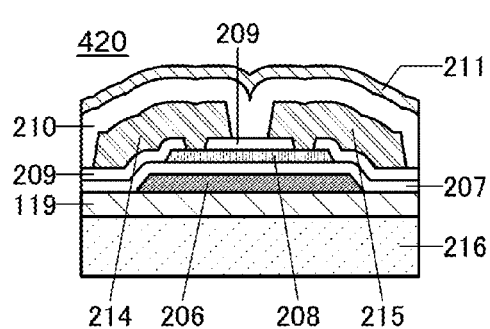
FIG. 26C2
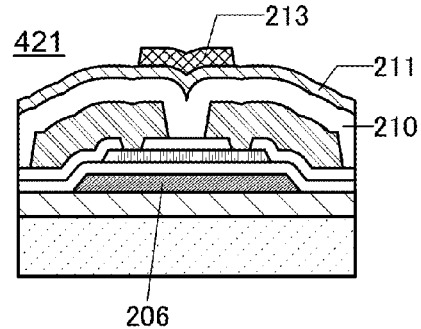

FIG. 27A1
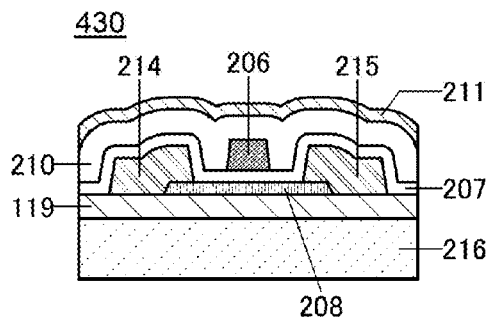
FIG. 27A2
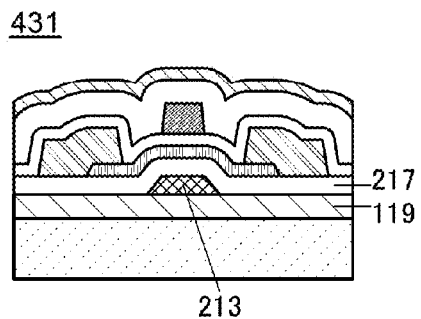
FIG. 27A3
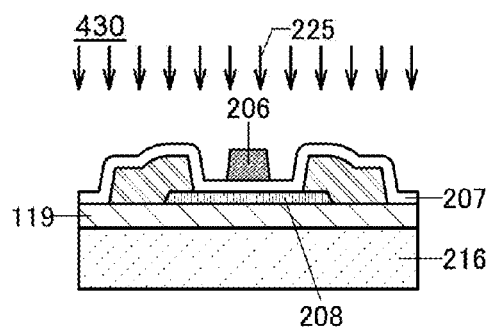
FIG. 27B1
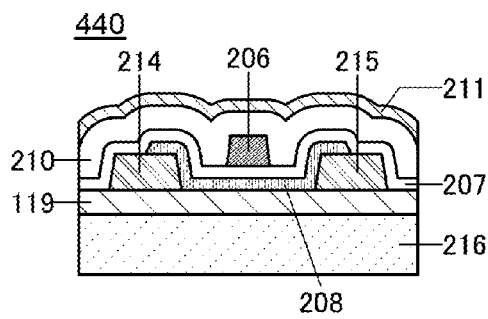
FIG. 27B2
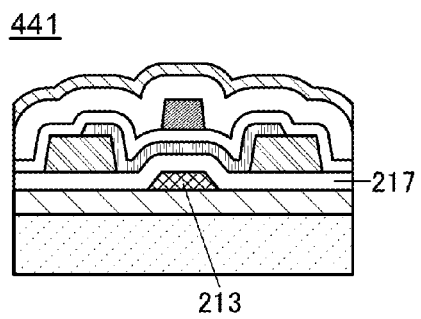

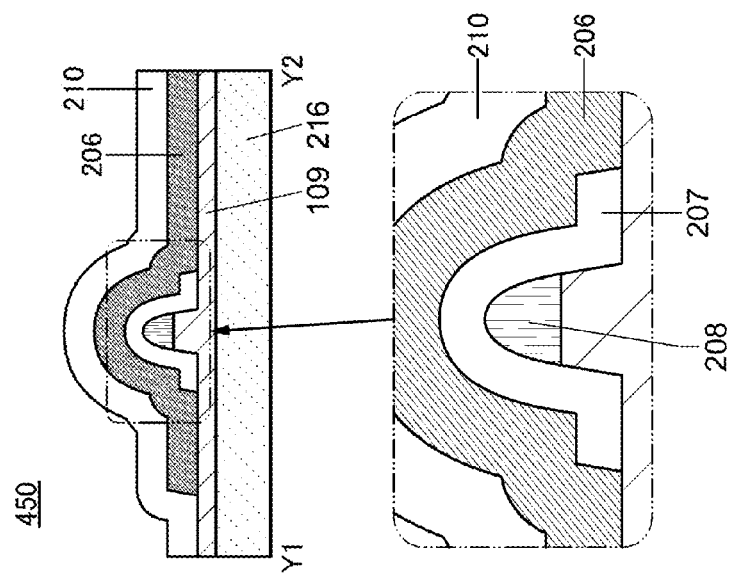
FIG. 28C 450
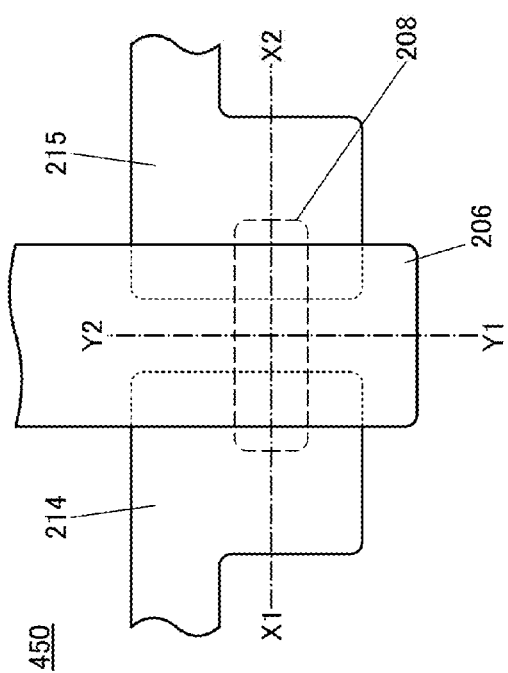
FIG. 28A 450
FIG. 28B 450
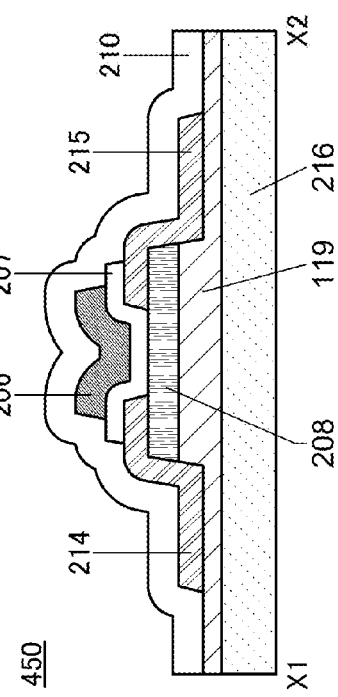

537 538

536

537 538

536

537 538

536

537

536 538

537

536 538

537

536 538

FIG. 46A
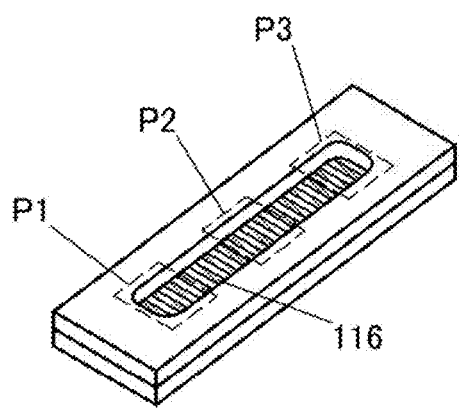
FIG. 46B1
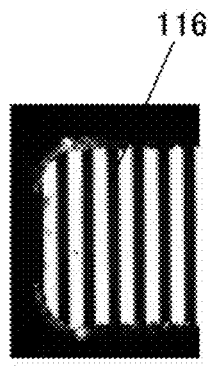
FIG. 46B2
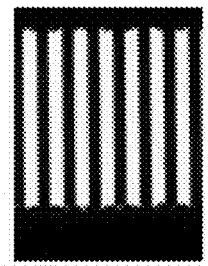
FIG. 46B3
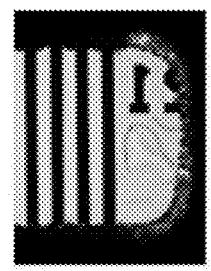
FIG. 46C1
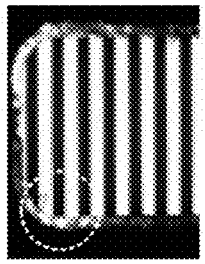
FIG. 46C2
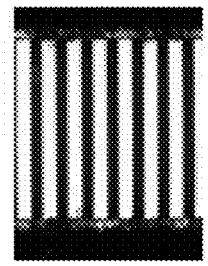
FIG. 46C3
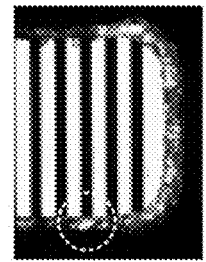

FIG. 47A1 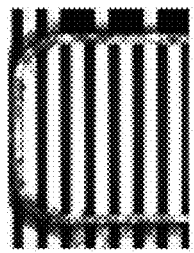
FIG. 47A2 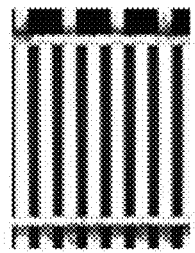
FIG. 47A3 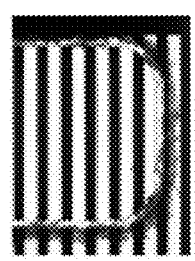
FIG. 47B1 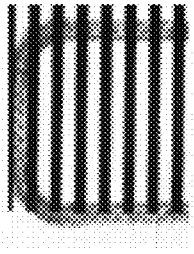
FIG. 47B2 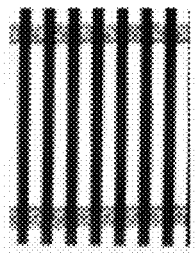
FIG. 47B3 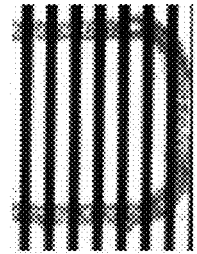

FIG. 48A
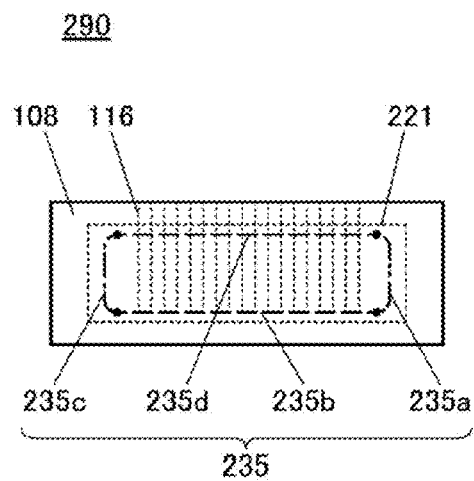
FIG. 48B
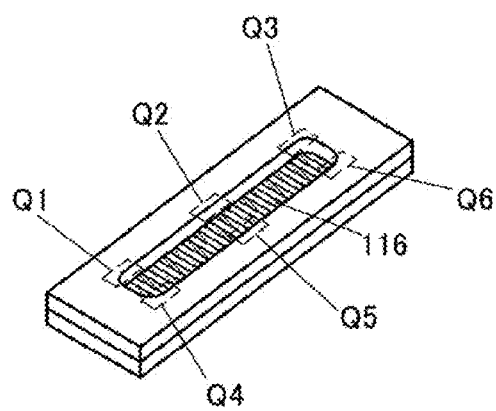
FIG. 48C1
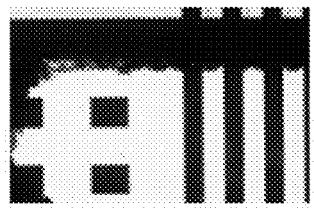
FIG. 48C2
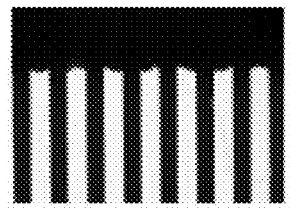
FIG. 48C3
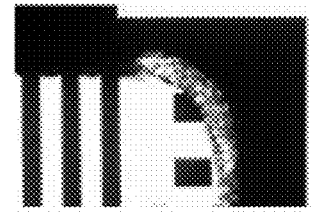
FIG. 48C4
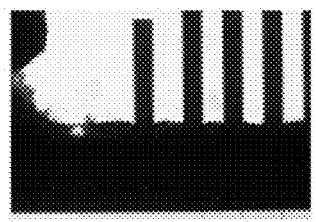
FIG. 48C5
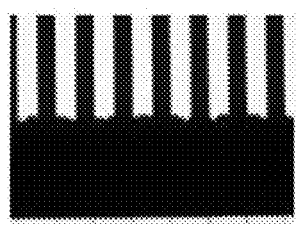
FIG. 48C6
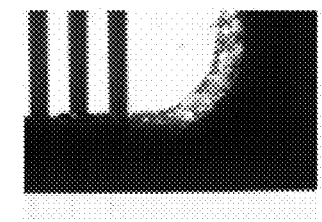

SampleA

SampleB

METHOD FOR MANUFACTURING CIRCUIT BOARD, METHOD FOR MANUFACTURING LIGHT-EMITTING DEVICE, AND LIGHT-EMITTING DEVICE

BACKGROUND OF THE INVENTION

1. Field of the Invention

One embodiment of the present invention relates to a method for manufacturing a circuit board. Another embodiment of the present invention relates to a method for manufacturing a light-emitting device. Another embodiment of the present invention relates to a light-emitting device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an electronic device, a lighting device, an input device, an input/output device, a method for driving any of them, and a method for manufacturing any of them.

A circuit board in this specification means a board that includes a circuit including wirings (e.g., a semiconductor device and a light-emitting device). A semiconductor device generally means a device that can function by utilizing semiconductor characteristics. Accordingly, a transistor, a semiconductor element, a semiconductor circuit, an input/output device, a memory device, an imaging device, an electro-optical device, a power generation device (e.g., a thin film solar cell and an organic thin film solar cell), an electronic device, and the like are included in the category of the semiconductor device. A light-emitting device includes, in its category, a display device using a light-emitting element. Furthermore, the light-emitting device may be included in a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. The light-emitting device may also be included in lighting equipment or the like.

2. Description of the Related Art

In recent years, research and development have been extensively conducted on liquid crystal elements as a display element used in a display region of a display device. In addition, research and development have been extensively conducted on light-emitting elements utilizing electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

The display device including the display elements can have flexibility; therefore, the use of a flexible substrate for the display device has been proposed.

As a method for manufacturing a display device using a flexible substrate, a technique has been developed in which an oxide layer and a metal layer are formed between a substrate and a semiconductor element, the substrate is separated by utilizing weak adhesion of an interface between the oxide layer and the metal layer, and then the semiconductor element is transferred to another substrate (e.g., a flexible substrate) (Patent Document 1).

Display devices are expected to be applied to a variety of uses and become diversified. For example, a smartphone and a tablet terminal with a touch sensor are being developed as mobile devices.

REFERENCE

Patent Document

[Patent Document 1] Japanese Published Patent Application No. 2003-174153

SUMMARY OF THE INVENTION

In order to supply a signal or electric power to a circuit board and a light-emitting device using a flexible substrate, part of the flexible substrate is sometimes removed by a laser beam or an edged tool to expose an electrode so that an external electrode such as a flexible printed circuit (FPC) is connected to the exposed electrode.

In a method in which part of a flexible substrate is removed by laser light, the laser light might transmit a portion to be removed and therefore a wiring and the like below the portion to be removed might be damaged. In a method in which part of a flexible substrate is removed by a device using an edged tool such as a scriber or a cutting plotter, the processing accuracy in the depth direction is low, and thus a wiring or the like in a lower layer might be damaged.

An object of one embodiment of the present invention is to provide a method for manufacturing a circuit board or a light-emitting device in which damage to an electrode is reduced. Another object of one embodiment of the present invention is to provide a method for manufacturing a circuit board or a light-emitting device in which damage to a display region is reduced. Another object of one embodiment of the present invention is to provide a method for manufacturing a highly reliable light-emitting device. Another object of one embodiment of the present invention is to provide a highly reliable light-emitting device.

Another object of one embodiment of the present invention is to provide a novel method for manufacturing a circuit board or a light-emitting device. Another object of one embodiment of the present invention is to provide a method for manufacturing a lightweight light-emitting device. Another object of one embodiment of the present invention is to provide a method for manufacturing a thin light-emitting device. Another object of one embodiment of the present invention is to provide a novel light-emitting device.

Note that the descriptions of these objects do not disturb the existence of other objects. In one embodiment of the present invention, there is no need to achieve all of these objects. Other objects are apparent from and can be derived from the description of the specification, the drawings, the claims, and the like.

One embodiment of the present invention is a method for manufacturing a circuit board, including the following steps: preparing a processing member including a circuit and a terminal electrode over a first substrate, a separation layer over the terminal electrode, a bonding layer over the separation layer, and a second substrate over the bonding layer; forming a groove in the processing member using a blade capable of cutting processing by being rotated; and removing part of the separation layer, part of the bonding layer, and part of the second substrate to expose part of the terminal electrode.

Another embodiment of the present invention is a method for manufacturing a circuit board, including the following steps: preparing a processing member including a circuit and a terminal electrode over a first substrate, a separation layer over the terminal electrode, a bonding layer over the separation layer, and a second substrate over the bonding layer; forming a first groove and a second groove that have different depths in the processing member using a blade capable of cutting processing by being rotated; and removing a portion of the separation layer, a portion of the bonding layer, and a portion of the second substrate that are positioned in a region surrounded by the first groove and the second groove to expose the terminal electrode.

In the method for manufacturing a circuit board, the second substrate is preferably flexible.

In the method for manufacturing a circuit board, at least part of the first groove and at least part of the second groove preferably overlap with the separation layer.

In the method for manufacturing a circuit board, the first groove is preferably formed in the second substrate, and the second groove is preferably formed in the second substrate, the bonding layer, and the separation layer.

In the method for manufacturing a circuit board, the second groove is preferably deeper than the first groove.

In the method for manufacturing a circuit board, the top shape of the region surrounded by the first groove and the second groove preferably has a plurality of corners, and at least one of the plurality of corners preferably has a round shape.

Another embodiment of the present invention is a method for manufacturing a light-emitting device, including the following steps: providing a first peeling layer over a first surface of a first substrate; providing a first insulating layer over the first peeling layer; providing a terminal electrode over the first insulating layer; providing a second insulating layer over the first insulating layer and the terminal electrode; removing part of the second insulating layer to provide an opening; providing a light-emitting element and a separation layer over the second insulating layer; providing a second peeling layer over a second surface of a second substrate; providing a third insulating layer over the second peeling layer; overlapping the first substrate and the second substrate with a bonding layer interposed between the first substrate and the second substrate so that the first surface faces the second surface; separating the first substrate from the first insulating layer together with the first peeling layer; providing a third substrate so that the third substrate overlaps with the first insulating layer; separating the second substrate from the third insulating layer together with the second peeling layer; providing a fourth substrate so that the fourth substrate overlaps with the third insulating layer; forming a first groove in the fourth substrate and a second groove in the fourth substrate, the third insulating layer, the bonding layer, and the separation layer by cutting processing using a blade capable of cutting processing by being rotated; and removing a portion of the separation layer, a portion of the bonding layer, a portion of the third insulating layer, and a portion of the fourth substrate that are positioned in a region surrounded by the first groove and the second groove to expose the terminal electrode. At least part of the first groove and at least part of the second groove overlap with part of the separation layer. The second groove is deeper than the first groove.

In the method for manufacturing a light-emitting device, the fourth substrate is preferably flexible.

In the method for manufacturing a light-emitting device, the top shape of the region surrounded by the first groove and the second groove is preferably a rectangle, and at least one corner of the rectangle preferably has a round shape.

Another embodiment of the present invention is a method for manufacturing an electronic device, including the step of providing a circuit board in a housing. The electronic device includes the circuit board manufactured by the above-described method for manufacturing a circuit board. The electronic device includes at least one of an antenna, a battery, a speaker, a microphone, and an operation button.

Another embodiment of the present invention is a method for manufacturing an electronic device, including the step of providing a light-emitting device in a housing. The electronic device includes the light-emitting device manufactured by the above-described method for manufacturing a light-emitting device. The electronic device includes at least one of an antenna, a battery, a speaker, a microphone, and an operation button.

Another embodiment of the present invention is a light-emitting device including: a terminal electrode over a first substrate; a light-emitting element that is electrically connected to the terminal electrode; a separation layer over the terminal electrode; a bonding layer over the separation layer; and a second substrate over the bonding layer. An opening is provided in the separation layer, the bonding layer, and the second substrate. The opening overlaps with part of the terminal electrode. A top shape of the opening has a plurality of corners. At least one of the plurality of corners has a round shape.

Another embodiment of the present invention can provide a method for manufacturing a circuit board or a light-emitting device in which damage to an electrode is reduced. Another embodiment of the present invention can provide a method for manufacturing a circuit board or a light-emitting device in which damage to a display region is reduced. Another embodiment of the present invention can provide a method for manufacturing a highly reliable light-emitting device. Another embodiment of the present invention can provide a highly reliable light-emitting device.

Another embodiment of the present invention can provide a novel method for manufacturing a circuit board or a light-emitting device. Another embodiment of the present invention can provide a method for manufacturing a light-weight light-emitting device. Another embodiment of the present invention can provide a method for manufacturing a thin light-emitting device. Another embodiment of the present invention can provide a novel light-emitting device.

Note that the description of these effects does not disturb the existence of other effects. One embodiment of the present invention does not necessarily achieve all the effects listed above. Other effects are apparent from and can be derived from the description of the specification, the drawings, the claims, and the like.

BRIEF DESCRIPTION OF THE DRAWINGS

FIGS. 23A and 23B illustrate a structure example of a light-emitting device of an embodiment.

FIGS. 26A1, 26A2, 26B1, 26B2, 26C1, and 26C2 are cross-sectional views each illustrating an embodiment of a transistor.

FIGS. 27A1, 27A2, 27A3, 27B1, and 27B2 are cross-sectional views illustrating one embodiment of a transistor.

FIGS. 28A to 28C are a plan view and cross-sectional views illustrating one embodiment of a transistor.

FIGS. 46A, 46B1, 46B2, 46B3, 46C1, 46C2, and 46C3 are a schematic perspective view and optical microscope photographs of processing members of an example.

FIGS. 47A1, 47A2, 47A3, 47B1, 47B2, and 47B3 are optical microscope photographs of processing members of an example.

FIGS. 48A, 48B, 48C1, 48C2, 48C3, 48C4, 48C5, and 48C6 are a schematic top view, a schematic perspective view, and optical microscope photographs of a processing member of an example.

DETAILED DESCRIPTION OF THE INVENTION

Figure 1A:
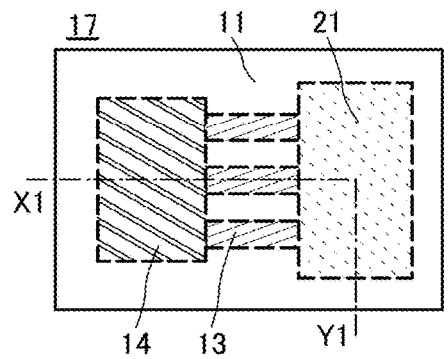
FIGS. 1A to 1F illustrate a structure example and a manufacturing method of a circuit board of an embodiment.

Embodiments are described in detail with reference to the accompanying drawings. Note that the present invention is not limited to the description below, and it is understood easily by those skilled in the art that various changes and modifications can be made without departing from the spirit and scope of the present invention. Therefore, the present invention should not be construed as being limited to the description in the following embodiments. In the structures of the present invention to be described below, the same portions or portions having similar functions are denoted by the same reference numerals in different drawings, and explanation thereof is not repeated in some cases.

Note that in each drawing described in this specification, the size, the layer thickness, or the region of each component may be exaggerated or each component may be omitted in some cases for clarity of the invention. Therefore, embodiments of the present invention are not limited to such a scale. Especially in a top view, some components might not be illustrated to facilitate understanding.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated to facilitate understanding.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Embodiment 1

This embodiment describes structure examples of a processing member of one embodiment of the present invention and examples of a method for manufacturing a circuit board of one embodiment of the present invention with reference to FIGS. 1A to 1F, FIGS. 2A to 2F, FIGS. 3A to 3F, FIGS. 4A to 4F, FIGS. 5A to 5E, FIGS. 6A to 6F, and FIGS. 7A to 7D.

[Structure Examples of Processing Member and Examples of Method for Manufacturing Circuit Board]

Figure 1B:
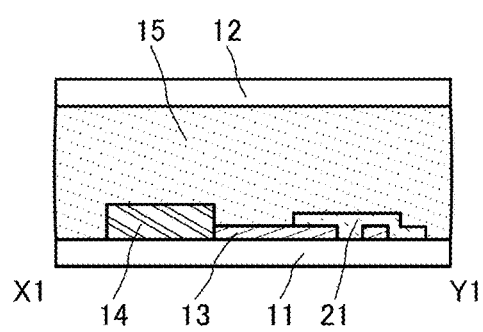

FIGS. 1A and 1B schematically illustrate a processing member of one embodiment of the present invention. FIG. 1A is a top view of a processing member 17. FIG. 1B is a cross-sectional view taken along section line X1-Y1 in FIG. 1A. FIGS. 1C to 1F illustrate an example of a method for manufacturing a circuit board of one embodiment of the present invention.

The processing member 17 includes a first substrate 11, a terminal electrode 13, a circuit 14, a bonding layer 15, a separation layer 21, and a second substrate 12. The terminal electrode 13 and the circuit 14 are provided over a first surface of the first substrate 11. The separation layer 21 is provided over the first substrate 11 and the terminal electrode 13. The separation layer 21 is in contact with the terminal electrode 13. The first surface of the first substrate 11 and a second surface of the second substrate 12 are attached to each other with the bonding layer 15 provided therebetween.

Note that in the top view of FIG. 1A, the second substrate 12 and the bonding layer 15 are not illustrated, and in a region where the outermost surface is the second substrate 12 or the bonding layer 15, components positioned under the second substrate 12 or the bonding layer 15 are surrounded by dashed lines. The same applies to all the other top views in this embodiment.

The circuit 14 can include a variety of elements that can function by utilizing semiconductor characteristics, such as a transistor. Furthermore, the circuit 14 can include a light-emitting element such as an organic EL element.

The terminal electrode 13 is electrically connected to the circuit 14. Exposing part of the terminal electrode 13 can connect elements such as a semiconductor element or a light-emitting element included in the circuit 14 to an external electrode.

A material that has low adhesion to the terminal electrode 13 is used for the separation layer 21. Since the processing member 17 of one embodiment of the present invention includes the separation layer 21 over the terminal electrode 13, a region of the second substrate 12 and a region of the bonding layer 15 that overlap with the separation layer 21 can be easily removed. The separation layer 21 may have a single-layer structure or a layered structure of a plurality of layers. When the separation layer 21 has a layered structure of a plurality of layers, a layer included in the separation layer 21 preferably has low adhesion to another layer that is included in the separation layer 21 and in contact with the layer.

In some cases, the separation layer 21 partly remains over the first substrate 11 and/or the terminal electrode 13 after part of the second substrate 12, part of the bonding layer 15, and part of the separation layer 21 are removed from the processing member 17. Thus, the material of the separation layer 21 is preferably selected so that the remaining separation layer 21 can be removed using an organic solvent or the like with no damage to the first substrate 11 and the terminal electrode 13. Note that when a material having anisotropic conductivity is used for the separation layer 21, the step of removing the separation layer 21 remaining over the first substrate 11 and/or the terminal electrode can be skipped. Moreover, when a material having low conductivity is used for the separation layer 21, the step of removing the separation layer 21 remaining over the first substrate 11 can be skipped.

For materials that can be used for the separation layer 21, the description of a separation layer 221 in Embodiment 2 can be referred to.

Through the step of removing part of the second substrate 12, part of the bonding layer 15, and part of the separation layer 21 in the processing member 17 to expose the terminal electrode 13, the circuit board of one embodiment of the present invention can be completed.

In the method for manufacturing a circuit board of one embodiment of the present invention, a groove is formed in the processing member 17 using a blade capable of cutting processing by being rotated, so that the terminal electrode 13 can be exposed without being damaged. For the cutting processing, a cutting device such as an engraving machine that includes a steel blade capable of cutting processing by being rotated and can control the edge of the blade in the depth direction accurately is used. As the steel blade capable of cutting processing by being rotated, an end mill, a drill, a cutter for rotary cutting, or the like can be used.

Note that there is no particular limitation on the first substrate 11 and the second substrate 12. Examples of the substrates include a semiconductor substrate (e.g., a single crystal substrate or a silicon substrate), a silicon on insulator (SOI) substrate, a glass substrate, a quartz substrate, a plastic substrate, a metal substrate, an attachment film, paper including a fibrous material, a base material film, and the like. Description of a substrate 111 and a substrate 121 in Embodiment 2 can be referred to for the material that can be used for the first substrate 11 and the second substrate 12.

Note that at least the second substrate 12 of the two substrates (the first substrate 11 and the second substrate 12) is preferably flexible. When a substrate is thin enough to have flexibility, the substrate is easily removed by the cutting processing.

The terminal electrode 13 can be formed using a conductive material. Description of a terminal electrode 116 in Embodiment 2 can be referred to for the material that can be used for the terminal electrode 13.

A method for manufacturing a circuit board of one embodiment of the present invention by processing the processing member 17 in FIGS. 1A and 1B described in the above structure example is described below with reference to FIGS. 1C to 1F.

Figure 1C:
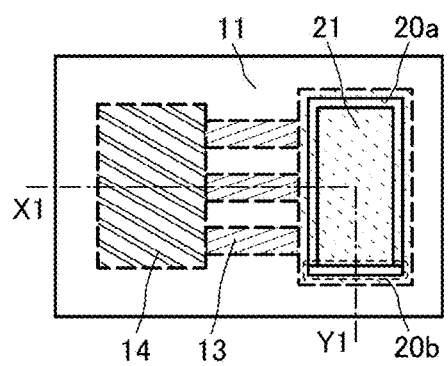
Figure 1D:
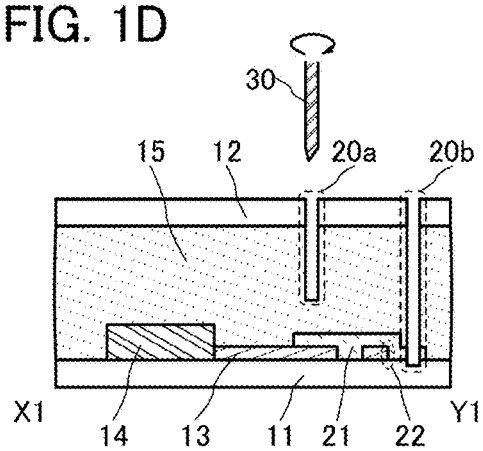

First, a first groove 20a and a second groove 20b are formed in the processing member 17 using a blade 30 (see FIGS. 1C and 1D).

The first groove 20a and the second groove 20b can be successively formed by cutting the processing member 17 using the blade 30. In other words, the first groove 20a and the second groove 20b are connected. As illustrated in FIG. 1C, at least part of the first groove 20a and at least part of the second groove 20b overlap with the separation layer 21. That is, the region surrounded by the first groove 20a and the second groove 20b overlaps with part of the separation layer 21.

The top shape of the region surrounded by the first groove 20a and the second groove 20b is a rectangle in FIG. 1C, but is not limited thereto. The outline of the top shape may be any closed curve. In particular, when the top shape has a plurality of corners, at least one of the plurality of corners preferably has a round shape. Note that although the rectangle here has round corners corresponding to the outer diameter of the blade 30, the outer diameter of the blade 30 is sufficiently smaller than one side of the rectangle. Thus, in FIG. 1C, the roundness of the corners of the rectangle are not illustrated.

The first groove 20a is formed in the second substrate 12 and the bonding layer 15. The second groove 20b is formed in the second substrate 12, the bonding layer 15, the separation layer 21, and the first substrate 11 (see FIG. 1D). That is, the depth of the second groove 20b (the distance between the top surface of the second substrate 12 and the bottom of the second groove 20b) is preferably greater than the depth of the first groove 20a (the distance between the top surface of the second substrate 12 and the bottom of the first groove 20a). Performing such processing on the processing member 17 facilitates exposure of part of the terminal electrode 13. In this example of a manufacturing method, as illustrated in FIG. 1C, a region corresponding to one short side of the rectangle graved using the blade 30 is the second groove 20b and the other region graved using the blade 30 is the first groove 20a.

The removal of the second substrate 12, the bonding layer 15, and the separation layer 21 that are over the terminal electrode 13 starts from the second groove 20b. By forming the second groove 20b, the distance between a side surface of the second groove 20b and an end portion of a region where the separation layer 21 is in contact with the terminal electrode 13 (a portion shown as a region 22 in FIG. 1D) when seen from the above can be short. Thanks to this short distance, damage to a peripheral layer such as the first substrate 11 or the bonding layer 15 by the removal can be reduced. Thus, the second groove 20b is preferably formed at least in the second substrate 12, the bonding layer 15, and the separation layer 21. The bottom of the second groove 20b may reach a position deeper than the region 22, for example, the first substrate 11.

When the peeling starts from the region 22, the removal of the second substrate 12, the bonding layer 15, and the separation layer 21 proceeds inside the region surrounded by the first groove 20a and the second groove 20b with the first groove 20a as a guide. The depth of the first groove 20a can be smaller than the depth of the second groove 20b because the adhesion of the interface between the terminal electrode 13 and the separation layer 21 is low. The depth of the first groove 20a is one third or more, preferably one half or more of the thickness of a stack to be removed (the second substrate 12, the bonding layer 15 and the separation layer 21). The first groove 20a is formed at least in the second substrate 12. By setting the depth of the first groove 20a small, damage to the terminal electrode 13 in forming the first groove 20a can be reduced.

As the blade 30, a tool that can move in the horizontal direction and the depth direction during cutting, such as the above-described end mill or the above-described cutter for rotary cutting, can be used. The material of the blade 30 can be high-speed steel, carbon steel, cemented carbide, or the like.

The rotation number and the scanning speed of the cutting processing using the blade 30 are preferably adjusted as appropriate depending on the materials of the second substrate 12 and the bonding layer 15. The shorter the time needed for the cutting processing is, the shorter the process time becomes; however, when the scanning speed is too high, burrs are generated in an end face of the processed portion in some cases. The outer diameter of the blade 30 is preferably adjusted as appropriate depending on the size of the region of the processing member 17 where the cutting processing is performed.

Figure 1E:
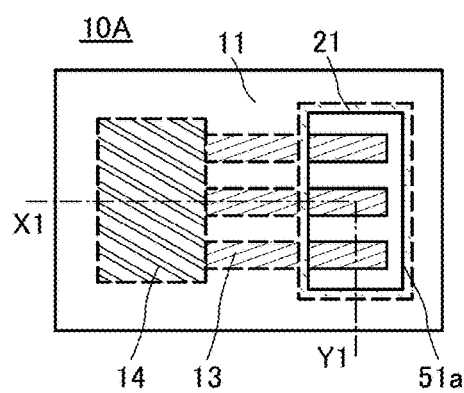
Figure 1F:
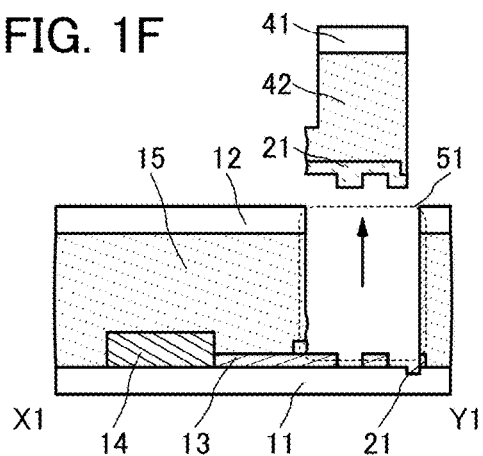

Next, by utilizing low adhesion of the interface between the terminal electrode 13 and the separation layer 21, a portion of the second substrate 12 that overlaps with the region surrounded by the first groove 20a and the second groove 20b (hereinafter, referred to as a first region 41), a portion of the bonding layer 15 that overlaps with the region surrounded by the first groove 20a and the second groove 20b (hereinafter, referred to as a second region 42), and part of the separation layer 21 are removed from the processing member 17 (see FIGS. 1E and 1F). At this step, part of the terminal electrode 13 is exposed and an opening 51 is formed. Furthermore, at this step, part of the separation layer 21 is removed, and the other part of the separation layer 21 remains in some cases. Note that an outline 51a of the opening 51 formed in the second substrate 12 at this step is a rectangle when seen from the top (see FIG. 1E).

The first region 41, the second region 42, and the separation layer 21 may be removed by applying mechanical force. For example, the first region 41, the second region 42, and the separation layer 21 can be removed by bonding an adhesive tape or the like to the first region 41 and then taking off the adhesive tape or the like. Alternatively, the first region 41, the second region 42, and the separation layer 21 may be pulled while being wound by rolling a structure body, such as a cylinder, having a rotation axis and a suction mechanism on its surface on a surface of the first region 41.

Alternatively, the first region 41, the second region 42, and the separation layer 21 may be removed by lifting up the first region 41, the second region 42, and the separation layer 21 from the second groove 20b side with tweezers or an arm. Alternatively, the first region 41, the second region 42, and the separation layer 21 may be removed by jetting a gas under high pressure toward the second groove 20b to float the first region 41, the second region 42, and the separation layer 21.

Alternatively, the first region 41, the second region 42, and the separation layer 21 may be removed by hooking a needle-shaped or hook-shaped member to an opening provided in a region of the first region 41 and/or the second region 42 that is close to the second groove 20b, and lifting up the first region 41, the second region 42, and the separation layer 21. The opening can be formed at the same time as the first groove 20a and the second groove 20b using the blade 30. The number of such openings may be one or two or more.

The top shape of the region surrounded by the first groove 20a and the second groove 20b is preferably changed according to the method for removing the first region 41, the second region 42, and the separation layer 21. This change can be easily carried out because the first groove 20a and the second groove 20b are formed using the blade 30.

Figure 4A:
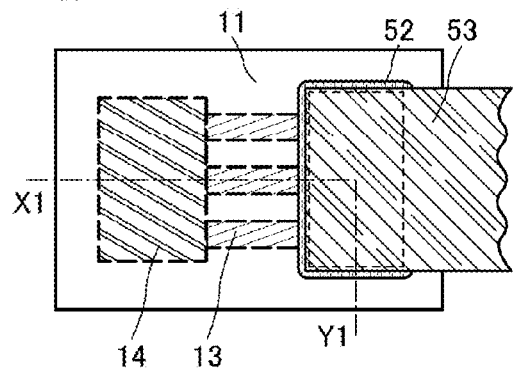
FIGS. 4A to 4F illustrate structure examples of a semiconductor device or a light-emitting device of an embodiment.
Figure 4B:
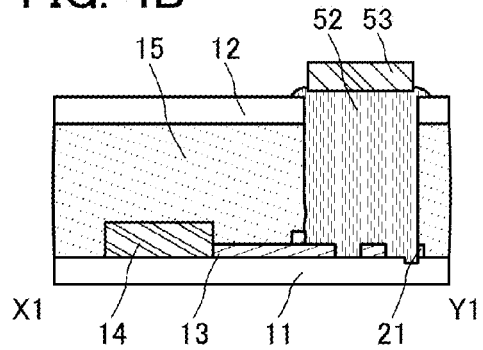

Through the above steps, a circuit board 10A in which the terminal electrode 13 is exposed in the opening 51 is completed. Note that a semiconductor device or a light-emitting device in which an external electrode 53 is connected to the circuit board 10A via a connector 52 is another embodiment of the present invention. The top view and the cross-sectional view of the semiconductor device or the light-emitting device are shown in FIGS. 4A and 4B.

The connector 52 preferably has anisotropic conductivity. As the connector 52, an anisotropic conductive film (ACF) or an anisotropic conductive paste (ACP) can be used. For example, an FPC can be used as the external electrode 53.

Modification Example 1

An example of a method for manufacturing a circuit board that is different from that of the above-described circuit board 10A is described below. The above description can be referred to for the features common to the above-described example of a manufacturing method, so that the description of these features is omitted here. Only differences are described below.

Figure 2A:
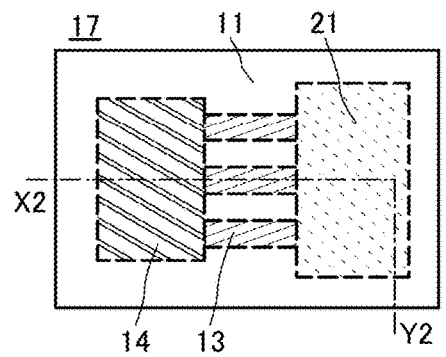
FIGS. 2A to 2F illustrate a structure example and a manufacturing method of a circuit board of an embodiment.
Figure 2B:
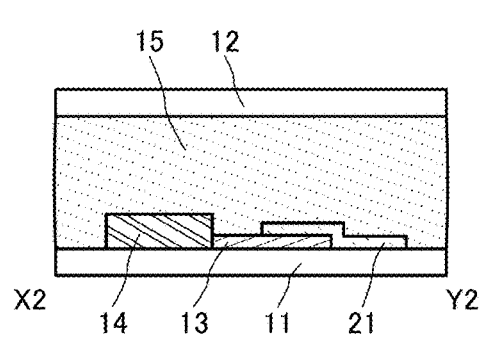

FIGS. 2A and 2B schematically illustrate a processing member of one embodiment of the present invention. FIG. 2A is a top view of a processing member 17. FIG. 2B is a cross-sectional view taken along section line X2-Y2 in FIG. 2A. The processing member 17 in FIGS. 2A and 2B has the same structure as that in FIGS. 1A and 1B except the position of the section line. An example of a method for manufacturing a circuit board of one embodiment of the present invention is described with reference to FIGS. 2C to 2F.

Figure 2C:
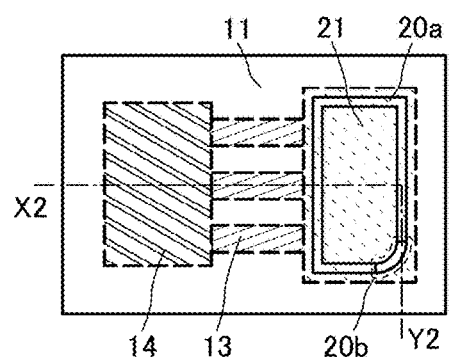
Figure 2D:
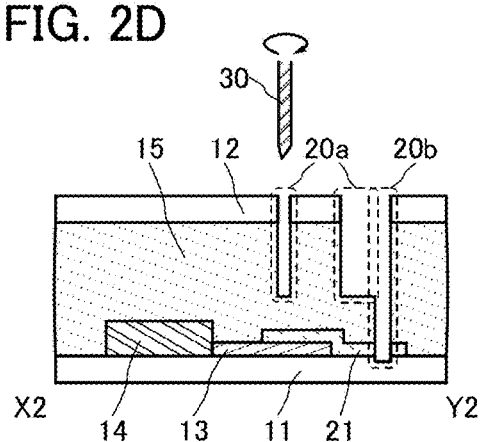

First, the first groove 20a and the second groove 20b are formed in the processing member 17 using a blade 30 (see FIGS. 2C and 2D).

The first groove 20a and the second groove 20b can be successively formed by cutting the processing member 17 using the blade 30. In other words, the first groove 20a and the second groove 20b are connected (see FIG. 2D). As illustrated in FIG. 2C, the region surrounded by the first groove 20a and the second groove 20b overlaps with part of the separation layer 21. The second groove 20b is preferably formed so as not to overlap with the terminal electrode 13.

In FIG. 2C, the outline of the region surrounded by the first groove 20a and the second groove 20b is a closed curve partly having a curve when seen from the top. Specifically, in the top shape, one corner of the rectangle has a round shape whose curvature radius is sufficiently greater than the outer diameter of the blade 30. In the region graved using the blade 30, a curved portion of the closed curve (a portion of the round corner) is the second groove 20b, and the other portion is the first groove 20a. With such a structure, in a step of lifting up the first region 41, the second region 42, and the separation layer 21 from the second groove 20b side, remaining portions, which have not been removed, of the separation layer 21 in the closed curve and the second region 42 can be reduced.

Figure 2E:
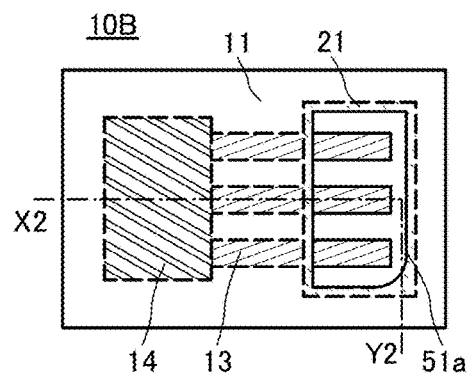
Figure 2F:
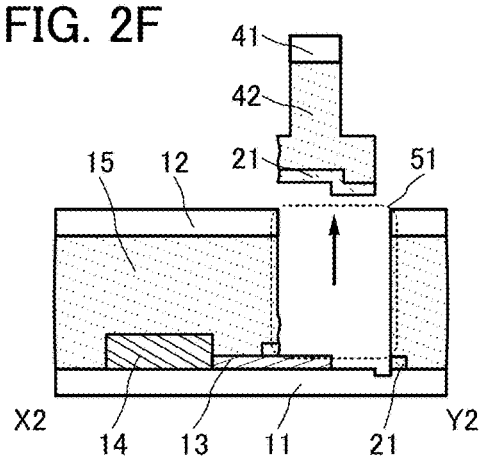

Next, the first region 41, the second region 42, and part of the separation layer 21 are removed from the processing member 17 (see FIGS. 2E and 2F). At this step, part of the terminal electrode 13 is exposed and an opening 51 is formed. Furthermore, at this step, part of the separation layer 21 is removed, and the other part of the separation layer 21 remains in the processing member 17. Note that the outline 51a of the opening 51 formed in the second substrate 12 at this step is a rectangle having one round corner when seen from the top (see FIG. 2E).

Figure 4C:
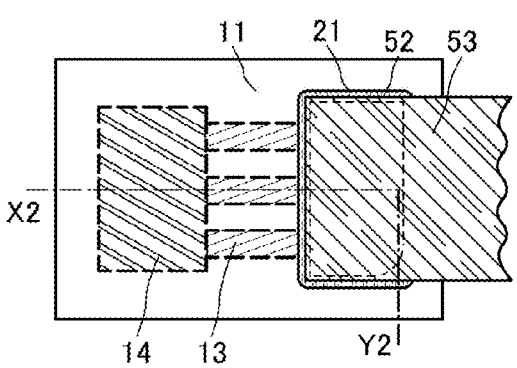
Figure 4D:
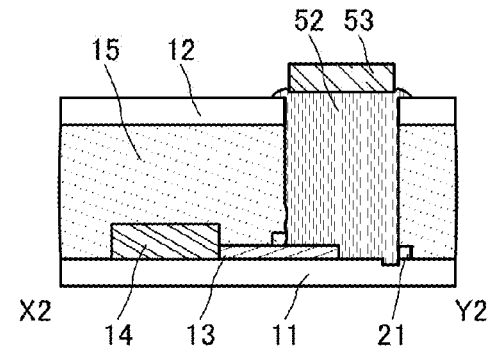

Through the above steps, a circuit board 10B in which the terminal electrode 13 is exposed in the opening 51 is completed. Note that a semiconductor device or a light-emitting device in which a connector 52 and an external electrode 53 are formed with the terminal electrode 13 is another embodiment of the present invention. FIGS. 4C and 4D are a top view and a cross-sectional view of a semiconductor device or a light-emitting device in which the external electrode 53 is connected to the circuit board 10B via the connector 52.

When the circuit 14 contains an element whose electrical characteristics or the like deteriorate when exposed to the air and the first substrate 11, the second substrate 12, and the bonding layer 15 have a function of shutting out the air from the circuit 14, the second groove 20b is preferably formed to be distanced from the circuit 14 in the cutting processing using the blade 30 as illustrated in FIG. 2C. Note that the bottom of the second groove 20b may be higher than that of the separation layer 21.

Modification Example 2

An example of a method for manufacturing another circuit board that is formed using a processing member having a different structure from that of the processing member 17 is described below. The above description can be referred to for the features common to the above-described example of a method for manufacturing a circuit board, so that the description of these features is omitted here. Only differences are described below.

Figure 3A:
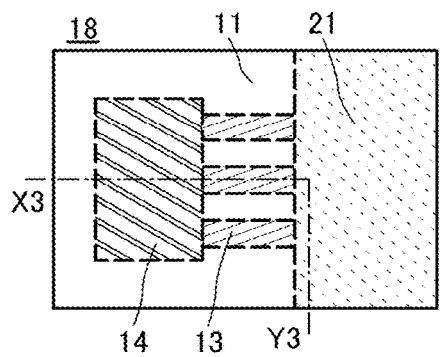
FIGS. 3A to 3F illustrate a structure example and a manufacturing method of a circuit board of an embodiment.
Figure 3B:
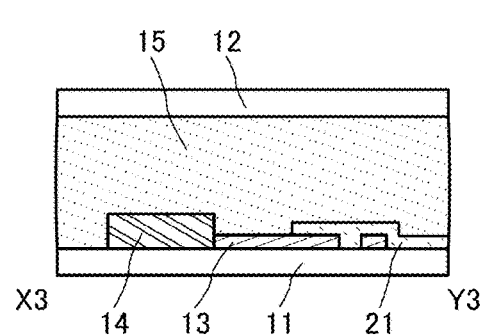

FIGS. 3A and 3B schematically illustrate a processing member of one embodiment of the present invention. FIG. 3A is a top view of a processing member 18. FIG. 3B is a cross-sectional view taken along section line X3-Y3 in FIG. 3A. FIGS. 3C to 3F illustrate an example of a method for manufacturing a circuit board of one embodiment of the present invention.

The processing member 18 differs from the processing member 17 in a region where the separation layer 21 is formed. In the processing member 17, the separation layer 21 having a rectangle shape is provided over the first substrate 11 and the terminal electrode 13 to overlap with part of the terminal electrode 13. In contrast, in the processing member 18, the separation layer 21 is provided so that the rectangle is expanded, and three side surfaces of the separation layer 21 are approximately aligned with the respective side surfaces of the first substrate 11 (see FIG. 3A).

Figure 3C:
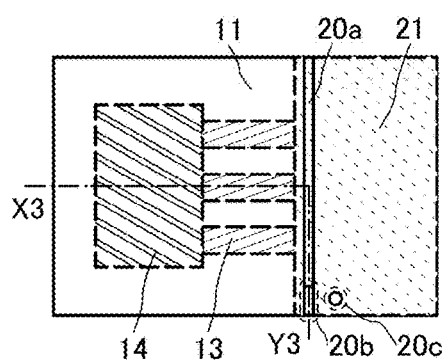
Figure 3D:
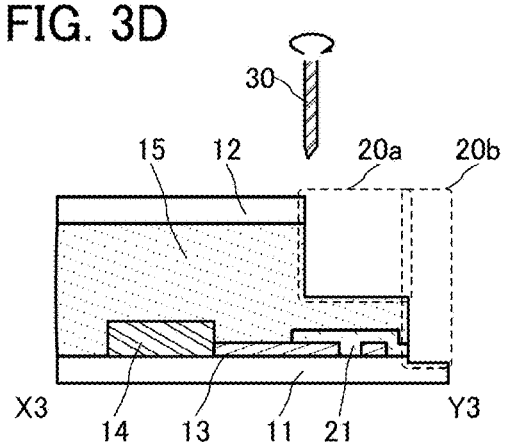

First, the first groove 20a, the second groove 20b, and a third groove 20c are formed in the processing member 18 using the blade 30 (see FIGS. 3C and 3D).

The first groove 20a and the second groove 20b can be successively formed by cutting the processing member 17 using the blade 30. In other words, the first groove 20a and the second groove 20b are connected (see FIG. 3D). As illustrated in FIG. 3C, the first groove 20a and the second groove 20b are provided across the processing member 18 linearly. Note that the locus of the blade 30 forming the second groove 20b and/or the first groove 20a is not limited to a straight line but may be a curve.

The third groove 20c is formed near the second groove 20b; thus, the following step of removing the first region 41, the second region 42, and part of the separation layer 21 from the processing member 18 can be easily performed. The depth of the third groove 20c is not particularly limited, and the third groove 20c may be formed in the second substrate 12 or in the second substrate 12 and the bonding layer 15. The top shape of the third groove 20c is not particularly limited either. The top shape of the third groove 20c is a circle in FIG. 3C but may be a polygon.

Figure 3E:
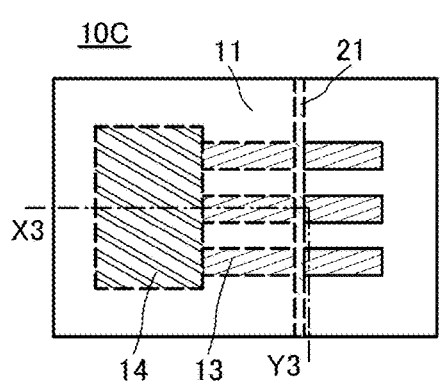
Figure 3F:
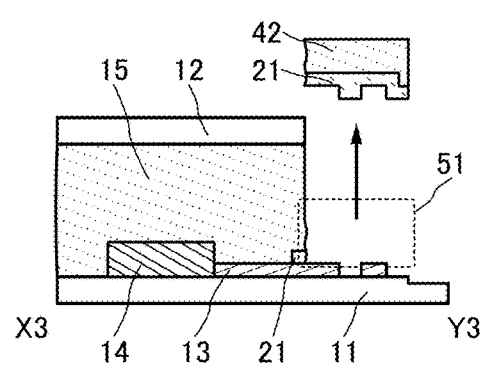

Next, by hooking a needle-shaped or hook-shaped member to the third groove 20c, the first region 41, the second region 42, and part of the separation layer 21 are removed (see FIGS. 3E and 3F). At this step, part of the terminal electrode 13 is exposed and an opening 51 is formed. Furthermore, at this step, part of the separation layer 21 is removed, and the other part of the separation layer 21 remains in the processing member 17 in some cases.

Figure 4E:
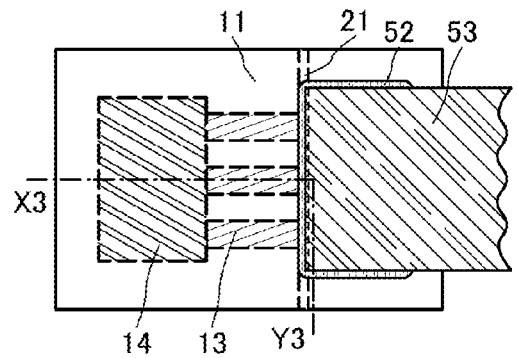
Figure 4F:
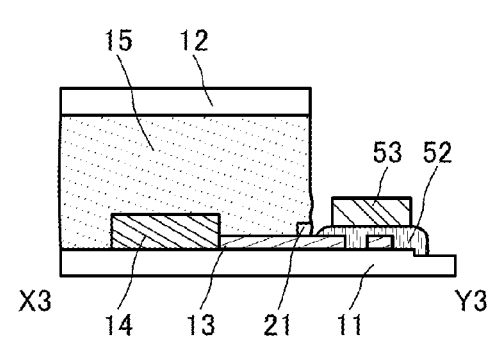

Through the above steps, a circuit board 10C in which the terminal electrode 13 is exposed in the opening 51 is completed. Note that a semiconductor device or a light-emitting device in which a connector 52 and an external electrode 53 are formed with the terminal electrode 13 is another embodiment of the present invention. FIGS. 4E and 4F are a top view and a cross-sectional view of a semiconductor device or a light-emitting device in which the external electrode 53 is connected to the circuit board 10C via the connector 52.

[Modification Examples of Top Shapes of Grooves]

Modification examples of top shapes of the region surrounded by the first groove 20a and the second groove 20b (hereinafter, referred to as the top shapes of the grooves) are described below with reference to FIGS. 5A to 5E. FIGS. 5A to 5E each illustrate a top view of the first groove 20a and the second groove 20b and their vicinity in a processing member of one embodiment of the present invention. The depths of the first groove 20a and the second groove 20b in FIGS. 5A to 5E are equal to those in FIG. 1D. In FIGS. 5A to 5E, the separation layer 21 is formed so that the region surrounded by the first groove 20a and the second groove 20b is placed inside the separation layer 21 when seen from the above.

Figure 5A:
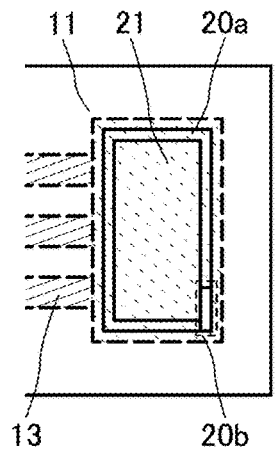
FIGS. 5A to 5E illustrate structure examples of a circuit board of an embodiment.
Figure 5B:
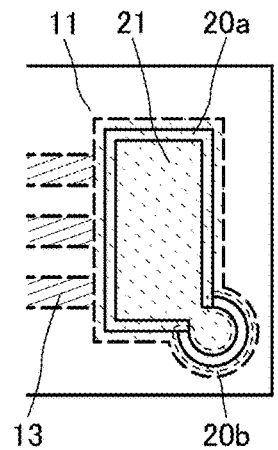

The top shape of the grooves included in the processing member illustrated in FIG. 5A is a rectangle. A region corresponding to part of a side of the rectangle is the second groove 20b, and the other region is the first groove 20a. The top shape of the grooves included in the processing member illustrated in FIG. 5B is a shape formed by connecting a closed curve having a curve to one corner of the rectangle. In the shape, a region corresponding to the closed curve is the second groove 20b, and the other region is the first groove 20a. With these structures, the step of lifting up the first region 41, the second region 42, and the separation layer 21 from the second groove 20b side with tweezers or an arm can be performed easily.

Figure 5C:
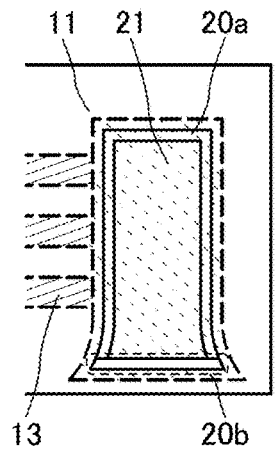
Figure 5D:
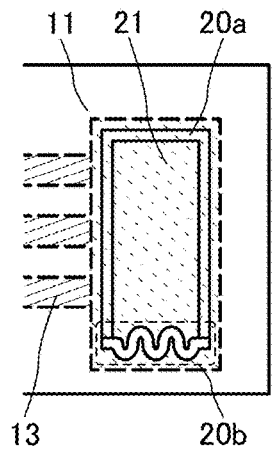

The top shape of the grooves included in the processing member illustrated in FIG. 5C is a rectangle widening toward one side. Part of the wide region is the second groove 20b, and the other region is the first groove 20a. The top shape of the grooves included in the processing member illustrated in FIG. 5D is a rectangle having one wavy side. The wavy region is the second groove 20b, and the other region is the first groove 20a. With these structures, the step of jetting a gas under high pressure toward the second groove 20b to float the first region 41, the second region 42, and the separation layer 21 can be performed easily.

Figure 5E:
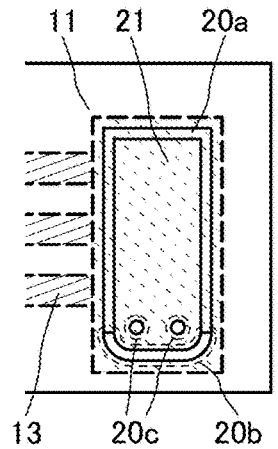

The top shape of the grooves included in the processing member illustrated in FIG. 5E is a rectangle having two round corners. A region including the two round corners and a side connected to the corners is the second groove 20b, and the other region is the first groove 20a. The third grooves 20c are provided one by one near the two corners inside the grooves when seen from the top. The depth of the third groove 20c is similar to the depth of the second groove 20b described in Modification example 2. With such a structure, the first region 41, the second region 42, and part of the separation layer 21 can be removed easily by hooking a needle-shaped or hook-shaped member to the third groove 20c.

Modification Example 3

An example of a method for manufacturing a circuit board that is different from the above-described circuit board is described below. The above description can be referred to for the features common to the above-described example of a method for manufacturing a circuit board, so that the description of these features is omitted here. Only differences are described below.

Figure 6A:
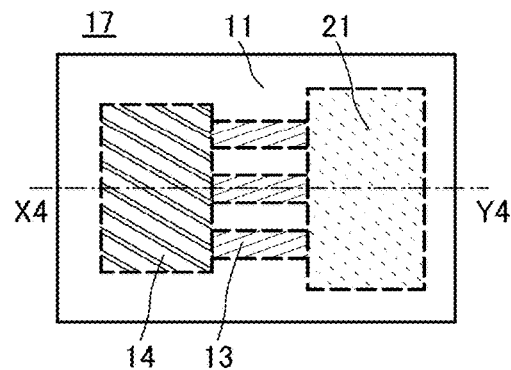
FIGS. 6A to 6F illustrate a structure example and a manufacturing method of a circuit board of an embodiment.
Figure 6B:
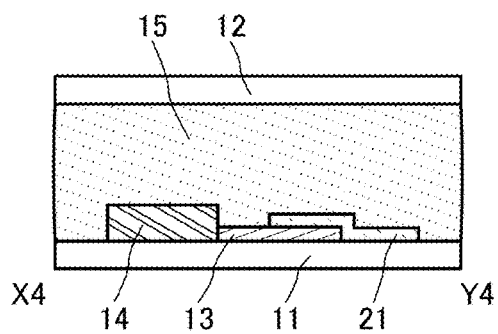

FIGS. 6A and 6B schematically illustrate a processing member of one embodiment of the present invention. FIG. 6A is a top view of a processing member 17. FIG. 6B is a cross-sectional view taken along section line X4-Y4 in FIG. 6A. The processing member 17 in FIGS. 6A and 6B has the same structure as that in FIGS. 1A and 1B except the position of the section line. An example of a method for manufacturing a circuit board of one embodiment of the present invention is described with reference to FIGS. 6C to 6F and FIGS. 7A and 7B.

Figure 6C:
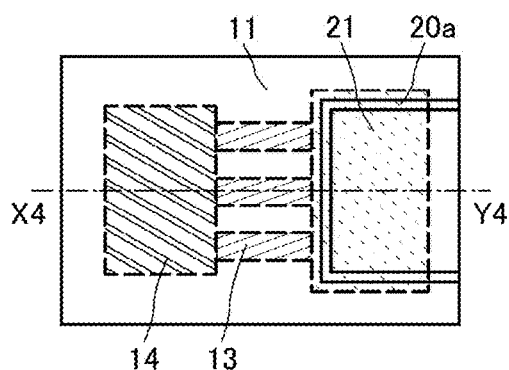
Figure 6D:
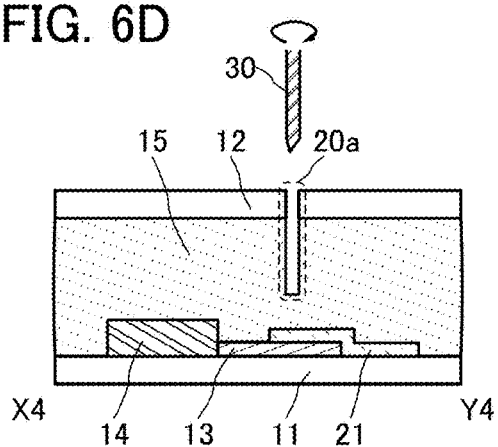

First, the first groove 20a is formed in the processing member 17 using a blade 30 (see FIGS. 6C and 6D). As illustrated in FIG. 6C, the first groove 20a is provided with a U shape so that part of the separation layer 21 is positioned inside the first groove 20a. Furthermore, as illustrated in FIG. 6C, the first groove 20a is provided to reach an edge of the second substrate 12.

Figure 6E:
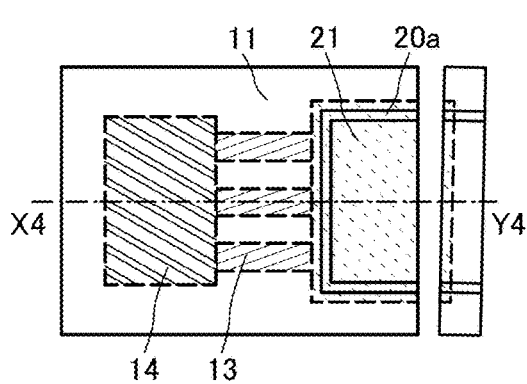
Figure 6F:
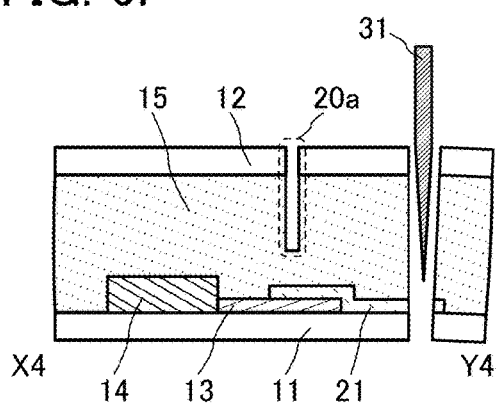

Next, the processing member 17 is divided using a blade 31, and part of the processing member 17 is removed (see FIGS. 6E and 6F). The blade 31 can divide the processing member 17 linearly. The division is performed to expose a side surface of the separation layer 21. By the division, a third region 43 and a fourth region 44 are formed at a position overlapping with the separation layer 21. The third region 43 is a portion of the second substrate 12 overlapping with a region surrounded by the first groove 20a and an edge of the second substrate 12 after divided. The fourth region 44 is a portion of the bonding layer 15 overlapping with the region surrounded by the first groove 20a and the edge of the second substrate 12 after divided.

Figure 7A:
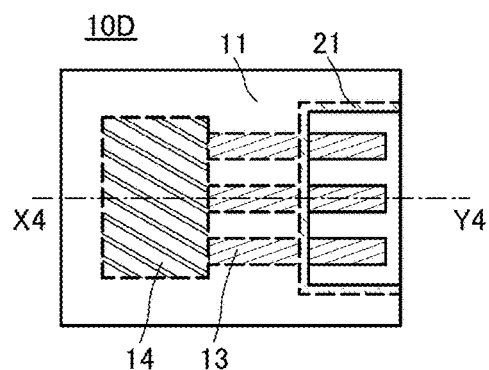
FIGS. 7A to 7D illustrate a manufacturing method of a circuit board of an embodiment and a structure example of a semiconductor device and a light-emitting device.
Figure 7B:
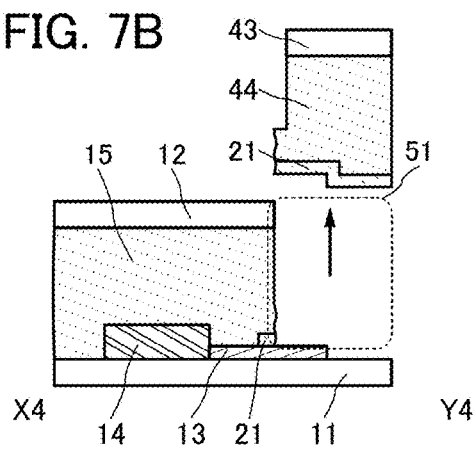

Next, the third region 43, the fourth region 44, and part of the separation layer 21 are removed from the processing member 17 (see FIGS. 7A and 7B). At this step, part of the terminal electrode 13 is exposed and an opening 51 is formed. Furthermore, at this step, part of the separation layer 21 is removed, and the other part of the separation layer 21 remains in the processing member 17 in some cases.

Figure 7C:
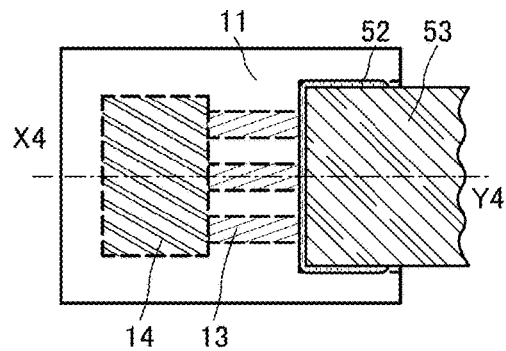
Figure 7D:
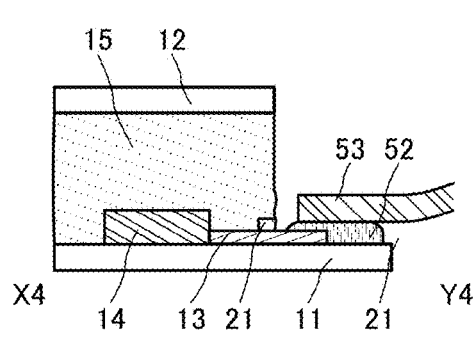

Through the above steps, a circuit board 10D in which the terminal electrode 13 is exposed in the opening 51 is completed. Note that a semiconductor device or a light-emitting device in which a connector 52 and an external electrode 53 are formed with the terminal electrode 13 is another embodiment of the present invention. FIGS. 7C and 7D are a top view and a cross-sectional view of a semiconductor device or a light-emitting device in which the external electrode 53 is connected to the circuit board 10D via the connector 52.

This embodiment can be combined with any other embodiment as appropriate.

Embodiment 2

Figure 8A:
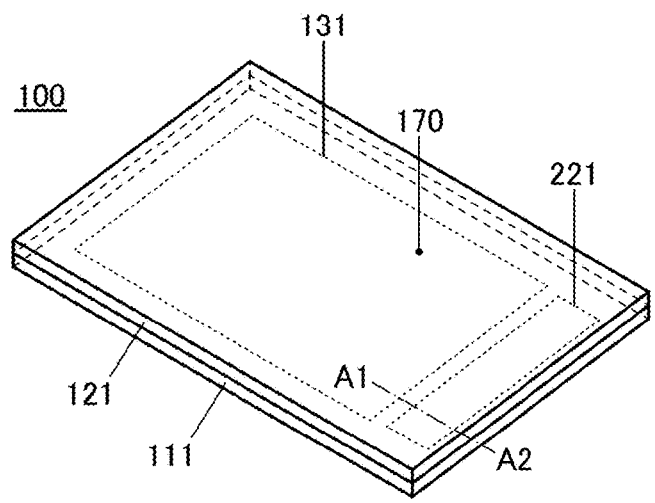
FIGS. 8A and 8B illustrate a structure example of a light-emitting device of an embodiment.
Figure 8B:
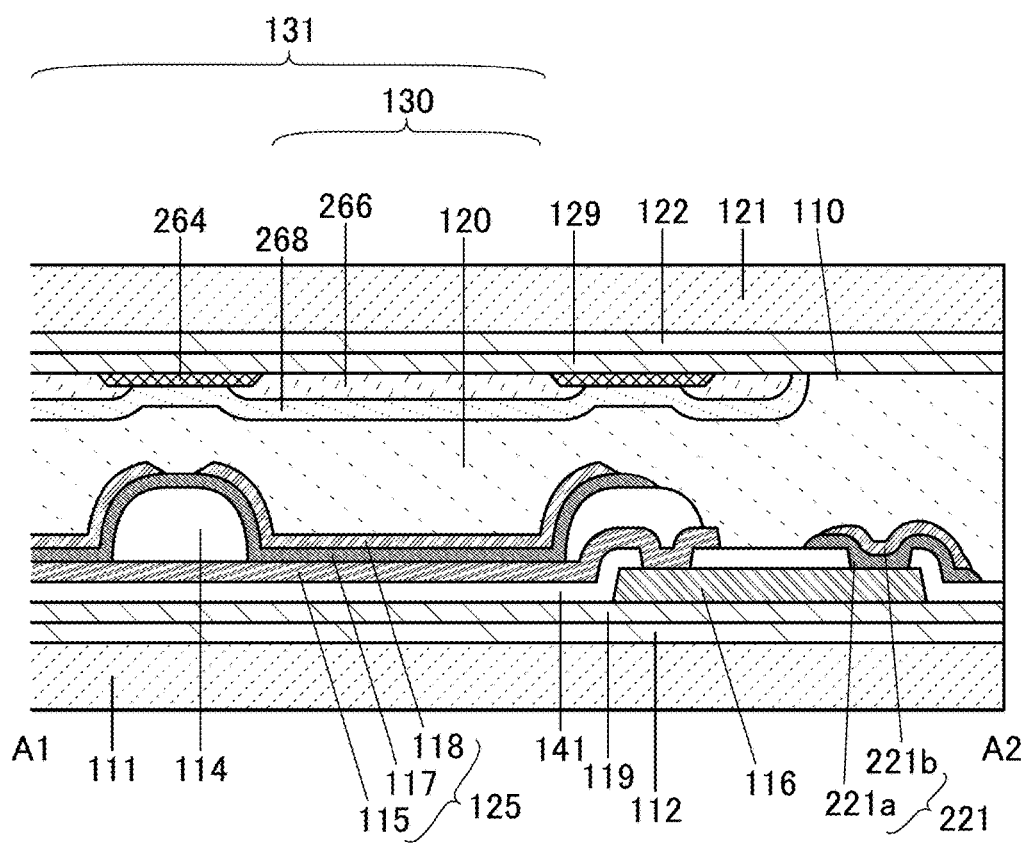

A structure example of a light-emitting device 100 of one embodiment of the present invention is be described with reference to FIGS. 8A and 8B, FIGS. 9A and 9B, FIGS. 10A to 10C, FIGS. 11A and 11B, and FIGS. 12A and 12B. FIG. 8A is a perspective view of the light-emitting device 100, and FIG. 8B is a cross-sectional view taken along the dashed-dotted line A1-A2 in FIG. 8A. Some components are not illustrated in FIG. 8A for convenience of explanation.
[Structure Example of Light-Emitting Device]

The light-emitting device 100 described in this embodiment includes a display region 131. The display region 131 includes a plurality of pixels 130. One pixel 130 includes at least one light-emitting element 125 (see FIGS. 8A and 8B).

The light-emitting device 100 described in this embodiment includes an electrode 115, an EL layer 117, an electrode 118, a partition 114, and the terminal electrode 116. The light-emitting device 100 further includes an insulating layer 141 over the terminal electrode 116, and the electrode 115 and the terminal electrode 116 are electrically connected to each other in an opening provided in the insulating layer 141. The partition 114 is provided over the electrode 115, the EL layer 117 is provided over the electrode 115 and the partition 114, and the electrode 118 is provided over the EL layer 117.

The light-emitting element 125 is provided over the substrate 111 with a bonding layer 112, an insulating layer 119, and the insulating layer 141 provided therebetween. The light-emitting element 125 includes the electrode 115, the EL layer 117, and the electrode 118.

The separation layer 221 is provided over the terminal electrode 116 in an opening in the insulating layer 141. In this embodiment, the separation layer 221 includes a first layer 221a and a second layer 221b.

The light-emitting device 100 described in this embodiment includes the substrate 121 provided over the electrode 118 with a bonding layer 120 provided therebetween. In addition, the substrate 121 is provided with a light-blocking layer 264, a coloring layer (also referred to as a color filter) 266, and an overcoat layer 268 with a bonding layer 122 and an insulating layer 129 provided therebetween.

Figure 9A:
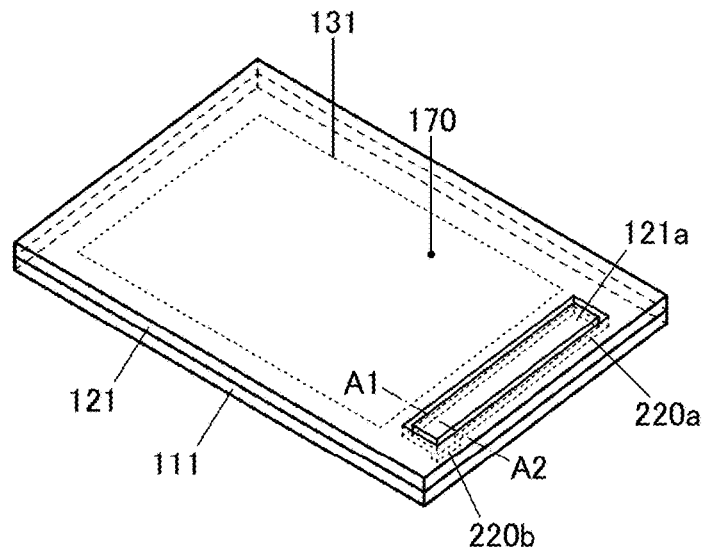
FIGS. 9A and 9B illustrate a method for manufacturing a light-emitting device of an embodiment.
Figure 9B:
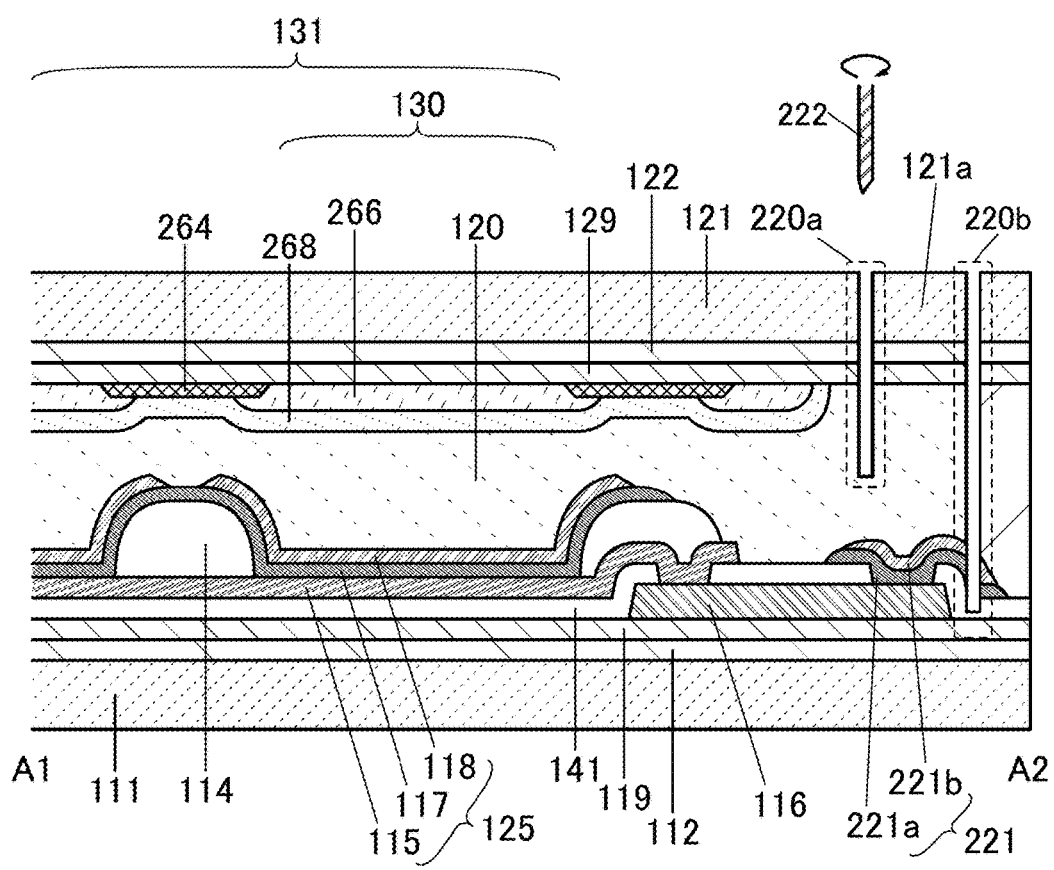
Figure 10A:
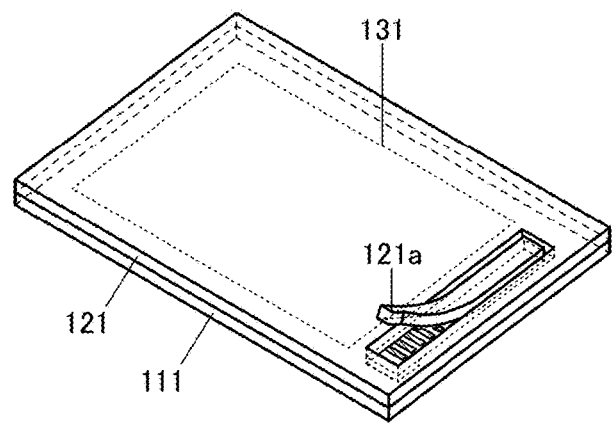
FIGS. 10A to 10C illustrate a structure example and a method for manufacturing a light-emitting device of an embodiment.
Figure 10B:
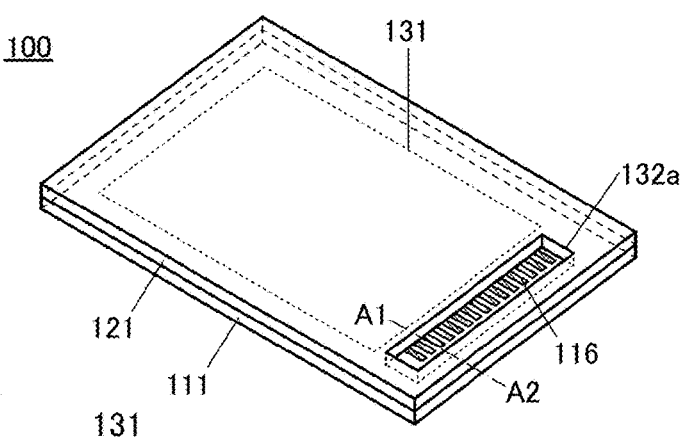
Figure 10C:
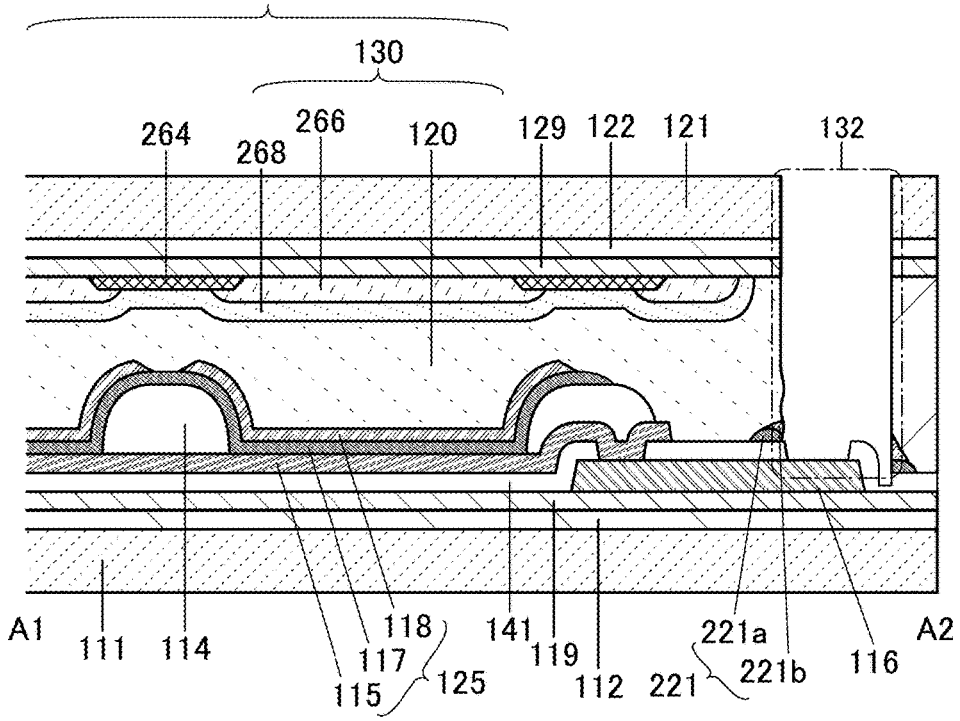

A blade 222 is inserted into the light-emitting device 100 from the substrate 121 side to perform cutting processing, and part of the light-emitting device 100 is removed so that a first groove 220a and a second groove 220b are formed as illustrated in FIGS. 9A and 9B. The depth of the second groove 220b is greater than that of the first groove 220a. Here, a portion of the substrate 121 overlapping with a region surrounded by the first groove 220a and the second groove 220b is a portion 121a. The portion 121a and a portion of layers between the portion 121a and the terminal electrode 116 (the bonding layer 122, the insulating layer 129, the bonding layer 120, and the separation layer 221) that overlaps with the portion 121a are separated from the light-emitting device 100, so that part of the terminal electrode 116 can be exposed. FIG. 10A is a perspective view illustrating the separation of the portion 121a and the portion of the layers between the portion 121a and the terminal electrode 116 that overlaps with the portion 121a. FIG. 10B is a perspective view illustrating that the portion 121a and the portion of the layers between the portion 121a and the terminal electrode 116 that overlaps with the portion 121a have been removed from the light-emitting device 100, and a layer remaining over the terminal electrode 116 has been removed. FIG. 10C is a cross-sectional view taken along the dashed-dotted line A1-A2 in FIG. 10B. Note that the light-emitting device 100 that is illustrated in FIGS. 8A and 8B and has not been subjected to the cutting processing yet can also be referred to as a processing member.

The portion 121a and the portion of the layers between the portion 121a and the terminal electrode 116 that overlaps with the portion 121a are removed to form an opening 132, so that part of the terminal electrode 116 can be exposed. In this embodiment, after the portion 121a and the portion of the layers between the portion 121a and the terminal electrode 116 that overlaps with the portion 121a are separated, part of the separation layer (the first layer 221a) remains over the terminal electrode 116; thus, the first layer 221a is removed from the terminal electrode 116, so that part of the terminal electrode 116 can be exposed. When the separation layer 221 has a single-layer structure and is formed using a material having low adhesion to the terminal electrode 116, a step of removing the first layer 221a remaining over the terminal electrode 116 can be skipped. Note that an outline 132a of the opening 132 formed in the substrate 121 at this step is a rectangle when seen from the top (see FIG. 10B).

Figure 11A:
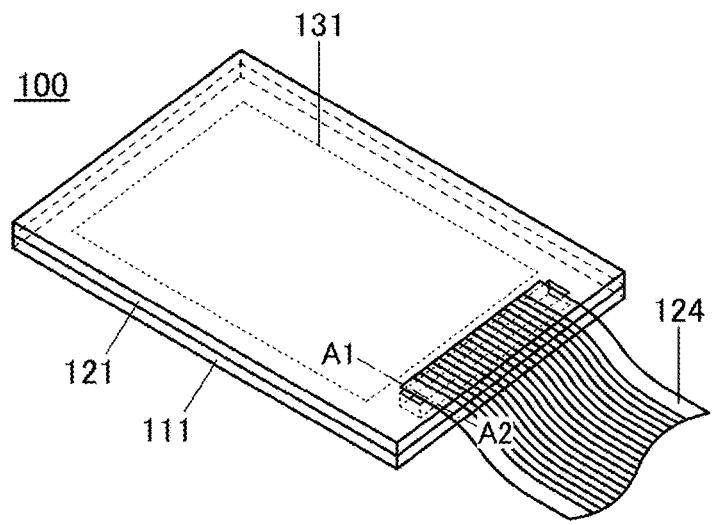
FIGS. 11A and 11B illustrate a structure example of a light-emitting device of an embodiment.
Figure 11B:
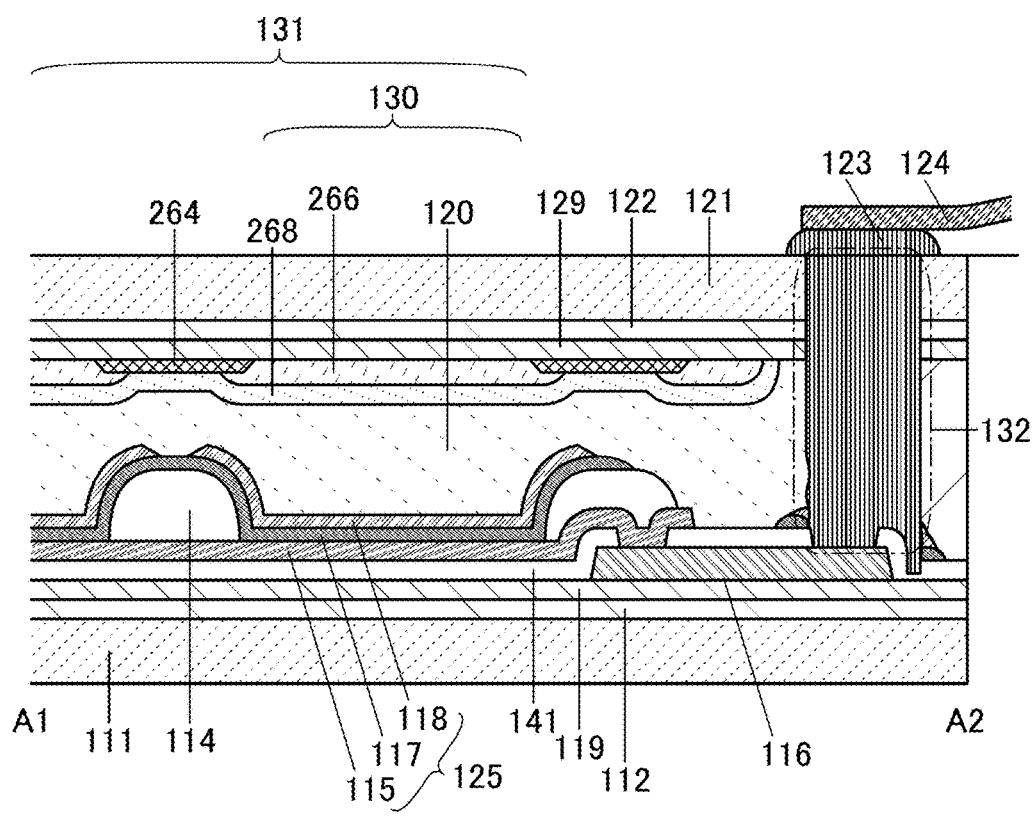

As illustrated in FIGS. 11A and 11B, an external electrode 124 and the terminal electrode 116 can be electrically connected to each other through an anisotropic conductive connection layer 123 in the opening 132. Thus, a region of the substrate 111 overlapping with the opening 132 is also called an external electrode connection region. FIG. 11A is a perspective view of the light-emitting device 100 to which the external electrode 124 is connected, and FIG. 11B is a cross-sectional view taken along the dashed-dotted line A1-A2 in FIG. 11A.

Figure 12A:
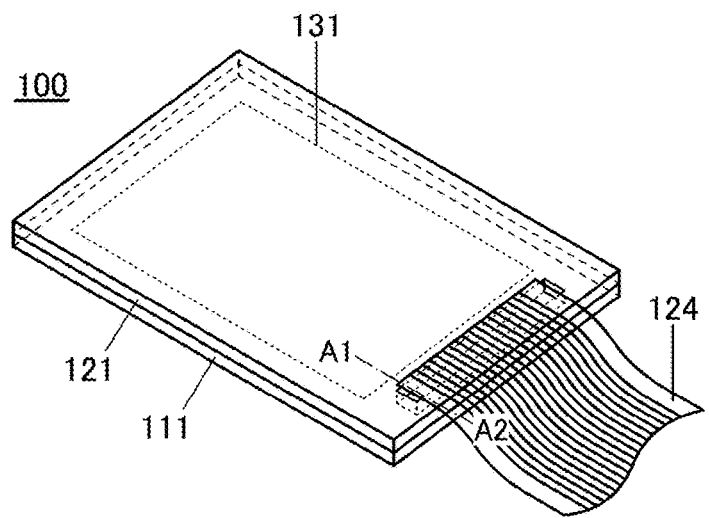
FIGS. 12A and 12B illustrate a structure example of a light-emitting device of an embodiment.
Figure 12B:
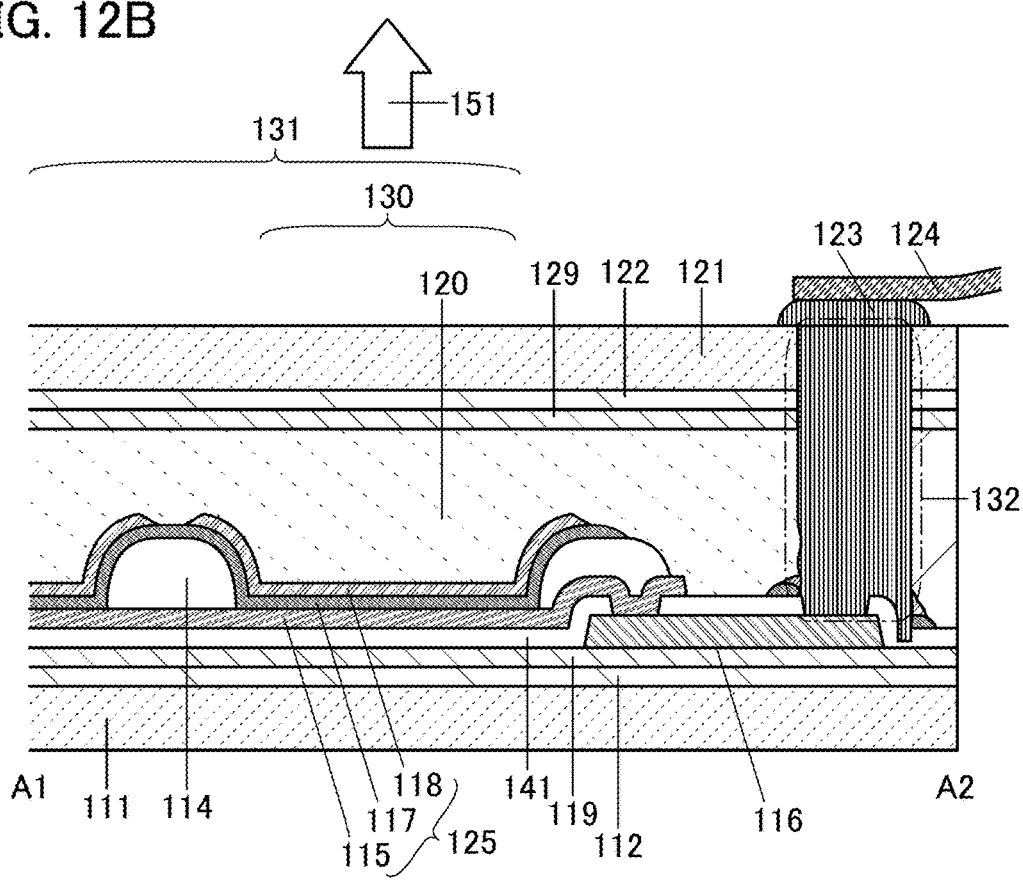

Note that as illustrated in FIGS. 12A and 12B, it is possible not to provide the light-blocking layer 264, the coloring layer 266, and the overcoat layer 268 in the light-emitting device 100. FIG. 12A is a perspective view of the light-emitting device 100 in which the light-blocking layer 264, the coloring layer 266, and the overcoat layer 268 are not provided, and FIG. 12B is a cross-sectional view taken along the dashed-dotted line A1-A2 in FIG. 12A.

In particular, in the case where the EL layer 117 is provided by what is called side-by-side patterning in which the colors of lights 151 emitted from different pixels are different, the coloring layer 266 may be provided or is not necessarily provided.

When at least one or all of the light-blocking layer 264, the coloring layer 266, and the overcoat layer 268 are not provided, the light-emitting device 100 can achieve a reduction in manufacturing cost, yield improvement, or the like.

Moreover, the light 151 can be emitted efficiently when the coloring layer 266 is not provided; therefore, luminance can be improved or power consumption can be reduced, for example.

On the other hand, when the light-blocking layer 264, the coloring layer 266, and the overcoat layer 268 are provided, reflection of external light is inhibited and thus a contrast ratio, color reproducibility, or the like can be improved.

Note that in the case where the light-emitting device 100 has a bottom-emission structure, the light-blocking layer 264, the coloring layer 266, and the overcoat layer 268 may be provided on the substrate 111 side. In the case where the light-emitting device 100 has a dual-emission structure, the light-blocking layer 264, the coloring layer 266, and the overcoat layer 268 may be provided on either or both of the substrate 111 side and the substrate 121 side.

A switching element for controlling a signal supplied to the light-emitting element 125 may be provided between the light-emitting element 125 and the terminal electrode 116. For example, a transistor may be provided between the light-emitting element 125 and the terminal electrode 116.

A transistor is a kind of semiconductor element and enables amplification of current or voltage, switching operation for controlling conduction or non-conduction, or the like. By providing a transistor between the light-emitting element 125 and the terminal electrode 116, an increase in the area of the display region 131 and a higher-resolution display can be achieved easily. Note that a resistor, an inductor, a capacitor, or the like, without limitation to a switching element such as a transistor, can be provided in the display region 131.

[Substrates 111 and 121]

An organic resin material, a glass material that is thin enough to have flexibility, or the like can be used for the substrate 111 and the substrate 121. In the case where the light-emitting device 100 has a bottom-emission structure or a dual-emission structure, a material having a light-transmitting property with respect to light emitted from the EL layer 117 is used for the substrate 111. In the case where the light-emitting device 100 has a top-emission structure or a dual-emission structure, a material that transmits light emitted from the EL layer 117 is used for the substrate 121.

As a material that has flexibility and transmits visible light, which can be used for the substrate 111 and the substrate 121, the following can be used: a polyethylene terephthalate (PET) resin, a polyethylene naphthalate (PEN) resin, a polyether sulfone (PES) resin, a polyacrylonitrile resin, an acrylic resin, a polyimide resin, a polymethylmethacrylate resin, a polycarbonate resin, a polyamide resin, a cycloolefin resin, a polystyrene resin, a polyamide-imide resin, a polypropylene resin, a polyester resin, a vinyl resin, an aramid resin, polytetrafluoroethylene (PTFE), an epoxy resin, or the like. Alternatively, a mixture or a stack including any of these materials may be used. Note that the same material or different materials may be used for the substrate 111 and the substrate 121. A metal material (including an alloy material) may be used for the substrate 111 and the substrate 121.

The thermal expansion coefficients of the substrate 121 and the substrate 111 are preferably less than or equal to 30 ppm/K and further preferably less than or equal to 10 ppm/K. On surfaces of the substrate 121 and the substrate 111, a protective film having low water permeability may be formed; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 121 and the substrate 111.

[Insulating Layer 119]

The insulating layer 119 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layer 119 can be formed by a sputtering method, a CVD method, a thermal oxidation method, a coating method, a printing method, or the like.

The insulating layer 119 can prevent or reduce diffusion of an impurity element from the substrate 111, the bonding layer 112, or the like to the light-emitting element 125.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

[The Terminal Electrode 116]

The terminal electrode 116 can be formed using a conductive material. For example, a metal element selected from aluminum, chromium, copper, silver, gold, platinum, tantalum, nickel, titanium, molybdenum, tungsten, hafnium, vanadium, niobium, manganese, magnesium, zirconium, beryllium, iron, cobalt, palladium, and the like; an alloy containing any of the above metal elements; an alloy containing a combination of the above metal elements; or the like can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. A semiconductor typified by polycrystalline silicon containing an impurity element such as phosphorus, or silicide such as nickel silicide may also be used. There is no particular limitation on the formation method of the conductive material, and a variety of formation methods such as an evaporation method, a CVD method, a sputtering method, and a spin coating method can be employed.

The terminal electrode 116 can also be formed using a conductive material containing oxygen, such as indium tin oxide (hereinafter also referred to as ITO), indium oxide containing tungsten oxide, indium zinc oxide containing tungsten oxide, indium oxide containing titanium oxide, ITO containing titanium oxide, indium zinc oxide, or ITO to which silicon oxide is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The terminal electrode 116 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an alloy containing aluminum and one or more elements selected from titanium, tantalum, tungsten, molybdenum, chromium, neodymium, and scandium may be used as the terminal electrode 116.

[The Insulating Layer 141]

The insulating layer 141 can be formed using a material and a method that are similar to those of the insulating layer 119.

[Electrode 115]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an ITO layer, and a layer having high reflectance (e.g., aluminum, an alloy containing aluminum, or silver) may be provided in contact with the layer.

The light-emitting device having a top-emission structure is described as an example in this embodiment. In the case of a light-emitting device having a bottom-emission structure or a dual emission structure, the electrode 115 may be formed using a light-transmitting conductive material.

[Partition 114]

The partition 114 has a function of preventing an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[EL Layer 117]

A structure of the EL layer 117 is described in Embodiment 4.

[Electrode 118]

The electrode 118 is used as a cathode in this embodiment, and thus the electrode 118 is preferably formed using a material that has a low work function and can inject electrons into the EL layer 117 described later. As well as a single-layer of a metal having a low work function, a stack in which a metal material such as aluminum, a conductive oxide material such as ITO, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver, or the like can also be used.

In the case where light emitted from the EL layer 117 is extracted through the electrode 118, the electrode 118 preferably has a property of transmitting visible light.

[Bonding Layers 120, 112, and 122]

A light curable adhesive, a reaction curable adhesive, a thermosetting adhesive, or an anaerobic adhesive can be used as the bonding layer 120, the bonding layer 112, and the bonding layer 122. For example, an epoxy resin, an acrylic resin, or an imide resin can be used. A drying agent (e.g., zeolite) having a size less than or equal to the wavelength of light emitted from the EL layer 117 or a filler (e.g., titanium oxide or zirconium) with a high refractive index is preferably mixed into the bonding layer 120 in the case of a top-emission structure or into the bonding layer 112 in the case of a bottom-emission structure, in which case the light-coupling efficiency of extracting light emitted from the EL layer 117 negligibly decrease and the reliability of the light-emitting device is improved.

[Anisotropic Conductive Connection Layer 123]

The anisotropic conductive connection layer 123 can be formed using any of various kinds of anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting and light curable resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

[The Insulating Layer 129]

The insulating layer 129 can be formed using a material and a method that are similar to those of the insulating layer 119.

[Example of a Method for Manufacturing Light-Emitting Device]

Next, an example of a method for manufacturing the light-emitting device 100 of one embodiment of the present invention, to which the external electrode is connected, is described with reference to FIGS. 13A to 13E, FIGS. 14A to 14D, FIGS. 15A to 15D, FIGS. 16A to 16C, FIGS. 17A and 17B, FIGS. 18A and 18B, and FIGS. 19A and 19B. FIGS. 13A to 19B except FIGS. 16A to 16C correspond to the cross-sectionals taken along the dashed-dotted line A1-A2 in FIGS. 8A to 11B.

[Formation of Peeling Layer 113]

First, a peeling layer 113 is formed over a support substrate 101. Examples of the substrate include a semiconductor substrate (e.g., a single crystal substrate or a silicon substrate), an SOI substrate, a glass substrate, a quartz substrate, a sapphire substrate, a ceramic substrate, a plastic substrate having sufficient heat resistance to the processing temperature of this embodiment, a metal substrate, a stainless steel substrate, a substrate including stainless steel foil, a tungsten substrate, a substrate including tungsten foil, and the like. As an example of a glass substrate, a barium borosilicate glass substrate, an aluminoborosilicate glass substrate, and soda lime glass substrate can be given.

The peeling layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The peeling layer 113 can also be formed to have a single-layer structure or a stacked-layer structure using any of the materials. Note that the crystalline structure of the peeling layer 113 may be amorphous, microcrystalline, or polycrystalline. The peeling layer 113 can also be formed using a metal oxide such as aluminum oxide, gallium oxide, zinc oxide, titanium dioxide, indium oxide, ITO, indium zinc oxide, or an oxide including indium, gallium, and zinc (In—Ga—Zn—O, IGZO).

The peeling layer 113 can be formed by a sputtering method, a CVD method, a coating method, a printing method, or the like. Note that the coating method includes a spin coating method, a droplet discharge method, and a dispensing method.

In the case where the peeling layer 113 has a single-layer structure, tungsten, molybdenum, or a material containing tungsten and molybdenum is preferably used, or an oxide or oxynitride of tungsten, an oxide or oxynitride of molybdenum, or an oxide or oxynitride of a material containing tungsten and molybdenum is preferably used.

Note that after the formation of the peeling layer 113, the surface of the peeling layer 113 may be exposed to an atmosphere containing oxygen or a plasma atmosphere containing oxygen. Oxidizing the surface of the peeling layer 113 can facilitate peeling of the support substrate 101 performed later.

A glass substrate is used as the support substrate 101 in this embodiment. As the peeling layer 113, a tungsten film is formed over the support substrate 101 by a sputtering method.

[Formation of Insulating Layer 119]

Subsequently, the insulating layer 119 is formed over the peeling layer 113.

For the insulating layer 119, an inorganic insulating material such as silicon oxide, silicon oxynitride, silicon nitride oxide, silicon nitride, or aluminum oxide can be used. The insulating layer 119 can be a single layer or stacked layers containing the above inorganic insulating material.

In particular, it is preferable that the insulating layer 119 have a stacked-layer structure including two or more layers. In the stacked structure, at least one of the layers is preferably a layer that releases hydrogen when heated, and the closest layer to the peeling layer 113 is preferably a layer that transmits hydrogen. For example, the peeling layer 113 has a stacked-layer structure including a layer containing silicon oxynitride and a layer containing silicon nitride in this order from the peeling layer 113 side. In this embodiment, the insulating layer 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film by a plasma CVD method from the support substrate 101 side.

The insulating layer 119 can be formed by a sputtering method, a plasma CVD method, or the like. In particular, the insulating layer 119 is preferably formed by a plasma CVD method using a deposition gas containing hydrogen.

A surface of the peeling layer 113 is oxidized when the insulating layer 119 is formed, and as a result, an oxide layer is formed between the peeling layer 113 and the insulating layer 119. The oxide layer contains an oxide of the metal contained in the peeling layer 113. The oxide layer preferably contains tungsten oxide.

Tungsten oxide is generally represented by $WO_{(3-x)}$ and is a non-stoichiometric compound that can have a variety of compositions, typically $WO_3$, $W_2O_5$, $W_4O_{11}$, and $WO_2$. Titanium oxide $TiO_{(2-x)}$ and molybdenum oxide $MoO_{(3-x)}$ are also non-stoichiometric compounds.

The oxide layer at this stage preferably contains a large amount of oxygen. For example, in the case where tungsten is used for the peeling layer 113, the oxide layer is preferably a tungsten oxide layer containing $WO_3$ as its main component.

The oxide layer can also be formed on the surface of peeling layer 113 in advance by performing plasma treatment on the surface of the peeling layer 113 in an atmosphere containing an oxidized gas (preferably a dinitrogen monoxide gas) before the formation of the insulating layer 119. When such a method is employed, the thickness of the oxide layer can vary depending on the conditions for the plasma treatment and the thickness of the oxide layer can be controlled more effectively than in the case where plasma treatment is not performed.

The thickness of the oxide layer is, for example, greater than or equal to 0.1 nm and less than or equal to 100 nm, preferably greater than or equal to 0.5 nm and less than or equal to 20 nm. Note that the oxide layer with an extremely small thickness cannot be observed in a cross-sectional image in some cases.

[Heat Treatment]

Next, heat treatment is performed to change the quality of the oxide layer. By the heat treatment, hydrogen is released from the insulating layer 119 to the oxide layer.

The metal oxide in the oxide layer is reduced by hydrogen supplied to the oxide layer, so that a plurality of regions with different proportions of oxygen are mixed in the oxide layer. For example, in the case where tungsten is used for the peeling layer 113, $WO_3$ in the oxide layer is reduced to generate an oxide with a proportion of oxygen lower than that of $WO_3$ (e.g., $WO_2$), resulting in a state where $WO_3$ and the oxide with the lower proportion of oxygen are mixed. The crystal structure of such a metal oxide depends on the proportion of oxygen; thus, when a plurality of regions with different proportions of oxygen is provided in the oxide layer, the mechanical strength of the oxide layer is reduced. As a result, the oxide layer is likely to be damaged inside, so that the peelability in a later peeling step can be improved.

The heat treatment may be performed at a temperature higher than or equal to the temperature at which hydrogen is released from the insulating layer 119 and lower than or equal to the temperature at which the support substrate 101 is softened. Furthermore, the heat treatment is preferably performed at a temperature higher than or equal to the temperature at which a reduction reaction between hydrogen and the metal oxide in the oxide layer occurs. For example, in the case where tungsten is used for the peeling layer 113, the heating temperature is higher than or equal to 420° C., higher than or equal to 450° C., higher than or equal to 600° C., or higher than or equal to 650° C.

The higher the temperature of the heat treatment is, the more the amount of hydrogen released from the insulating layer 119 increases, leading to improved peelability. However, even when the heating temperature is reduced in consideration of the heat resistance of the support substrate 101 and the productivity, high peelability can be achieved by forming the oxide layer in advance by performing plasma treatment on the peeling layer 113 as described above.

[Formation of the Terminal Electrode 116]

Next, a conductive layer 126 for forming the terminal electrode 116 is formed over the insulating layer 119. In this embodiment, as the conductive layer 126, a three-layer metal film in which a layer of aluminum is provided between two layers of titanium is formed over the insulating layer 119 by a sputtering method (see FIG. 13A).

After that, a resist mask is formed over the conductive layer 126, and the conductive layer 126 is etched into a desired shape using the resist mask, so that the terminal electrode 116 can be formed. The resist mask can be formed by a lithography method, a printing method, an inkjet method, or the like as appropriate. Formation of the resist mask by an inkjet method needs no photomask; thus, manufacturing cost can be reduced.

The etching of the conductive layer 126 may be performed by a dry etching method, a wet etching method, or both of them. In the case where the conductive layers 126 is etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 13B).

[Formation of Insulating Layer 127]

Figure 13A:
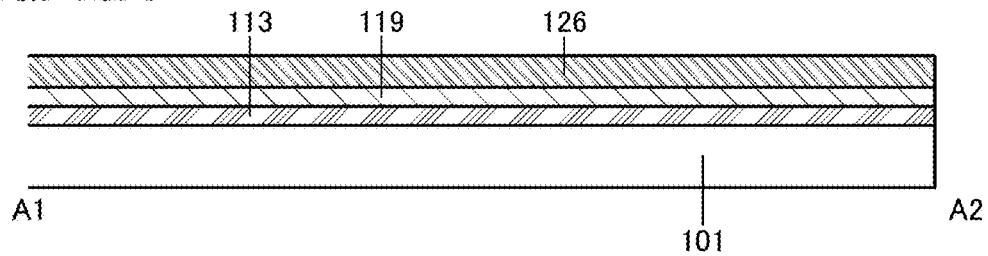
FIGS. 13A to 13E illustrate a method for manufacturing a light-emitting device of an embodiment.
Figure 13B:
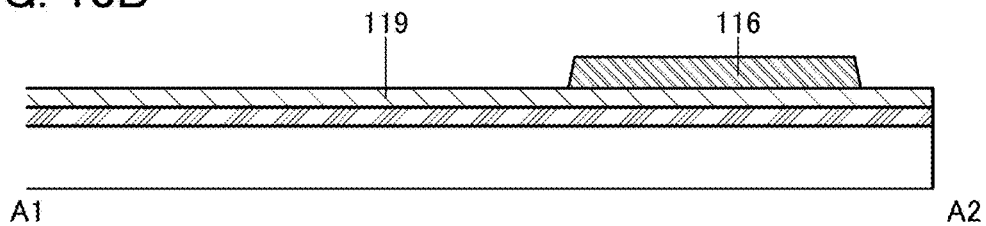
Figure 13C:
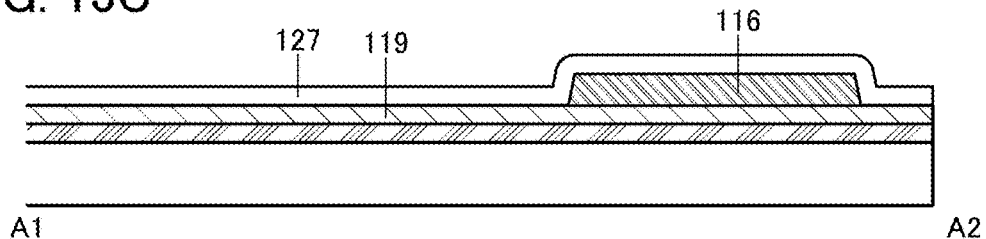

Next, an insulating layer 127 is formed over the terminal electrode 116 (see FIG. 13C). In this embodiment, a silicon oxynitride film is formed by a plasma CVD method as the insulating layer 127.

Figure 13D:
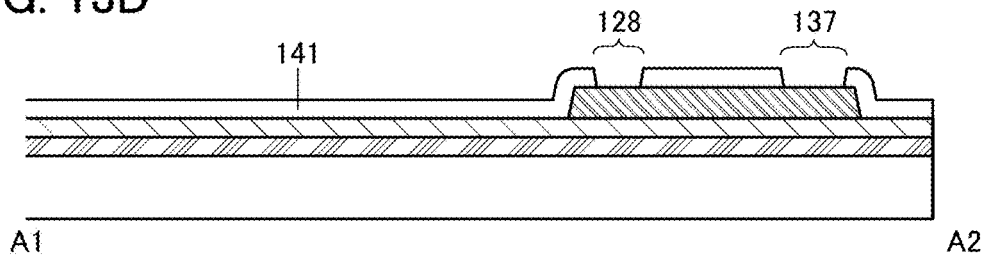

Next, a resist mask is formed over the insulating layer 127, and part of the insulating layer 127 overlapping with the terminal electrode 116 is selectively removed using the resist mask, so that the insulating layer 141 having an opening 128 and an opening 137 is formed (see FIG. 13D). The etching of the insulating layer 127 may be performed by a dry etching method, a wet etching method, or both of them.

[Formation of Electrode 115]

Figure 13E:
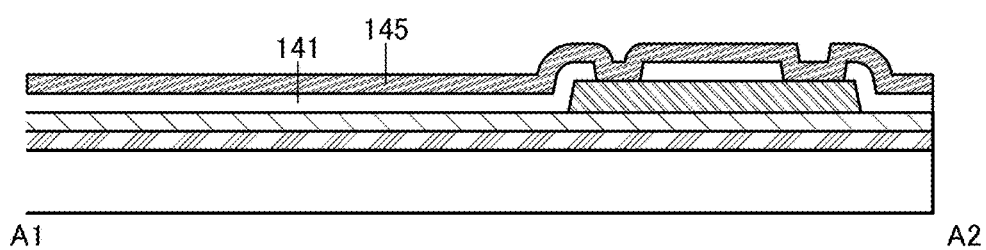

Next, a conductive layer 145 for forming the electrode 115 is formed over the insulating layer 141 (see FIG. 13E). The conductive layer 145 can be formed using a material and a method that are similar to those of the conductive layer 126.

Figure 14A:
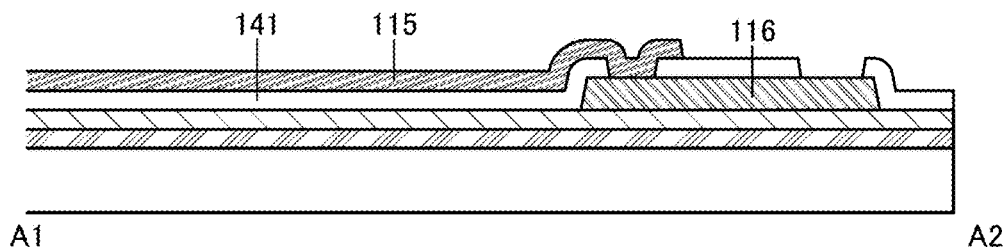
FIGS. 14A to 14D illustrate a method for manufacturing a light-emitting device of an embodiment.

Next, a resist mask is formed over the conductive layer 145, and part of the conductive layer 145 is selectively removed using the resist mask, so that the electrode 115 is formed (see FIG. 14A). The etching of the conductive layer 145 may be performed by a dry etching method, a wet etching method, or both of them. In this embodiment, the conductive layer 145 (electrode 115) is formed using a material in which ITO is stacked over silver. The electrode 115 and the terminal electrode 116 are electrically connected to each other through the opening 128.

[Formation of Partition 114]

Figure 14B:
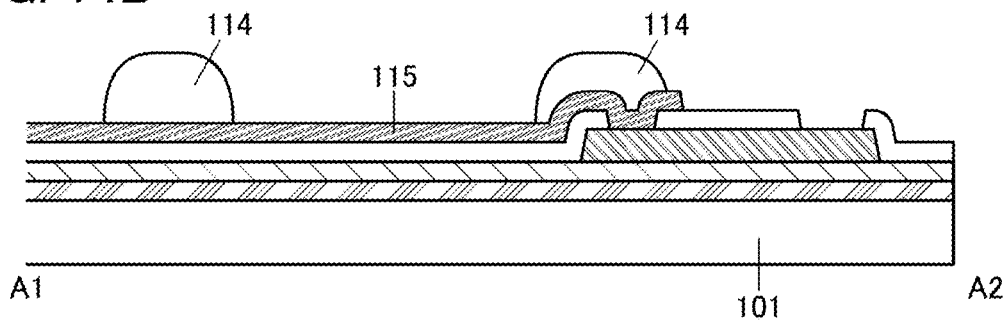

Next, the partition 114 is formed (see FIG. 14B). In this embodiment, the partition 114 is formed in such a manner that a photosensitive organic resin material is applied by a coating method and processed into a desired shape. In this embodiment, the partition 114 is formed using a photosensitive polyimide resin.

[Formation of EL Layer 117, Electrode 118, and Separation Layer 221]

In this embodiment, the separation layer 221 having a two-layer structure of the first layer 221a formed using the same material as the EL layer 117 and the second layer 221b formed using the same material as the electrode 118 is formed. Such a structure is preferable because the separation layer 221 can be formed without an increase in the number of manufacturing steps.

Figure 14C:
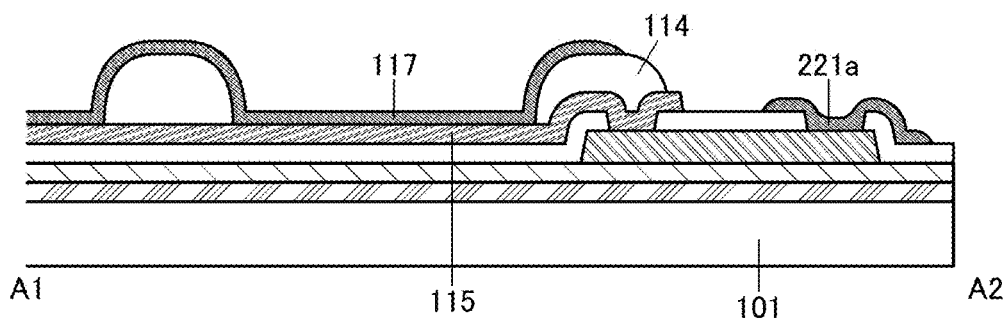

After the formation of the partition 114, the EL layer 117 is formed over the electrode 115 and the partition 114, and at the same time, the first layer 221a is formed in the opening 137 over the terminal electrode 116 (see FIG. 14C).

Next, the electrode 118 is formed over the EL layer 117, and at the same time, the second layer 221b is formed over the first layer 221a. In this embodiment, an alloy of magnesium and silver is used for the electrode 118 and the second layer 221b. The electrode 118 and the second layer 221b can be formed by an evaporation method, a sputtering method, or the like (see FIG. 14D).

Figure 14D:
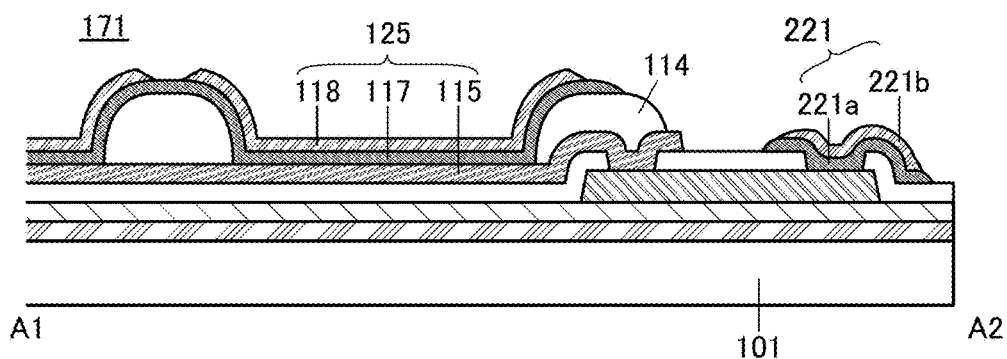

At this step, the first layer 221a and the second layer 221b are formed over the terminal electrode 116 in the opening 137 and the insulating layer 141 near the opening 137. That is, the first layer 221a and the second layer 221b are formed so that a region where the terminal electrode 116 is exposed in the opening 137 overlaps with part of the interface between the first layer 221a and the second layer 221b. As illustrated in FIG. 14D, an end portion of the second layer 221b preferably overlaps with the first layer 221a.

Note that the separation layer 221 formed in the opening 137 over the terminal electrode 116 may be formed to have a single-layer structure or a stacked-layer structure of two or more layers. In the case where the separation layer 221 has a single-layer structure, the separation layer 221 can be formed using a material having low adhesion to the terminal electrode 116. In the case where the separation layer 221 has a stacked-layer structure, a plurality of materials can be used so that adhesion between layers in the stack is decreased.

In this embodiment, the support substrate 101 over which the light-emitting element 125 is formed is referred to as an element substrate 171.

Next, a method for manufacturing a counter substrate 181 is described.

[Formation of Peeling Layer 143]

Figure 15A:
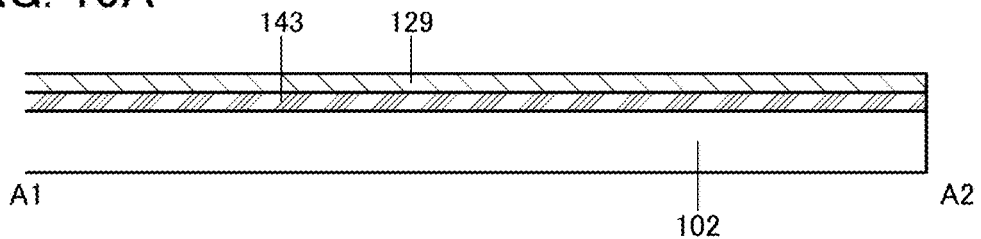
FIGS. 15A to 15D illustrate a method for manufacturing a light-emitting device of an embodiment.

First, a peeling layer 143 is formed over a support substrate 102 (see FIG. 15A). The support substrate 102 can be formed using a material similar to that of the support substrate 101. Note that the same material or different materials may be used for the support substrate 101 and the support substrate 102. The peeling layer 143 can be formed in a manner similar to that of the peeling layer 113. An insulating layer may be provided between the support substrate 102 and the peeling layer 143. In this embodiment, a glass substrate is used as the support substrate 102. The peeling layer 143 is formed of tungsten over the support substrate 102 by a sputtering method.

Note that after the formation of the peeling layer 143, the surface of the peeling layer 143 may be exposed to an atmosphere containing oxygen or a plasma atmosphere containing oxygen. Oxidizing the surface of the peeling layer 143 can facilitate peeling of the support substrate 102 performed later.

[Formation of the Insulating Layer 129]

Next, the insulating layer 129 is formed over the peeling layer 143 (see FIG. 15A). The insulating layer 129 can be formed using a material and a method that are similar to those of the insulating layer 119. Heat treatment similar to that performed after the formation of the insulating layer 119 may be performed after the insulating layer 129 is formed.

The heat treatment after the formation of the insulating layer 129 may be performed under different conditions (treatment temperature and time) from those of the heat treatment after the formation of the insulating layer 119. When the support substrate 101 and the support substrate 102 have different peelability, which is described later, the yield in the steps of peeling the substrates can be improved. This is because, when the peelability of the support substrate 101 is different from that of the support substrate 102 and the substrate having high peelability is peeled first, start of peeling of the other substrate can be inhibited easily while one of the substrates is peeled.

While the support substrate 101 is peeled first, concurrent peeling of the support substrate 102 can be inhibited in such a manner that, for example, the heat treatment after the formation of the insulating layer 129 is performed at a lower temperature and/or in a shorter time than the heat treatment after the formation of the insulating layer 119. Furthermore, while the support substrate 101 is peeled first, concurrent peeling of the support substrate 102 can be inhibited in such a manner that, after the formation of the peeling layer 113, the surface of the peeling layer 113 is exposed to an atmosphere containing oxygen or a plasma atmosphere containing oxygen, and the surface of the peeling layer 143 is exposed to the same atmosphere in a shorter time or not after its formation.

In this embodiment, the insulating layer 129 is formed by stacking a 200-nm-thick silicon oxynitride film, a 140-nm-thick silicon nitride oxide film, and a 100-nm-thick silicon oxynitride film by a plasma CVD method from the support substrate 102 side.

[Formation of Light-Blocking Layer 264]

Next, a layer for forming the light-blocking layer 264 is formed over the insulating layer 129. The layer may have a single-layer structure or a stacked-layer structure including two or more layers. Examples of a material for the layer are a metal material including chromium, titanium, nickel, or the like; and an oxide material including chromium, titanium, nickel, or the like.

Figure 15B:
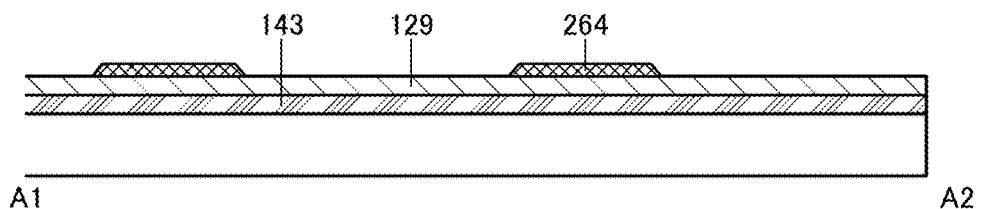

In the case where the layer is formed using the metal material or the oxide material, a resist mask is formed over the layer, and the layer is etched into a desired shape using the resist mask, so that the light-blocking layer 264 can be formed (see FIG. 15B). With a macromolecular material in which carbon black is dispersed, direct writing of the light-blocking layer 264 can be performed over the insulating layer 129 by an inkjet method.

[Formation of Coloring Layer 266]

Figure 15C:
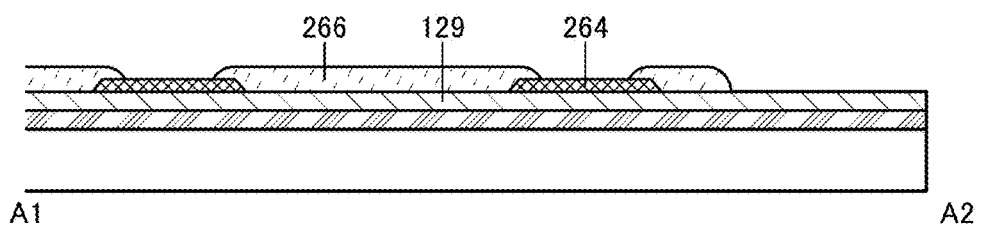

Next, the coloring layer 266 is formed over the insulating layer 129 (see FIG. 15C). Each coloring layer 266 is formed in a desired position with any of various materials by a printing method, an inkjet method, or a photolithography method. At this time, the coloring layer 266 is preferably provided so as to partly overlap with the light-blocking layer 264. Color display can be performed by providing the coloring layers 266 of different colors in different pixels.

Figure 16A:
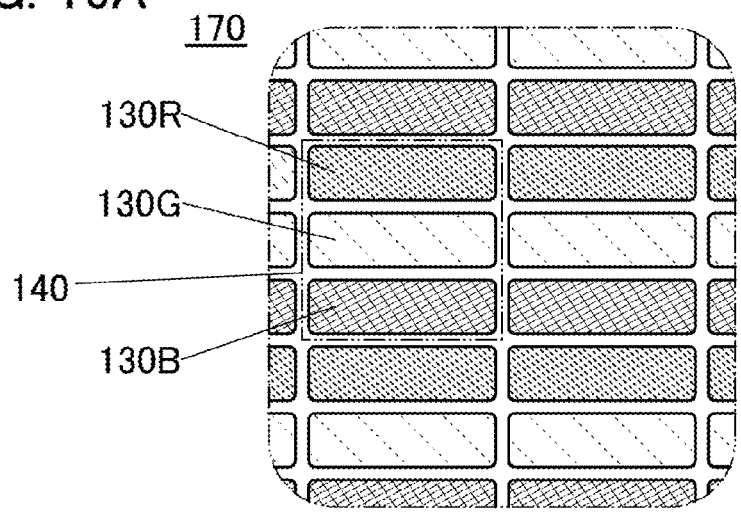
FIGS. 16A to 16C illustrate structure examples of a light-emitting device of an embodiment.
Figure 16B:
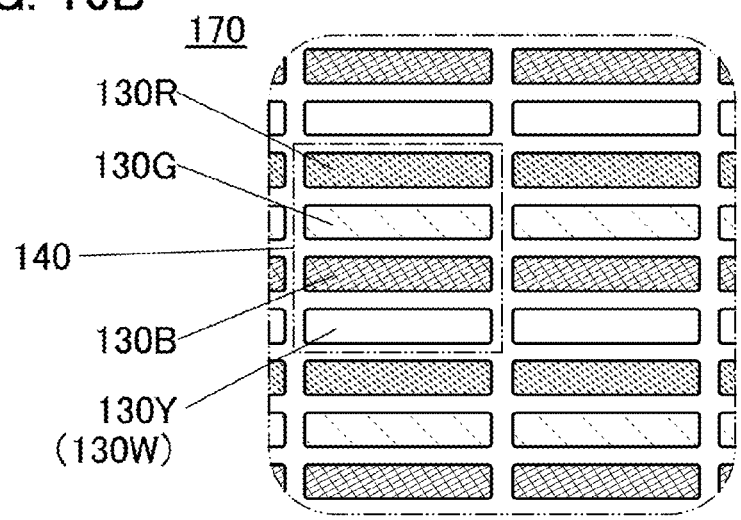
Figure 16C:
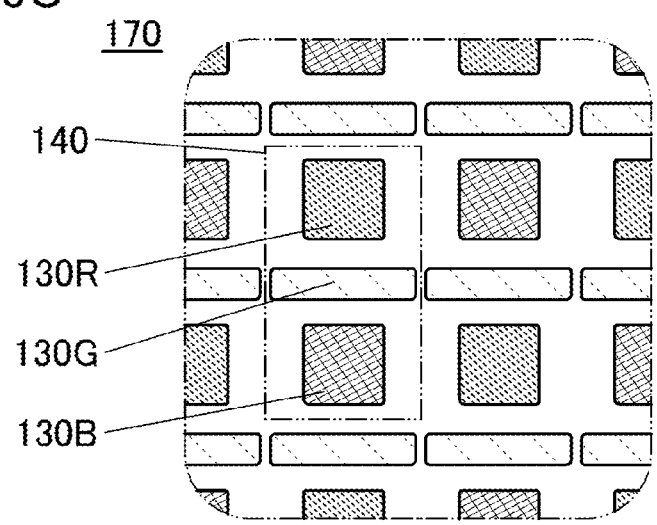

Here, examples of a pixel configuration for achieving color display are described with reference to FIGS. 16A to 16C. FIGS. 16A to 16C are enlarged plan views of a region 170 in the display region 131 of FIG. 8A. For example, as illustrated in FIG. 16A, full color display can be achieved in such a manner that the red, green, and blue coloring layers 266 are used so as to correspond to three pixels 130 serving as one pixel 140. In FIG. 16A, the pixel 130 emitting red light, the pixel 130 emitting green light, and the pixel 130 emitting blue light are illustrated as a pixel 130R, a pixel 130G, and a pixel 130B, respectively. The colors of the coloring layers 266 may be a color other than red, green, and blue; for example, the coloring layer 266 may be yellow, cyan, magenta, or the like.

As illustrated in FIG. 16B, four pixels 130 may function as a subpixel and may be collectively used as one pixel 140. For example, the coloring layers 266 corresponding to the four pixels 130 may be red, green, blue, and yellow. In FIG. 16B, the pixel 130 emitting red light, the pixel 130 emitting green light, the pixel 130 emitting blue light, and the pixel 130 emitting yellow light are illustrated as the pixel 130R, the 130G, the pixel 130B, and a pixel 130Y, respectively. By increasing the number of pixels 130 used as one pixel 140, the color reproducibility can be particularly improved. Thus, the display quality of the light-emitting device can be improved.

Alternatively, the coloring layers 266 corresponding to the four pixels 130 may be red, green, blue, and white. With the pixel 130 emitting white light (a pixel 130W), the luminance of the display region can be increased. Note that in the case of the pixel 130 emitting white light, it is not necessary to provide the coloring layer 266. Without a white coloring layer 266, there is no luminance reduction at the time of transmitting light through the coloring layer 266; thus, power consumption of the light-emitting device can be reduced. On the other hand, color temperature of white light can be controlled with the white coloring layer 266. Thus, the display quality of the light-emitting device can be improved.

Note that the occupation areas or shapes of the pixels 130 may be the same or different. In addition, arrangement is not limited to stripe arrangement. For example, delta arrangement, Bayer arrangement, or pentile arrangement can be used. FIG. 16C illustrates an example of pentile arrangement.

[Formation of Overcoat Layer 268]

Figure 15D:
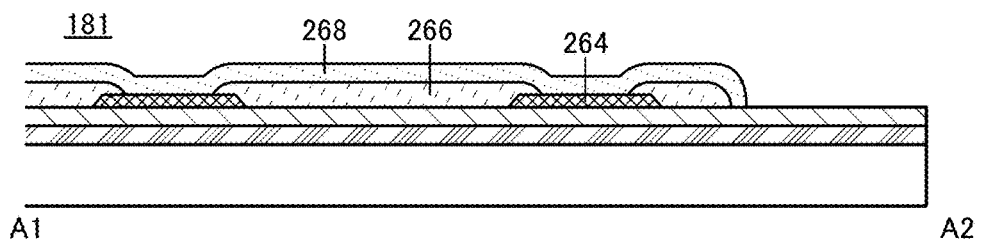

Next, the overcoat layer 268 is formed over the light-blocking layer 264 and the coloring layer 266 (see FIG. 15D).

For the overcoat layer 268, an organic insulating layer of an acrylic resin, an epoxy resin, a polyimide resin, or the like can be used. With the overcoat layer 268, diffusion of an impurity or the like contained in the coloring layer 266 to the light-emitting element 125 side can be inhibited, for example. Note that the overcoat layer 268 is not necessarily formed.

A light-transmitting conductive film may be formed as the overcoat layer 268, by which the light 151 emitted from the light-emitting element 125 can be transmitted through the overcoat layer 268 and transmission of ionized impurities through the overcoat layer 268 can be prevented.

The light-transmitting conductive film can be formed using, for example, indium oxide, ITO, indium zinc oxide, zinc oxide, or zinc oxide to which gallium is added. Graphene or a metal film that is thin enough to have a light-transmitting property can also be used.

In this embodiment, the support substrate 102 over which the coloring layer 266 and the like are formed is referred to as a counter substrate 181. Through the above steps, the counter substrate 181 can be formed. Note that in the case where the light-emitting device 100 in FIGS. 12A and 12B are manufactured, the steps of providing the light-blocking layer 264, the coloring layer 266, and the overcoat layer 268 on the substrate 181 are not performed.

[Attachment of Element Substrate 171 and Counter Substrate 181]

Next, the element substrate 171 and the counter substrate 181 are attached to each other with the bonding layer 120 provided therebetween. At the attachment, the light-emitting element 125 included in the element substrate 171 and the coloring layer 266 included in the counter substrate 181 are arranged so as to face each other (see FIG. 17A).

[Peeling of Support Substrate 101]

Figure 17A:
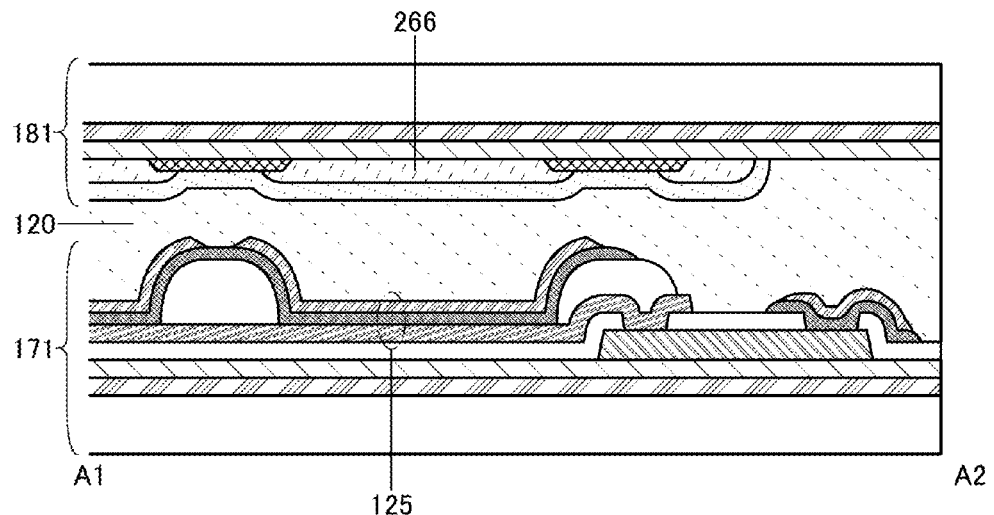
FIGS. 17A and 17B illustrate a method for manufacturing a light-emitting device of an embodiment.
Figure 17B:
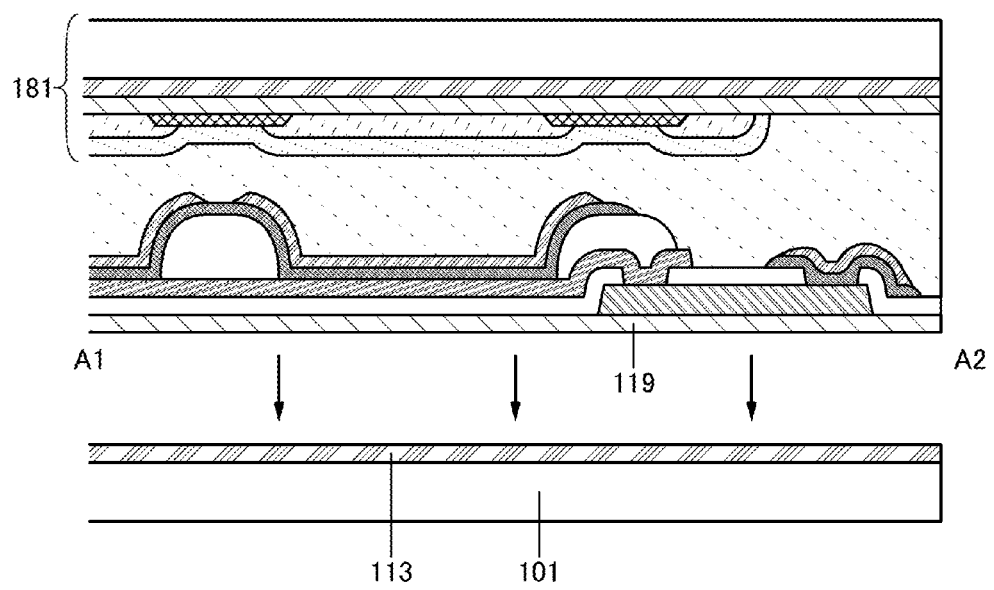

Next, the support substrate 101 included in the element substrate 171 is peeled from the insulating layer 119 together with the peeling layer 113 (see FIG. 17B). As a peeling method, mechanical force (a peeling process with a human hand or a gripper, a separation process by rotation of a roller, ultrasonic waves, or the like) may be used. For example, a cut is made in the interface between the peeling layer 113 and the insulating layer 119 from the side surface of the element substrate 171 with a sharp edged tool, by laser beam irradiation, or the like, and water is injected into the cut. The interface between the peeling layer 113 and the insulating layer 119 absorbs water by capillarity action, so that the support substrate 101 can be peeled easily from the insulating layer 119 together with the peeling layer 113.

[Attachment of the Substrate 111]

Figure 18A:
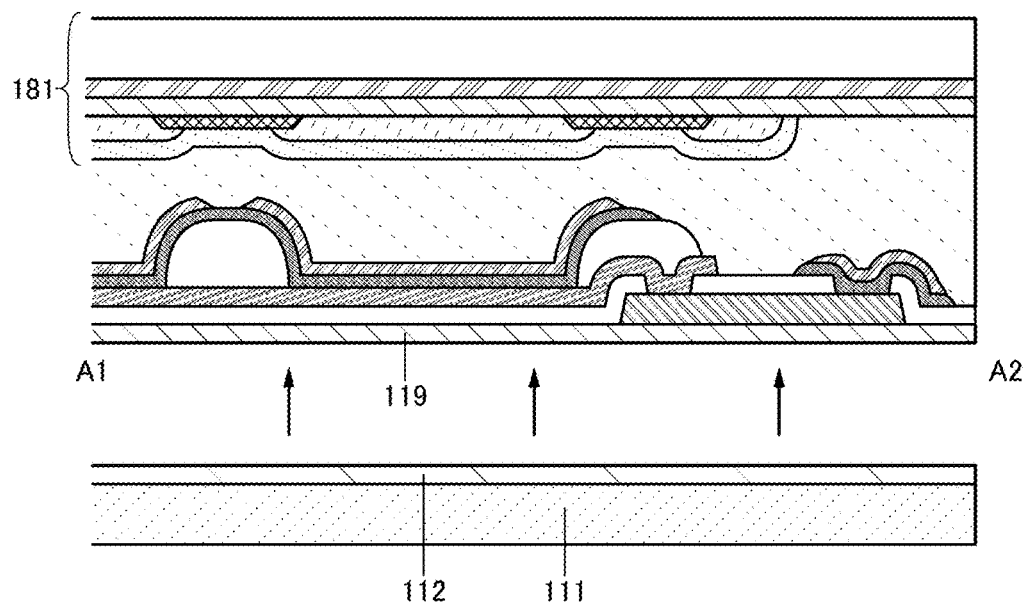
FIGS. 18A and 18B illustrate a method for manufacturing a light-emitting device of an embodiment.

Next, the substrate 111 is attached to the insulating layer 119 with the bonding layer 112 provided therebetween (see FIG. 18A).

[Peeling of Support Substrate 102]

Next, the support substrate 102 included in the counter substrate 181 is peeled from the insulating layer 129 together with the peeling layer 143. The support substrate 102 can be peeled using a peeling method similar to that of the support substrate 101. In the case where the peelability of the support substrate 101 is lower than that of the support substrate 102, the support substrate 102 is peeled first so that the yield in the steps of peeling the substrates can be improved.

[Attachment of the Substrate 121]

Figure 18B:
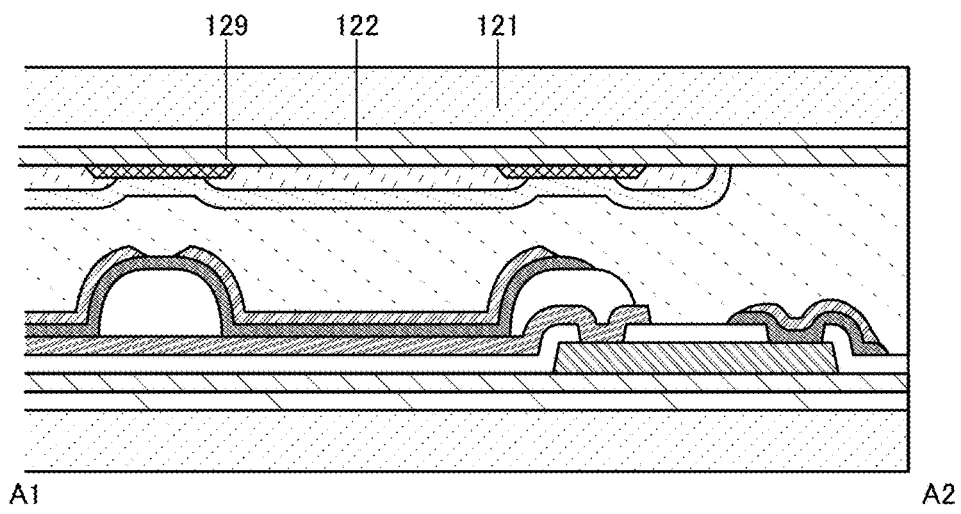

Next, the substrate 121 is attached to the insulating layer 129 with the bonding layer 122 provided therebetween (see FIG. 18B).

[Formation of the First Groove 220a and the Second Groove 220b]

Figure 19A:
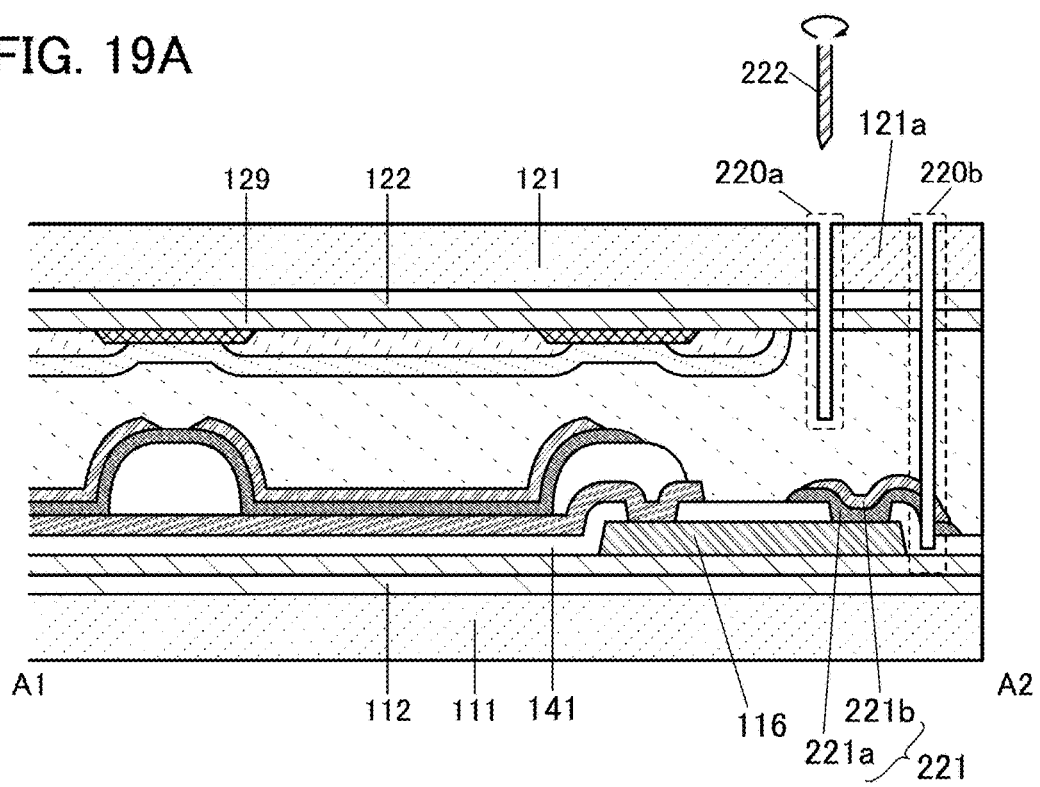
FIGS. 19A and 19B illustrate a method for manufacturing a light-emitting device of an embodiment.

Next, cutting processing using the blade 222 is performed from the substrate 121 side, so that the first groove 220a and the second groove 220b are formed (see FIG. 19A). A perspective view corresponding to the cross-sectional view of FIG. 19A is FIG. 9A.

The first groove 220a and the second groove 220b can be successively formed by cutting the substrate 121 and the like using the blade 222. In other words, the first groove 220a and the second groove 220b are connected. The region surrounded by the first groove 220a and the second groove 220b in FIG. 9A overlaps with part of the separation layer 221. Here, a portion of the substrate 121 overlapping with the region surrounded by the first groove 220a and the second groove 220b is the portion 121a.

This example of a manufacturing method shows a case where the top shape of the grooves formed using the blade 222 is a rectangle, a region corresponding to part of a side of the rectangle is the second groove 220b, and the other region is the first groove 220a (see FIG. 9A).

The first groove 220a is formed in the substrate 121, the bonding layer 122, the insulating layer 129, and the bonding layer 120. The second groove 220b is formed in the substrate 121, the bonding layer 122, the insulating layer 129, the bonding layer 120, the separation layer 221, and the insulating layer 141 (see FIG. 19A). That is, the depth of the second groove 220b (the distance between the top surface of the substrate 121 and the bottom of the second groove 220b) is preferably greater than the depth of the first groove 220a (the distance between the top surface of the substrate 121 and the bottom of the first groove 220a). Performing such processing facilitates exposure of part of the terminal electrode 116 in a step described later.

In the step described later, the second groove 220b is a starting point of the removal of the portion 121a and the portion of the layers between the portion 121a and the terminal electrode 116 that overlaps with the portion 121a (the bonding layer 122, the insulating layer 129, the bonding layer 120, and the second layer 221b). The portion 121a and the portion of the layers between the portion 121a and the terminal electrode 116 that overlaps with the portion 121a is also referred to as a layer to be removed below. Since the second groove 220b is formed, the interface between the first layer 221a and the second layer 221b is exposed at a side surface of the second groove 220b. Thanks to the exposure of the interface between the first layer 221a and the second layer 221b, damage to a peripheral layer such as the bonding layer 120 by the removal of the layer to be removed can be reduced. Thus, the second groove 220b is preferably formed at least in the substrate 121, the bonding layer 122, the insulating layer 129, the bonding layer 120, and the separation layer 221. The bottom of the second groove 220b may reach a position deeper than the interface between the first layer 221a and the second layer 221b, for example, the insulating layer 141. The second groove 220b may penetrate the insulating layer 141 and a layer below the insulating layer 141. The region occupied by the second groove 220b is small with respect to the light-emitting device 100; thus, the second groove 220b can be formed without lowering the intensity of the light-emitting device 100.

When the peeling starts from the interface between the first layer 221a and the second layer 221b that is exposed at the side surface of the second groove 220b, the removal of the layer to be removed proceeds inside the region surrounded by the first groove 220a and the second groove 220b with the first groove 220a as a guide. The depth of the first groove 220a can be smaller than the depth of the second groove 220b because the adhesion of the interface between the first layer 221a and the second layer 221b is low. The depth of the first groove 220a is one third or more, preferably one half or more of the thickness of the layer to be removed. The first groove 220a is formed at least in the substrate 121. By setting the depth of the first groove 220a small, the first groove 220a can be formed with no damage to the terminal electrode 116.

Note that it is sometimes difficult to form the first groove 220a and the second groove 220b with the intended depths depending on processing accuracy of a device including the blade 222 or the thickness of the layers included in the light-emitting device 100. However, as described above, the second groove 220b is not formed over the terminal electrode 116, and the first groove 220a may be formed only in the substrate 121. Thus, the method for manufacturing a light-emitting device of one embodiment of the present invention has a wide process margin on the depth direction of the blade 222 in forming the grooves. That is, according to the method for manufacturing a light-emitting device of one embodiment of the present invention, the light-emitting device 100 can be manufactured with a high yield.

The description of the blade 30 in Embodiment 1 can be referred to for a tool and a material of the tool that can be used for the blade 222.

[Formation of Opening 132]

Figure 19B:
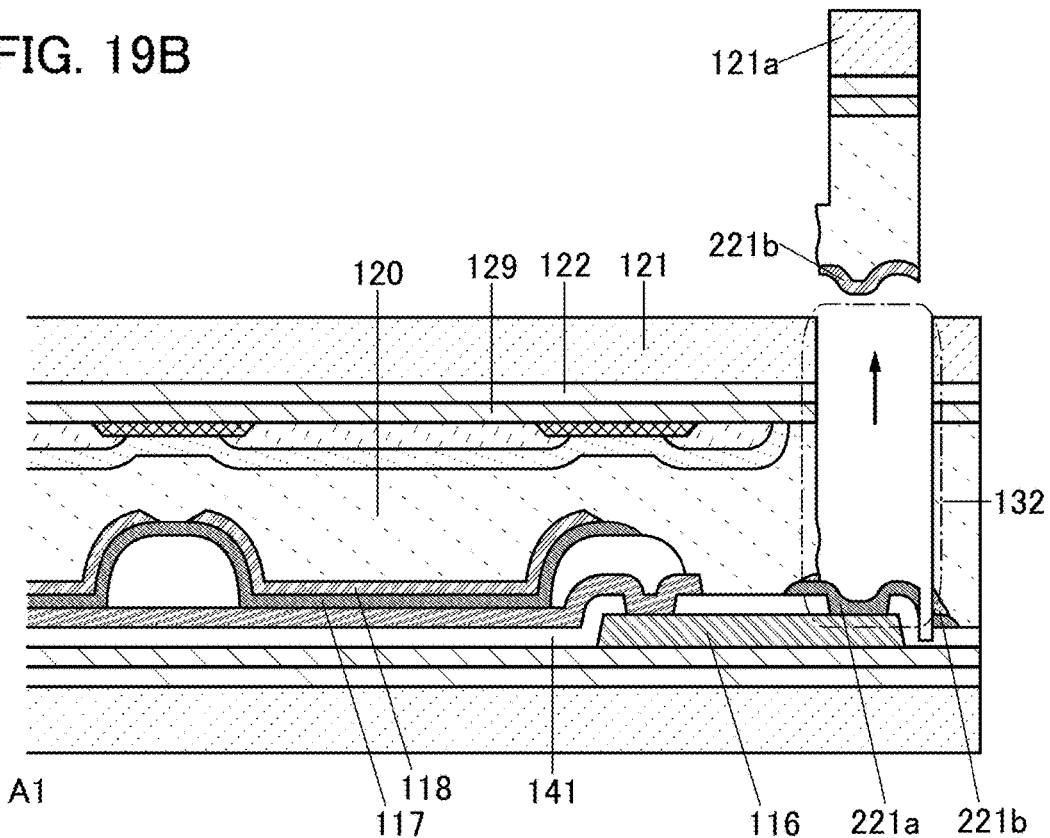

Next, by utilizing low adhesion of the interface between the first layer 221a and the second layer 221b, the layer to be removed is removed from the light-emitting device 100 (see FIG. 19B). As described above, the removal can be easily performed by starting the peeling from the interface between the first layer 221a and the second layer 221b exposed at the side surface of the second groove 220b. At this step, the second layer 221b remains over the terminal electrode 116. Moreover, part of the first layer 221a and part of the second layer 221b that are positioned outward from the portion 121a when seen from the top also remain in the light-emitting device 100.

The layer to be removed may be removed by applying mechanical force. For example, an adhesive tape or the like is bonded to the portion 121a and is taken off, whereby the layer can be separated. Alternatively, the portion 121a may be pulled while being wound by rolling a structure body, such as a cylinder, having a rotation axis and a suction mechanism on its surface on the portion 121a.

Alternatively, the portion 121a and the portion of the layers between the portion 121a and the terminal electrode 116 that overlaps with the portion 121a may be removed by lifting up the layers from the second groove 220b side with tweezers or an arm. Alternatively, the portion 121a and the portion of the layers between the portion 121a and the terminal electrode 116 that overlaps with the portion 121a may be removed by jetting a gas under high pressure toward the second groove 220b to float the portion 121a and the portion of the layers between the portion 121a and the terminal electrode 116 that overlaps with the portion 121a.

Alternatively, the portion 121a and the portion of the layers between the portion 121a and the terminal electrode 116 that overlaps with the portion 121a may be removed by hooking a needle-shaped or hook-shaped member to an opening provided in a region of the portion 121a or the like that is close to the second groove 220b, and lifting up the portion 121a and the portion of the layers. The opening can be formed at the same time as the first groove 220a and the second groove 220b using the blade 222. The number of such openings may be one or two or more.

Lastly, the first layer 221a remaining over the terminal electrode 116 is removed using an organic solvent such as acetone. Note that the first layer 221a remaining over the terminal electrode 116 is not necessarily removed in the case where a problem in electrical connection between the terminal electrode 116 and the anisotropic conductive connection layer 123 is not caused.

The top shape of the region surrounded by the first groove 220a and the second groove 220b is preferably changed according to these methods for removing the layer to be removed. In this case, as long as the region surrounded by the first groove 220a and the second groove 220b overlaps with the separation layer 221, the top shape can be freely changed. This change can be easily carried out because the first groove 220a and the second groove 220b are formed using the blade 222.

Figure 20A:
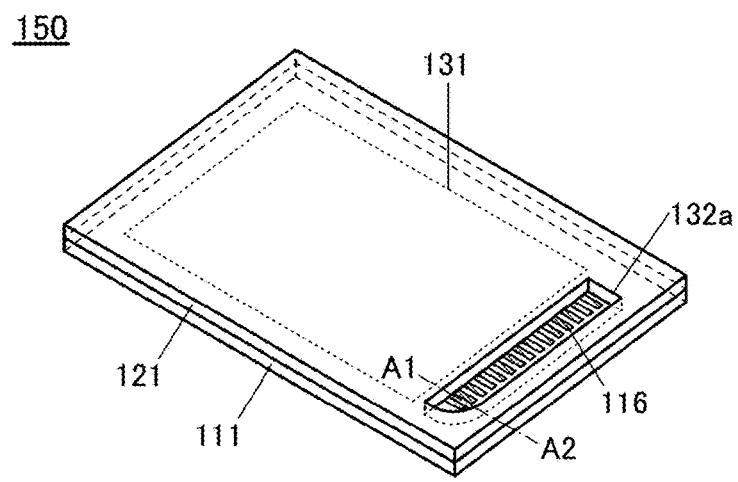
FIGS. 20A and 20B illustrate a structure example of a light-emitting device of an embodiment.
Figure 20B:
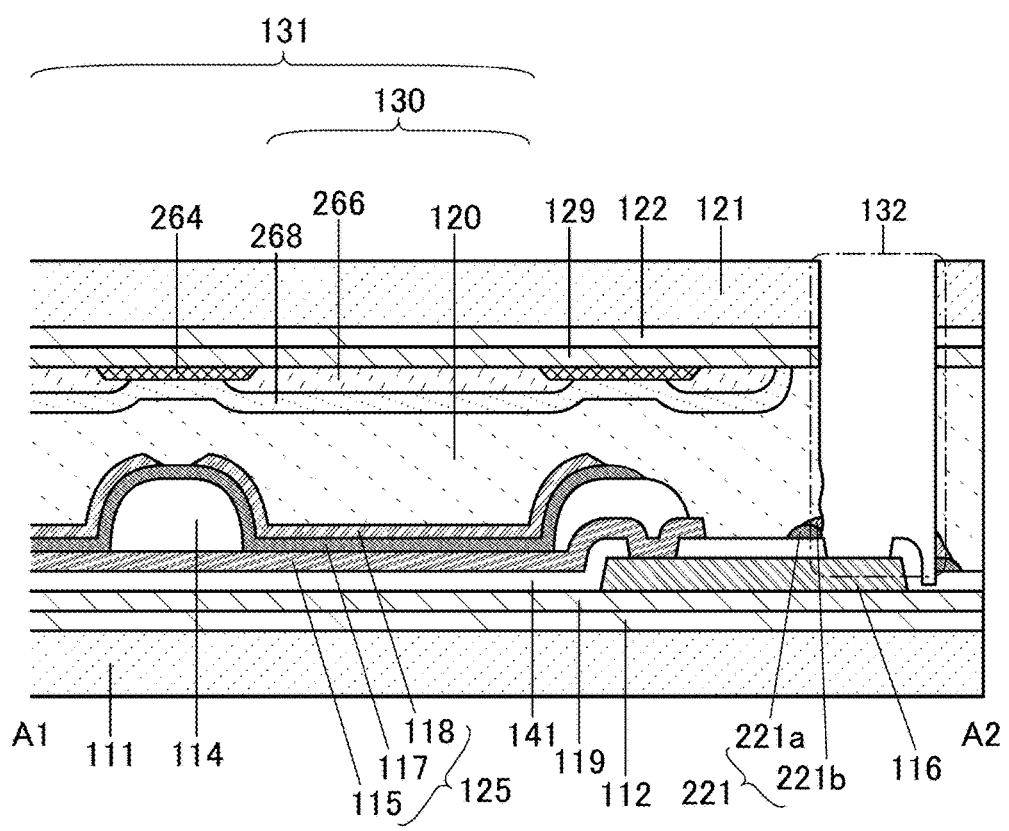

A light-emitting device 150 in FIGS. 20A and 20B differs from the light-emitting device 100 in FIGS. 10B and 10C in the shape of the outline 132a of the opening 132 when seen from the top. The light-emitting device of one embodiment of the present invention includes the terminal electrode 116; the light-emitting element 125 electrically connected to the terminal electrode 116; the separation layer 221 over the terminal electrode 116; the substrate 111 supporting the terminal electrode 116 and the light-emitting element 125; and the substrate 121. The substrate 111 and the substrate 121 sandwich the terminal electrode 116 and the light-emitting element 125 with the bonding layer 120. The opening 132 is provided in the separation layer 221, the bonding layer 120, and the substrate 121. The opening 132 overlaps with part of the terminal electrode 116. The outline 132a of the opening 132 has a plurality of corners when seen from the top. At least one of the plurality of corners has a round shape. With such a structure, in the case where the light-emitting device 150 is flexible, in some cases, a crack can be prevented from being generated from part of the opening 132 when a portion near the opening 132 is curved in transportation or use of the light-emitting device 150. Here, the curvature radius of the round corner is sufficiently greater than that of the outer diameter of the blade 222. As for the method for forming the opening 132 of the light-emitting device 150 illustrated in FIG. 20A, the method for manufacturing the circuit board 10B described in Embodiment 1 can be referred to.

[Formation of External Electrode 124]

Note that the anisotropic conductive connection layer 123 is formed in and on the opening 132, and the external electrode 124 for inputting electric power or a signal to the light-emitting device 100 is formed over the anisotropic conductive connection layer 123 (see FIGS. 11A and 11B). The external electrode 124 and the terminal electrode 116 are electrically connected to each other through the anisotropic conductive connection layer 123. Thus, electric power or a signal can be input to the light-emitting device 100. For example, an FPC can be used as the external electrode 124. A metal wire can also be used as the external electrode 124. Although the anisotropic conductive connection layer 123 may be used to connect the metal wire and the terminal electrode 116 to each other, the connection can be made by a wire bonding method without using the anisotropic conductive connection layer 123. Alternatively, the metal wire and the terminal electrode 116 can be connected to each other by a soldering method. Note that in this example for a manufacturing method, the opening 132 is filled with the anisotropic conductive connection layer 123 without any space; however, one embodiment of the present invention is not limited to this. Part of the opening 132 may have a space as long as the anisotropic conductive connection layer 123 is provided at least in a region between the terminal electrode 116 and a terminal of the external electrode 124 to be electrically connected to the terminal electrode 116.

The light-emitting device or a display device of one embodiment of the present invention can employ various modes and can include various display elements. Examples of the display element include at least one of an electroluminescence (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), a plasma display panel (PDP), an electron emitting element, a liquid crystal element, an electrophoretic element, a display element using micro electro mechanical systems (MEMS) such as a grating light valve (GLV), a digital micromirror device (DMD), a digital micro shutter (DMS) element, a MIRASOL (registered trademark) display, an interferometric modulation (IMOD) element, and a piezoelectric ceramic display, and an electrowetting element. Other than the above, the display device may contain a display medium whose contrast, luminance, reflectance, transmittance, or the like is changed by electrical or magnetic action. As the display element, quantum dots may also be used. Examples of a light-emitting device having EL elements include an EL display. Examples of a display device including an electron emitter include a field emission display (FED) and an SED-type flat panel display (SED: surface-conduction electron-emitter display). An example of a display device including quantum dots is a quantum dot display. Examples of a display device including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

For example, in this specification and the like, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

Note that as a method other than an active matrix method, a passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

Note that an example of the case where a variety of display is performed using the light-emitting device is shown here; however, one embodiment of the present invention is not limited thereto. For example, data is not necessarily displayed. As an example, the light-emitting device may be used as a lighting device. By using the device as a lighting device, it can be used as interior lighting having an attractive design. Alternatively, it can be used as lighting with which various directions can be illuminated. Further alternatively, it may be used as a light source, e.g., a backlight or a front light, not the light-emitting device. In other words, it may be used as a lighting device for the light-emitting device.

This embodiment can be combined with any other embodiment as appropriate.

Embodiment 3

Figure 21A:
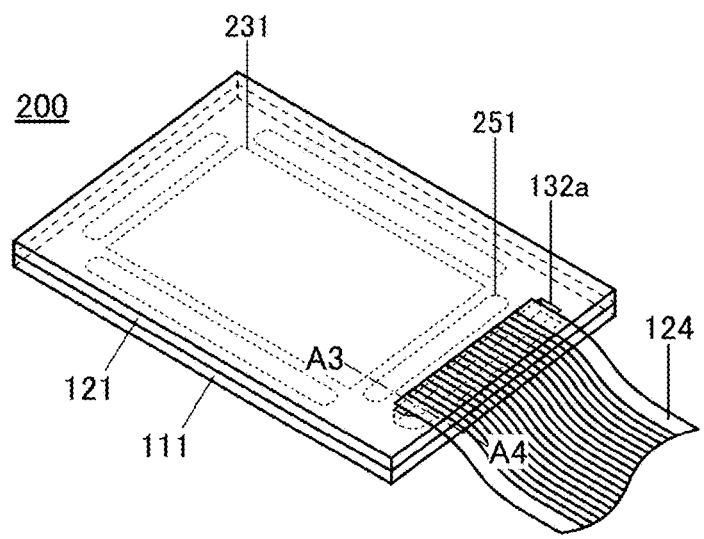
FIGS. 21A and 21B illustrate a structure example of a light-emitting device of an embodiment.
Figure 21B:
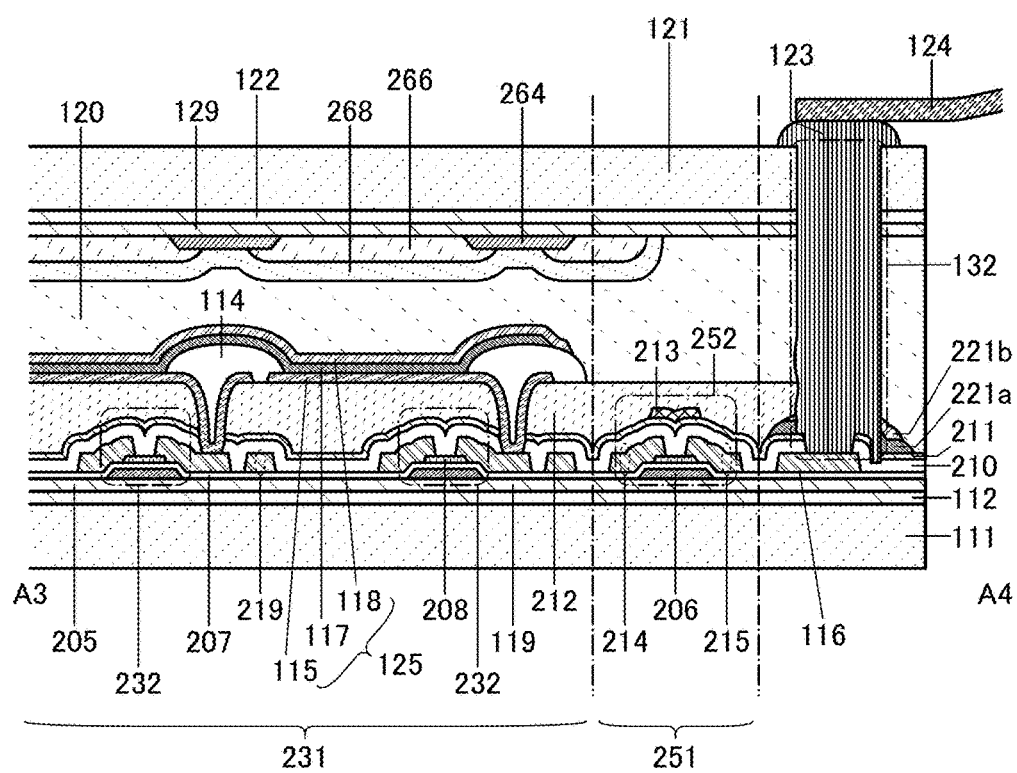

In this embodiment, a light-emitting device 200 having a structure different from the structure of the light-emitting device 100 described in the above embodiment is described with reference to FIGS. 21A and 21B, FIGS. 22A and 23B, FIGS. 23A and 23B, and FIG. 24. FIG. 21A is a perspective view of the light-emitting device 200, and FIG. 21B is a cross-sectional view taken along the dashed-dotted line A3-A4 in FIG. 21A.

[Structure of Light-Emitting Device]

The light-emitting device 200 described in this embodiment includes a display region 231 and a peripheral circuit 251. The light-emitting device 200 further includes the terminal electrode 116 and the light-emitting element 125 including the electrode 115, the EL layer 117, and the electrode 118. A plurality of light-emitting elements 125 are formed in the display region 231. A transistor 232 for controlling the amount of light emitted from the light-emitting element 125 is connected to each the light-emitting element 125.

The terminal electrode 116 is electrically connected to the external electrode 124 through the anisotropic conductive connection layer 123 formed in the opening 132. In addition, the terminal electrode 116 is electrically connected to the peripheral circuit 251.

Figure 22A:
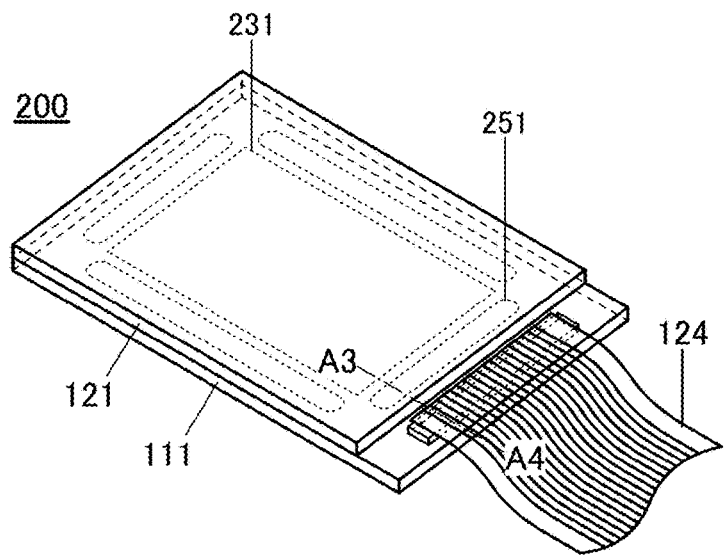
FIGS. 22A and 22B illustrate a structure example of a light-emitting device of an embodiment.
Figure 22B:
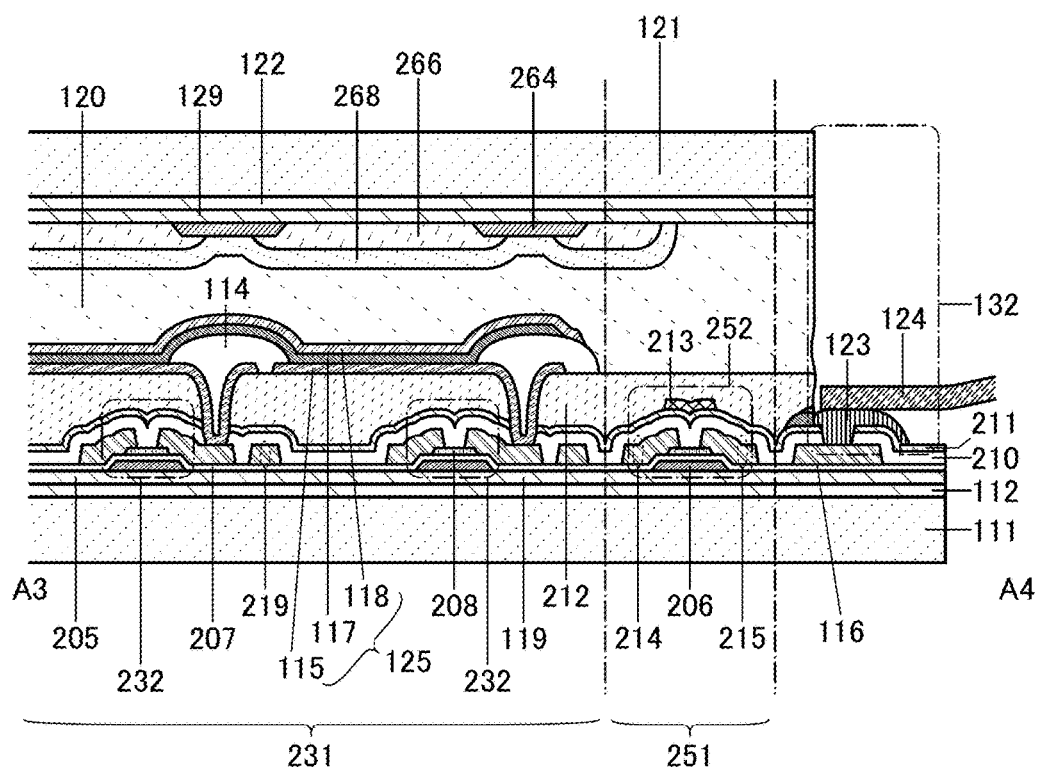

The opening 132 is formed using the method described in Embodiment 2; thus, part of the separation layer 221 (the first layer 221a and the second layer 221b) that is formed before formation of the opening 132 remains over the insulating layer 211 in some cases. In the light-emitting device 200, the outline 132a of the opening 132 is a rectangle having at least one round corner when seen from the top. With such a structure, in the case where the light-emitting device 200 is flexible, in some cases, a crack can be prevented from being generated from part of the opening 132 when a portion near the opening 132 is curved in transportation or use of the light-emitting device 200. Alternatively, the opening 132 of the light-emitting device 200 may be formed as illustrated in FIGS. 22A and 22B. As for the method for forming the opening 132 illustrated in FIGS. 22A and 22B, the method for manufacturing the circuit board 10C in Embodiment 1 can be referred to.

The peripheral circuit 251 includes a plurality of transistors 252. The peripheral circuit 251 has a function of determining which of the light-emitting elements 125 in the display region 231 is supplied with a signal from the external electrode 124.

In the light-emitting device 200 illustrated in FIGS. 21A and 21B, the substrate 111 and the substrate 121 are attached to each other with the bonding layer 120 provided therebetween. An insulating layer 205 is formed over the substrate 111 with the bonding layer 112 provided therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

The insulating layer 205 functions as a base layer and can prevent or reduce diffusion of impurity elements from the substrate 111, the bonding layer 112, or the like to the transistor or the light-emitting element.

The transistor 232, the transistor 252, the terminal electrode 116, and a wiring 219 are formed over the insulating layer 205. Although a channel-etched transistor that is a type of bottom-gate transistor is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor layer in which a channel is formed is provided between two gate electrodes. Furthermore, the transistor is not limited to a transistor having a single-gate structure; a multi-gate transistor having a plurality of channel formation regions, such as a double-gate transistor may be used.

As the transistor 232 and/or the transistor 252, a transistor with any of a variety of structures such as a planar type, a FIN-type, and a Tri-Gate type can be used.

The transistor 232 and the transistor 252 may have the same structure or different structures. However, the size (e.g., channel length and channel width) or the like of each transistor can be adjusted as appropriate.

The transistor 232 and the transistor 252 each include an electrode 206 that can function as a gate electrode, an insulating layer 207 that can function as a gate insulating layer, a semiconductor layer 208, an electrode 214 that can function as one of a source electrode and a drain electrode, and an electrode 215 that can function as the other of the source electrode and the drain electrode.

The wiring 219, the electrode 214, and the electrode 215 can be formed at the same time as the terminal electrode 116 using part of the conductive layers for forming the terminal electrode 116. The insulating layer 207 can be formed using a material and a method similar to those of the insulating layer 205.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used. In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, it is possible to realize an extremely low off-state current (current flowing between a source and drain in an off state of a transistor). For example, the off-state current per 1 μm of a channel width can be less than or equal to 100 zA ($1\times10^{-19}$ A), less than or equal to 10 zA ($1\times10^{-20}$ A), and further less than or equal to 1 zA ($1\times10^{-21}$ A) when the source-drain voltage is 3.5 V at 25° C. Therefore, a light-emitting device with low power consumption can be achieved.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

An insulating layer 210 is formed over the transistor 232 and the transistor 252, and an insulating layer 211 is formed over the insulating layer 210. The insulating layers 210 and 211 each function as a protective insulating layer and can prevent or reduce diffusion of impurity elements from a layer above the insulating layer 210 to the transistor 232 and the transistor 252. The insulating layers 210 and 211 can be formed using a material and a method similar to those of the insulating layer 205.

An interlayer insulating layer 212 is formed over the insulating layer 211. The interlayer insulating layer 212 can absorb the unevenness caused by the transistor 232 and the transistor 252. Planarization treatment may be performed on the surface of the interlayer insulating layer 212. The planarization treatment may be, but not particularly limited to, polishing treatment (e.g., chemical mechanical polishing (CMP)) or dry etching treatment.

Forming the interlayer insulating layer 212 using an insulating material with a planarization function can omit polishing treatment. As the insulating material with a planarization function, for example, an organic material such as a polyimide resin or an acrylic resin can be used. Other than the above-described organic materials, it is also possible to use a low-dielectric constant material (low-k material) or the like. Note that the interlayer insulating layer 212 may be formed by stacking a plurality of insulating layers formed of these materials.

Over the interlayer insulating layer 212, the light-emitting element 125 and the partition 114 for separating the adjacent light-emitting elements 125 are formed.

The substrate 121 is provided with the light-blocking layer 264, the coloring layer 266, and the overcoat layer 268. The light-emitting device 200 is what is called a top-emission light-emitting device, in which light emitted from the light-emitting element 125 is extracted from the substrate 121 side through the coloring layer 266.

The light-emitting element 125 is electrically connected to the transistor 232 through an opening formed in the interlayer insulating layer 212, the insulating layer 211, and the insulating layer 210.

With a micro optical resonator (also referred to as microcavity) structure that allows light emitted from the EL layer 117 to resonate, lights with different wavelengths and narrowed spectra can be extracted even when one EL layer 117 is used for different light-emitting elements 125.

FIGS. 23A and 23B are cross-sectional views of the light-emitting device 200 in which the light-emitting element 125 has a microcavity structure, for example. Note that FIG. 23A corresponds to a cross-sectional view taken along the vicinity of the dashed-dotted line A3-A4 in FIG. 21A. FIG. 23B is an enlarged view of a portion 280 in FIG. 23A.

In the case where the light-emitting element 125 has a microcavity structure, the electrode 118 is formed using a conductive material (a semi-transmissive material) that transmits and reflect a certain amount of light of the incident light, and the electrode 115 is formed using a stack of a conductive material having high reflectance (the reflectance of visible light is 50% or more and 100% or less, preferably 70% or more and 100% or less) and a conductive material having high transmittance (the transmittance of visible light is 50% or more and 100% or less, preferably 70% or more and 100% or less). Here, the electrode 115 is formed of a stack of an electrode 115a formed using a conductive material that reflects light and an electrode 115b formed using a conductive material that transmits light. The electrode 115b is provided between the EL layer 117 and the electrode 115a (see FIG. 23B). The electrode 118 can function as a semi-reflective electrode. The electrode 115a can function as a reflective electrode.

For example, the electrode 118 may be formed using a conductive material containing silver (Ag) or a conductive material containing aluminum (Al) having a thickness of 1 nm to 30 nm, preferably 1 nm to 15 nm. In this embodiment, as the electrode 118, a 10-nm-thick conductive material containing silver and magnesium is used.

The electrode 115a may be formed using a conductive material containing silver (Ag) or a conductive material containing aluminum (Al) having a thickness of 50 nm to 500 nm, preferably 50 nm to 200 nm. In this embodiment, the electrode 115a is formed using a 100-nm-thick conductive material containing silver.

For the electrode 115b, a conductive oxide containing indium (In) or a conductive oxide containing zinc (Zn) having a thickness of 1 nm to 200 nm, preferably 5 nm to 100 nm, may be used. In this embodiment, ITO is used for the electrode 115b. Furthermore, a conductive oxide may be provided under the electrode 115a.

By changing the thickness t of the electrode 115b, a distance d from the interface between the electrode 118 and the EL layer 117 to the interface between the electrode 115a and the electrode 115b can be set to an arbitral value. The light-emitting elements 125 having different emission spectra for respective pixels can be provided even when one EL layer 117 is used by changing the thickness t of the electrode 115b in each pixel. Thus, color purity of each emission color is improved and a light-emitting device having favorable color reproducibility can be achieved. It is not necessary to independently form the EL layer 117 in each pixel depending on the emission color; therefore, the number of manufacturing steps of the light-emitting device can be reduced and thus the productivity can be improved. Furthermore, a high-definition light-emitting device can be achieved easily.

Note that a method for adjusting the distance d is not limited to the above method. For example, the distance d may be adjusted by changing the film thickness of the EL layer 117.

FIG. 23A shows an example in which the pixel 130R, the pixel 130G, the pixel 130B, and the pixel 130Y that emit red light 151R, green light 151G, blue light 151B, and yellow light 151Y, respectively, are used as one pixel 140. Note that one embodiment of the present invention is not limited to this example. As the pixel 140, subpixels that emit lights of red, green, blue, yellow, cyan, magenta, white, and the like may be combined as appropriate. For example, the pixel 140 may be formed of the following three subpixels: the pixel 130R, the pixel 130G, and the pixel 130B.

Figure 24:
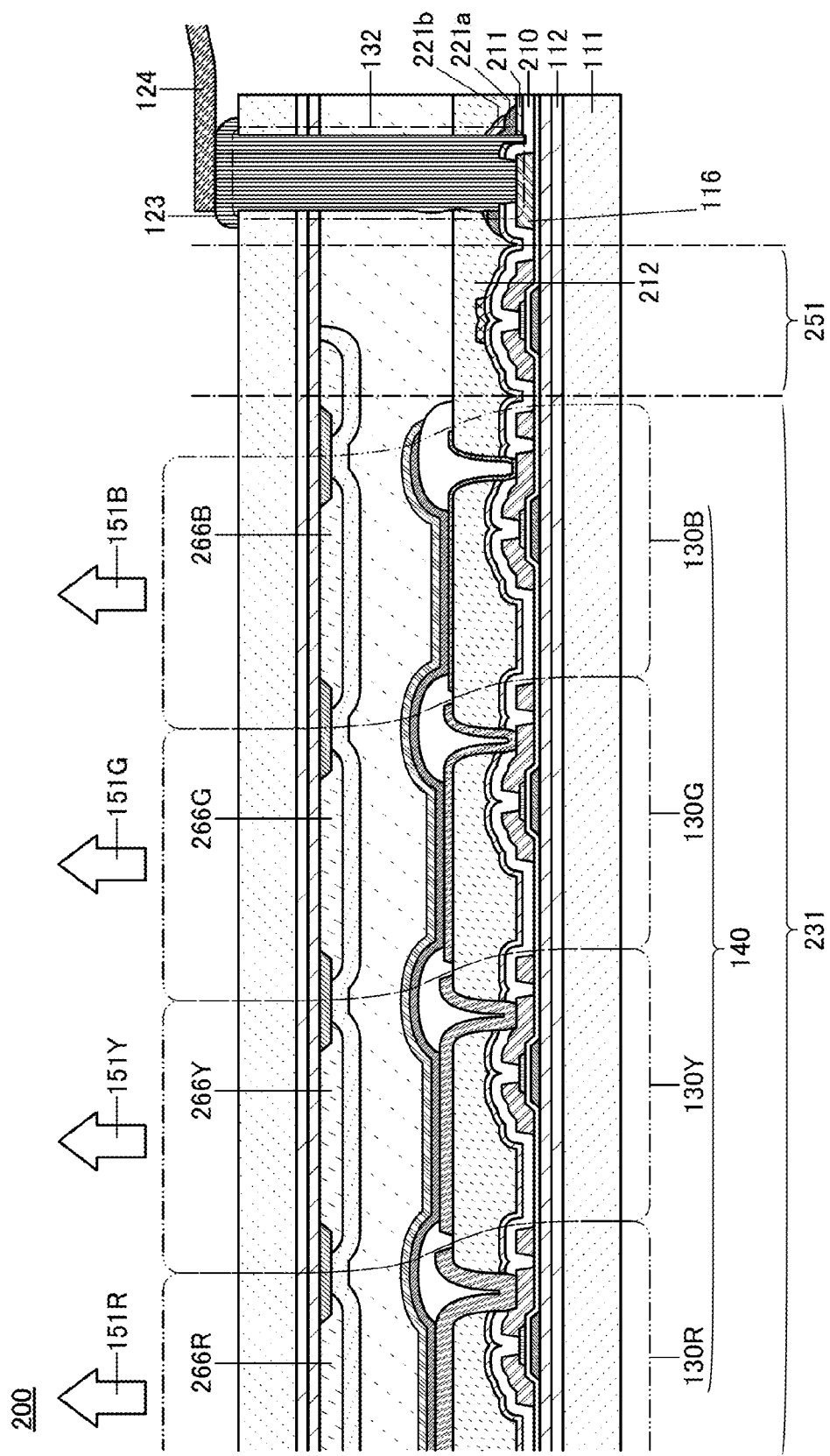
FIG. 24 illustrates a structure example of a light-emitting device of an embodiment.

The coloring layer 266 may be provided in a position overlapping with the light-emitting element 125 so that the light 151 is emitted outside through the coloring layer 266. FIG. 24 shows a structure example in the case where the coloring layer 266 is combined with the light-emitting device 200 illustrated in FIGS. 23A and 23B. In the light-emitting device 200 illustrated in FIG. 24, a coloring layer 266R, a coloring layer 266G, a coloring layer 266B, and a coloring layer 266Y that transmit light in a red wavelength band, light in a green wavelength band, light in a blue wavelength band, and light in a yellow wavelength band, respectively, are provided so as to overlap with the pixel 130R that emits the red light 151R, the pixel 130G that can emit the green light 151G, the pixel 130B that can emit the blue light 151B, and the pixel 130Y that can emit the yellow light 151Y, respectively.

By using the pixel 130Y in addition to the pixel 130R, the pixel 130G, and the pixel 130B, the color reproducibility of the light-emitting device can be increased. In the case where the pixel 140 is formed of only the pixel 130R, the pixel 130G, and the pixel 130B, all of the pixels 130R, 130G, and 130B need to emit light when white light is emitted from the pixel 140. When the pixel 130Y is provided in addition to the pixel 130R, the pixel 130G, and the pixel 130B, white light can be obtained by emitting light only from the pixel 130B and the pixel 130Y. Thus, since white light can be obtained even without light emission from the pixel 130R and the pixel 130G, power consumption of the light-emitting device can be reduced.

Moreover, the pixel 130W that can emit white light 151W may be used instead of the pixel 130Y. The use of the pixel 130W instead of the pixel 130Y allows emission of white light by emitting light only from the pixel 130W; therefore, power consumption of the light-emitting device can be further reduced.

Note that in the case of using the pixel 130W, a coloring layer is not necessarily provided in the pixel 130W. Without a coloring layer, the luminance of the display region is improved and a light-emitting device having favorable visibility can be achieved. Moreover, power consumption of the light-emitting device can be further reduced.

The pixel 130W may be provided with a coloring layer 266W that transmits light of substantially whole of the visible region. Accordingly, the color temperature of the white light 151W can be changed. Accordingly, a light-emitting device having a high display quality can be achieved.

The color purity of the light 151 can be further improved by using the light-emitting element 125 having a microcavity structure and the coloring layer 266 in combination. Therefore, the color reproducibility of the light-emitting device 200 can be improved. In addition, light that enters from the outside is mostly absorbed by the coloring layer 266; therefore, reflection of the light that enters from the outside on the display region 231 is suppressed and thus the visibility of the light-emitting device can be improved. Accordingly, a light-emitting device having a high display quality can be achieved.

Although an active matrix light-emitting device is described as an example of the light-emitting device in this embodiment, one embodiment of the present invention can also be applied to a passive matrix light-emitting device. Moreover, one embodiment of the present invention can also be applied to a light-emitting device having a bottom-emission structure or a dual-emission structure.

This embodiment can be implemented in combination with any of the structures described in the other embodiments as appropriate.

Embodiment 4

In this embodiment, structure examples of a light-emitting element that can be used as the light-emitting element 125 are described. Note that an EL layer 620 described in this embodiment corresponds to the EL layer 117 described in the other embodiments.

[Structure of Light-Emitting Element]

Figure 25A:
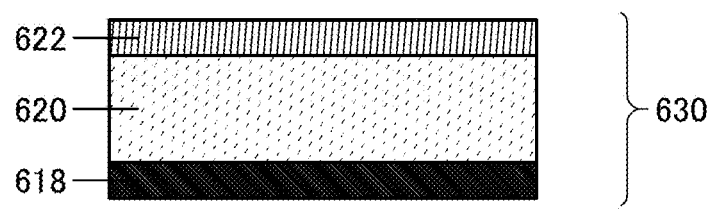
FIGS. 25A and 25B illustrate structure examples of a light-emitting element of an embodiment.

In a light-emitting element 630 illustrated in FIG. 25A, the EL layer 620 is sandwiched between a pair of electrodes (electrodes 618 and 622). Note that the electrode 618 is used as an anode and the electrode 622 is used as a cathode as an example in the following description of this embodiment.

The EL layer 620 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 630 illustrated in FIG. 25A emits light when current flows by applying a potential difference between the electrode 618 and the electrode 622 and holes and electrons are recombined in the EL layer 620. In other words, a light-emitting region is formed in the EL layer 620.

In one embodiment of the present invention, light emitted from the light-emitting element 630 is extracted to the outside from the electrode 618 side or the electrode 622 side. Thus, one of the electrodes 618 and 622 is formed using a light-transmitting substance.

Figure 25B:
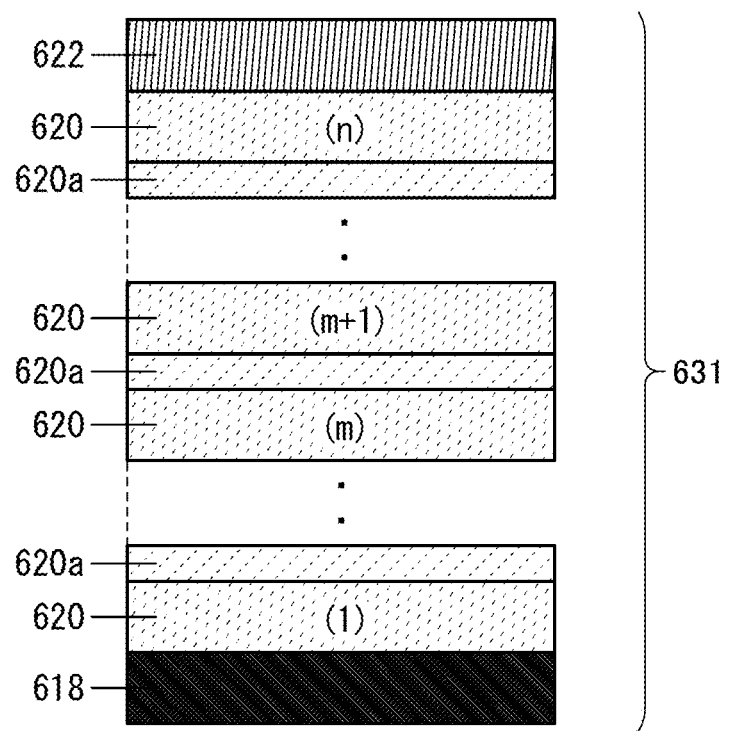

Note that a plurality of EL layers 620 may be stacked between the electrode 618 and the electrode 622 as in a light-emitting element 631 illustrated in FIG. 25B. In the case where n (n is a natural number of 2 or more) layers are stacked, an electric charge generation layer 620a is preferably provided between an m-th EL layer 620 and an (m+1)th EL layer 620. Note that m is a natural number greater than or equal to 1 and less than n. The components other than the electrode 618 and the electrode 622 correspond to the EL layer 117 of the aforementioned embodiments.

The electric charge generation layer 620a can be formed using a composite material of an organic compound and a metal oxide. Examples of the metal oxide include vanadium oxide, molybdenum oxide, and tungsten oxide. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 620a have excellent carrier-injection properties and carrier-transport properties; thus, the light-emitting element 630 can be driven with low current and with low voltage. Other than the composite material, a material obtained by adding an alkali metal, an alkaline earth metal, a compound of the alkali metal, a compound of the alkaline earth metal, or the like to the composite material can be used for the electric charge generation layer 620a.

Note that the electric charge generation layer 620a may be formed by a combination of a composite material of an organic compound and a metal oxide with another material. For example, the electric charge generation layer 620a may be formed by a combination of a layer containing the composite material of an organic compound and a metal oxide with a layer containing one compound selected from electron-donating substances and a compound having a high electron-transport property. Furthermore, the electric charge generation layer 620a may be formed by a combination of a layer containing the composite material of an organic compound and a metal oxide with a transparent conductive film.

The light-emitting element 631 having such a structure is unlikely to result in energy transfer between the adjacent EL layers 620 and can easily realize high emission efficiency and a long lifetime. Furthermore, it is easy to obtain phosphorescence from one light-emitting layer and fluorescence from the other light-emitting layer.

The electric charge generation layer 620a has a function of injecting holes to one of the EL layers 620 that is in contact with the electric charge generation layer 620a and a function of injecting electrons to the other EL layer 620 that is in contact with the electric charge generation layer 620a, when voltage is applied to the electrodes 618 and 622.

The light-emitting element 631 illustrated in FIG. 25B can provide a variety of emission colors by changing the type of the light-emitting substance used for the EL layers 620. In addition, a plurality of light-emitting substances having different emission colors may be used as the light-emitting substances, so that light emission having a broad spectrum or white light emission can be obtained.

In the case of obtaining white light emission using the light-emitting element 631 in FIG. 25B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL emitting blue light. Further alternatively, with a structure including EL layers emitting light of complementary colors, white light emission can be obtained. In a stacked-layer element including two EL layers that emit lights with complementary colors, the combinations of colors are as follows: blue and yellow, blue-green and red, and the like.

Note that in the structure of the above stacked-layer element, by providing the electric charge generation layer between the stacked light-emitting layers, the element can exhibit light emission with high luminance at a low current density, and have a long lifetime.

This embodiment can be implemented in combination with any of the structures described in the other embodiments as appropriate.

Embodiment 5

In this embodiment, an example of a transistor that can be used instead of the transistor 232 and/or the transistor 252 described in the above embodiments is described with reference to FIGS. 26A1, 26A2, 26B1, 26B2, 26C1, and 26C2, FIGS. 27 A1, 27A2, 27A3, 27B1, and 27B2, FIGS. 28A to 28C, and FIGS. 29A to 29C.

[Bottom-Gate Transistor]

A transistor 400 illustrated in FIG. 26A1 is a channel-etched transistor that is a type of bottom-gate transistor. The transistor 400 is provided over a substrate 216 with an insulating layer 119 positioned therebetween. The transistor 400 includes an electrode 206, an insulating layer 207 over the electrode 206, a semiconductor layer 208 over the insulating layer 207, and an electrode 214 and an electrode 215 that are in contact with part of the semiconductor layer 208. The electrode 206 can function as a gate electrode. The insulating layer 207 can function as a gate insulating layer. One of the electrodes 214 and 215 can function as a source electrode and the other can function as a drain electrode. An insulating layer 210 and an insulating layer 211 are formed to cover the semiconductor layer 208, the electrode 214, and the electrode 215.

The substrate 216 can be formed using a material similar to that for the substrate 111 described in Embodiment 2. Particularly, the organic resin material has a specific gravity smaller than that of the glass material or the metal material. Thus, when an organic resin material is used for the substrate 216, the weight of the light-emitting device can be reduced.

The substrate 216 is preferably formed using a material with high toughness. In that case, a light-emitting device with high impact resistance that is less likely to be broken can be provided. The organic resin material and the metal material have higher toughness than the glass material in many cases. When the organic resin material or the metal material is used as the substrate 216, a light-emitting device that is less likely to be broken can be provided as compared with the case of using the glass material.

The metal material has higher thermal conductivity than the organic resin material or the glass material and thus can easily conduct heat to the whole substrate. Accordingly, a local temperature rise in the light-emitting device can be suppressed.

The insulating layer 119 can be formed using a material similar to that described in Embodiment 2. The insulating layers 207, 210, and 211 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layers 119, 207, 210, and 211 can be formed by a sputtering method, a CVD method, a thermal oxidation method, a coating method, a printing method, or the like. Note that in the case where an organic semiconductor is used for the semiconductor layer 208, an organic material such as polyimide or an acrylic resin may be used for the insulating layer 207.

For a conductive material for forming the electrode 206, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor having a high electric conductivity typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The electrodes 206, 214, and 215 can also be formed using a conductive material containing oxygen, such as ITO, indium oxide containing tungsten oxide, indium zinc oxide containing tungsten oxide, indium oxide containing titanium oxide, ITO containing titanium oxide, indium zinc oxide, or ITO to which silicon oxide is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The electrodes 206, 214, and 215 may be formed with a conductive high molecular material (also referred to as conductive high molecular polymer). As the conductive high molecular material, a π electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be used.

The electrodes 206, 214, and 215 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, a layer, an alloy layer, or a nitride layer that contains aluminum and one or more elements selected from titanium, tantalum, tungsten, molybdenum, chromium, neodymium, and scandium may be used.

The semiconductor layer 208 can be formed using a material similar to that described in Embodiment 3.

A transistor 401 illustrated in FIG. 26A2 is different from the transistor 400 in that an electrode 213 that can function as a back gate electrode is provided over the insulating layer 211. The electrode 213 can be formed using a material and a method that are similar to those of the electrode 206. The electrode 213 may be formed between the insulating layers 210 and 211.

In general, the back gate electrode is formed using a conductive layer and positioned so that the channel formation region of the semiconductor layer is provided between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrodes 206 and 213 can both function as a gate electrode. Thus, the insulating layers 207, 210, and 211 can all function as a gate insulating layer.

In the case where one of the electrode 206 and the electrode 213 is simply referred to as a "gate electrode", the other can be referred to as a "back gate electrode". For example, in the transistor 401, in the case where the electrode 213 is referred to as a "gate electrode", the electrode 206 is referred to as a "back gate electrode". In the case where the electrode 213 is used as a "gate electrode", the transistor 401 is a kind of top-gate transistor. Furthermore, one of the electrode 206 and the electrode 213 may be referred to as a "first gate electrode", and the other may be referred to as a "second gate electrode".

By providing the electrode 206 and the electrode 213 with the semiconductor layer 208 provided therebetween and setting the potentials of the electrode 206 and the electrode 213 to be the same, a region of the semiconductor layer 208 through which carriers flow is enlarged in the film thickness direction; thus, the number of transferred carriers is increased. As a result, the on-state current and the field-effect mobility of the transistor 401 are increased.

Therefore, the transistor 401 has large on-state current for the area occupied thereby. That is, the area occupied by the transistor 401 can be small for required on-state current.

Furthermore, the gate electrode and the back gate electrode are formed using conductive layers and thus each have a function of preventing an electric field generated outside the transistor from influencing the semiconductor layer in which the channel is formed (in particular, a function of blocking static electricity).

Since the electrode 206 and the electrode 213 each have a function of blocking an electric field generated outside, charges of charged particles and the like generated on the substrate 216 side or above the electrode 213 do not influence the channel formation region in the semiconductor layer 208. Therefore, degradation in a stress test (e.g., a negative gate bias temperature (−GBT) stress test in which negative charges are applied to a gate) can be reduced, and changes in the threshold voltage can be suppressed. Note that this effect is caused when the same potential or different potentials are supplied to the electrodes 206 and 213.

The BT stress test is one kind of accelerated test and can evaluate, in a short time, a change by long-term use (i.e., a change over time) in characteristics of transistors. In particular, the change in threshold voltage of the transistor between before and after the BT stress test is an important indicator when examining the reliability of the transistor. If the change in the threshold voltage between before and after the BT stress test is small, the transistor has higher reliability.

By providing the electrode 206 and the electrode 213 and setting the potentials of the electrode 206 and the electrode 213 to be the same, the change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

A transistor 410 shown in FIG. 26B1 as an example is a channel-protective transistor that is a type of bottom-gate transistor. The transistor 410 includes an insulating layer 209 that can function as a channel protective layer over a channel formation region in the semiconductor layer 208. The insulating layer 209 can be formed using a material and a method that are similar to those of the insulating layer 207. Part of the electrode 214 and part of the electrode 215 are formed over the insulating layer 209.

With the insulating layer 209 provided over the channel formation region, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

A transistor 411 illustrated in FIG. 26B2 is different from the transistor 410 in that an electrode 213 that can function as a back gate electrode is provided over the insulating layer 211. The electrode 213 can be formed using a material and a method that are similar to those of the electrode 206. The electrode 213 may be formed between the insulating layers 210 and 211.

A transistor 420 shown in FIG. 26C1 as an example is a channel-protective transistor that is a type of bottom-gate transistor. The transistor 420 has substantially the same structure as the transistor 410 but is different from the transistor 410 in that the insulating layer 209 covers the side surfaces of the semiconductor layer 208. The semiconductor layer 208 is electrically connected to the electrode 214 in an opening that is formed by selectively removing part of the insulating layer 209. The semiconductor layer 208 is electrically connected to the electrode 215 in the opening that is formed by selectively removing part of the insulating layer 209. A region of the insulating layer 209 that overlaps with the channel formation region can function as a channel protective layer.

A transistor 421 illustrated in FIG. 26C2 is different from the transistor 420 in that the electrode 213 that can function as a back gate electrode is provided over the insulating layer 211.

With the insulating layer 209, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

The length between the electrode 214 and the electrode 206 and the length between the electrode 215 and the electrode 206 in the transistors 420 and 421 are longer than those in the transistors 410 and 411. Thus, the parasitic capacitance generated between the electrode 214 and the electrode 206 can be reduced. Moreover, the parasitic capacitance generated between the electrode 215 and the electrode 206 can be reduced.

[Top-Gate Transistor]

A transistor 430 shown in FIG. 27A1 as an example and a transistor 431 shown in FIG. 27A2 as an example are each a type of top-gate transistor. The transistor 430 includes the semiconductor layer 208 over the insulating layer 119; the electrode 214 in contact with part of the semiconductor layer 208 and the electrode 215 in contact with part of the semiconductor layer 208, over the semiconductor layer 208 and the insulating layer 119; the insulating layer 207 over the semiconductor layer 208, the electrode 214 and the electrode 215; and the electrode 206 over the insulating layer 207. The insulating layers 210 and 211 are formed over the electrode 206.

Since, in the transistor 430, the electrode 206 overlaps with neither the electrode 214 nor the electrode 215, the parasitic capacitance generated between the electrode 206 and the electrode 214 and the parasitic capacitance generated between the electrode 206 and the electrode 215 can be reduced. After the formation of the electrode 206, an impurity element 225 is introduced into the semiconductor layer 208 using the electrode 206 as a mask, so that an impurity region can be formed in the semiconductor layer 208 in a self-aligned manner (see FIG. 27A3).

The introduction of the impurity element 225 can be performed with an ion implantation apparatus, an ion doping apparatus, or a plasma treatment apparatus. As the ion doping apparatus, an ion doping apparatus with a mass separation function may be used.

As the impurity element 225, for example, at least one element of a Group 13 element and a Group 15 element can be used. In the case where an oxide semiconductor is used for the semiconductor layer 208, it is possible to use at least one kind of element of a rare gas, hydrogen, and nitrogen as the impurity element 225.

A transistor 431 illustrated in FIG. 27A2 is different from the transistor 430 in that the electrode 213 and an insulating layer 217 are included. The transistor 431 includes the electrode 213 formed over the insulating layer 119 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 401 has large on-state current for the area occupied thereby. That is, the area occupied by the transistor 431 can be small for required on-state current.

A transistor 440 shown in FIG. 27B 1 as an example and a transistor 441 shown in FIG. 27B2 as an example are each a type of top-gate transistor. The transistors 440 and 441 are different from the transistors 430 and 431, respectively, in that the semiconductor layer 208 is formed after the formation of the electrode 214 and the electrode 215. A transistor 441 shown in FIG. 27B2 as an example is different from the transistor 440 in that it includes the electrode 213 and the insulating layer 217. Thus, in the transistors 440 and 441, part of the semiconductor layer 208 is formed over the electrode 214 and another part of the semiconductor layer 208 is formed over the electrode 215.

The transistor 441 as well as the transistor 401 has large on-state current for the area occupied thereby. That is, the area occupied by the transistor 441 can be small for required on-state current. Therefore, a semiconductor device having a high degree of integration can be provided.

In the transistors 440 and 441, after the formation of the electrode 206, the impurity element 225 is introduced into the semiconductor layer 208 using the electrode 206 as a mask, so that an impurity region can be formed in the semiconductor layer 208 in a self-aligned manner.

[S-Channel Transistor]

FIG. 28A is a top view of a transistor 450. FIG. 28B is a cross-sectional view (in the channel length direction) taken along the dashed-dotted line X1-X2 in FIG. 28A. FIG. 28C is a cross-sectional view (in the channel width direction) taken along the dashed-dotted line Y1-Y2 in FIG. 28A.

A semiconductor layer 208 is provided over a projecting portion of the insulating layer 119, in which case the electrode 206 can cover a side surface of the semiconductor layer 208. That is, the transistor 450 has a structure in which the semiconductor layer 208 is electrically surrounded by an electric field of the electrode 206. Such a structure of a transistor in which a semiconductor is electrically surrounded by an electric field of a conductive film is referred to as a surrounded channel (s-channel) structure. A transistor having an s-channel structure is referred to as an s-channel transistor.

In the s-channel transistor, a channel is formed in the whole (bulk) of the semiconductor layer 208 in some cases. In the s-channel transistor, the drain current of the transistor can be increased, so that a larger amount of on-state current can be obtained. Therefore, the area occupied by the transistor can be reduced, which leads to high definition of a light-emitting device and high integration of a semiconductor device.

Furthermore, the entire channel formation region of the semiconductor layer 208 can be depleted by the electric field of the electrode 206. Accordingly, the off-state current of the s-channel transistor can be further reduced. Therefore, power consumption of a light-emitting device and a semiconductor device can be reduced.

When the projecting portion of the insulating layer 119 is increased in height, and the channel width is shortened, the effects of the s-channel structure to increase the on-state current and reduce the off-state current can be enhanced.

Figure 29A:
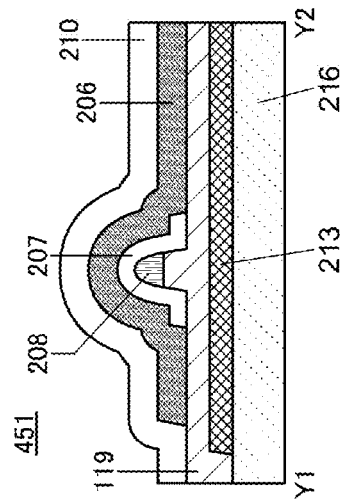
FIGS. 29A to 29C are a plan view and cross-sectional views illustrating one embodiment of a transistor.
Figure 29B:
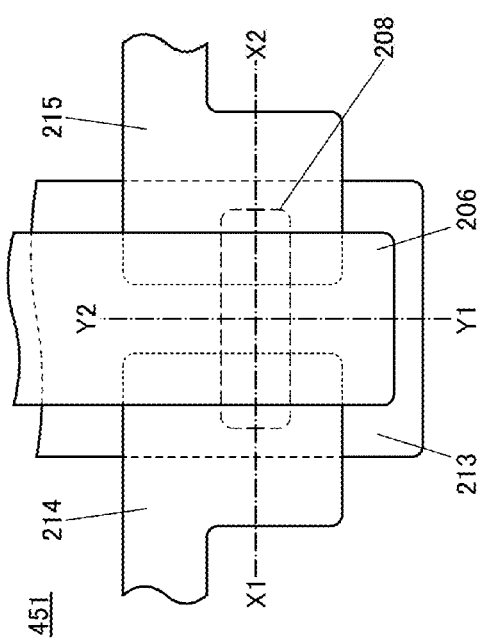
Figure 29C:
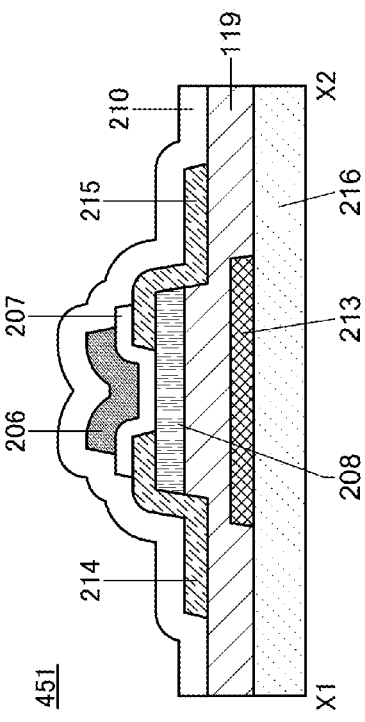

As in a transistor 451 illustrated in FIGS. 29A to 29C, the electrode 213 may be provided under the semiconductor layer 208 with an insulating layer positioned therebetween. FIG. 29A is a top view of a transistor 451. FIG. 29B is a cross-sectional view taken along the dashed-dotted line X1-X2 in FIG. 29A. FIG. 29C is a cross-sectional view taken along the dashed-dotted line Y1-Y2 in FIG. 29A.

<Structure of Oxide Semiconductor>

Here, a structure of an oxide semiconductor is described.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 30A:
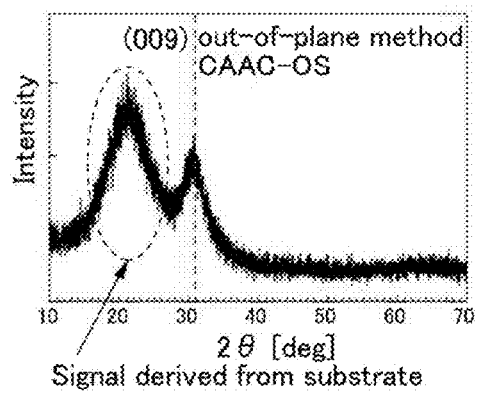
FIGS. 30A to 30E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 30A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 30B:
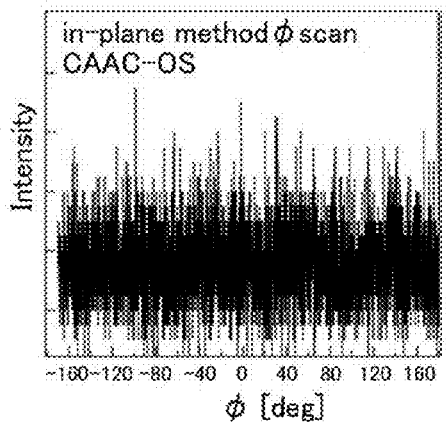
Figure 30C:
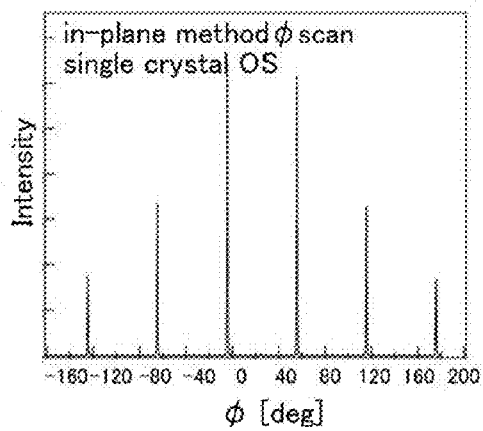

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 30B, a peak is not clearly observed. In contrast, in the case where single crystal $InGaZnO_4$ is subjected to φ scan with 2θ fixed at around 56°, as shown in FIG. 30C, six peaks that are derived from crystal planes equivalent to the (110) plane are observed. Accordingly, the structural analysis using XRD shows that the directions of a-axes and b-axes are irregularly oriented in the CAAC-OS.

Figure 30D:
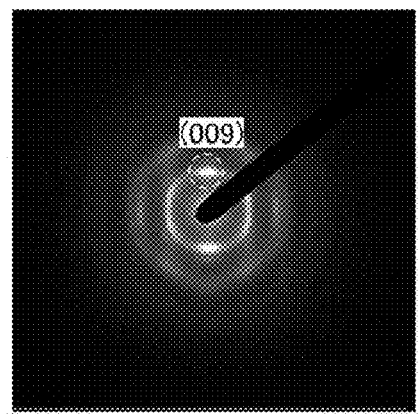

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 30D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 30E shows a diffraction pattern obtained in such a manner that an electron beam with a probe diameter of 300 nm is incident on the same sample in a direction perpendicular to the sample surface.

Figure 30E:
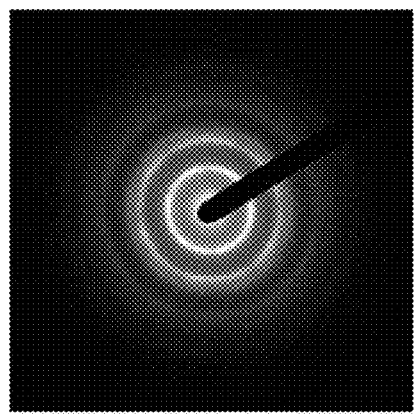

As shown in FIG. 30E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 30E is considered to be derived from the (010) plane, the (100) plane, and the like of the $InGaZnO_4$ crystal. The second ring in FIG. 30E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 31A:
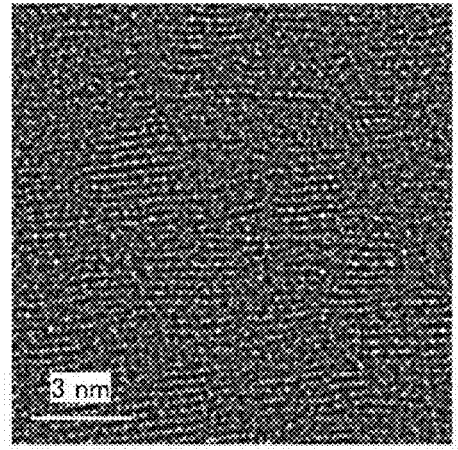
FIGS. 31A to 31E show a cross-sectional TEM image and plan-view TEM images of a CAAC-OS and images obtained through analysis thereof.

FIG. 31A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 31A shows pellets in which metal atoms are arranged in a layered manner. FIG. 31A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 31B:
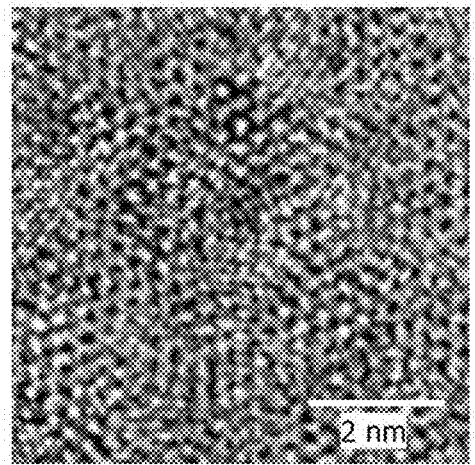
Figure 31C:
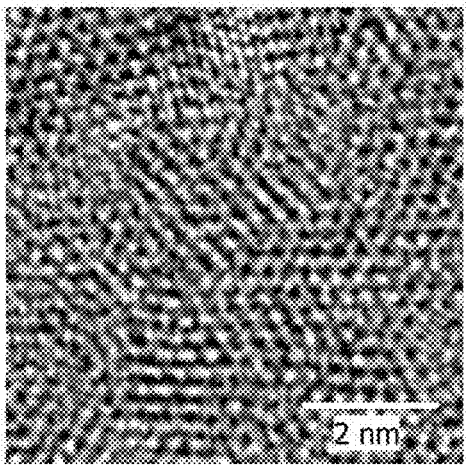
Figure 31D:
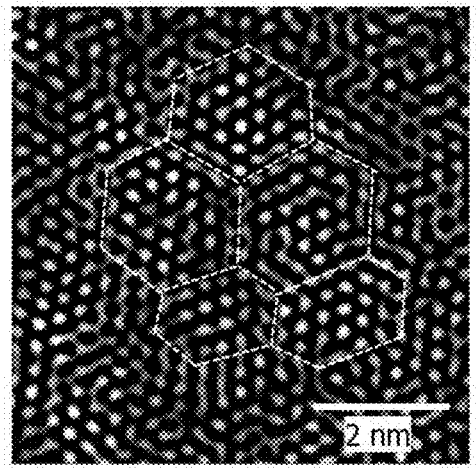
Figure 31E:
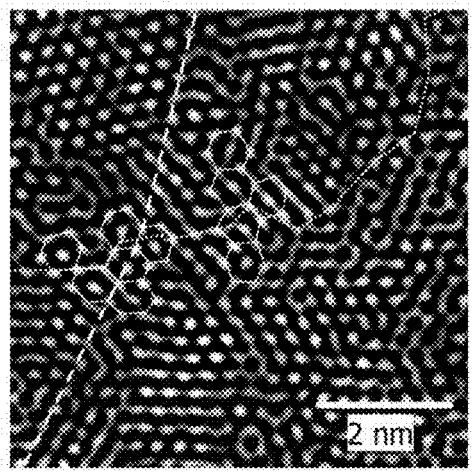

FIGS. 31B and 31C show Cs-corrected high-resolution TEM images of a plane of the CAAC-OS observed from a direction substantially perpendicular to the sample surface. FIGS. 31D and 31E are images obtained through image processing of FIGS. 31B and 31C. The method of image processing is as follows. The image in FIG. 31B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 31D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 31E, a dotted line denotes a portion between a region where a lattice arrangement is well aligned and another region where a lattice arrangement is well aligned. and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor film with a low carrier density (specifically, lower than $8\times10^{11}/cm^3$, preferably lower than $1\times10^{11}/cm^3$, and further preferably lower than $1\times10^{10}/cm^3$ and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 32A:
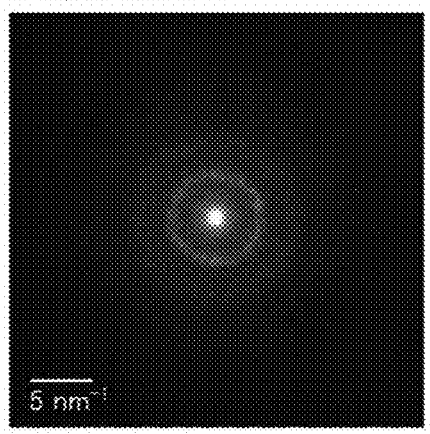
FIGS. 32A to 32D show electron diffraction patterns and a cross-sectional TEM image of an nc-OS.
Figure 32B:
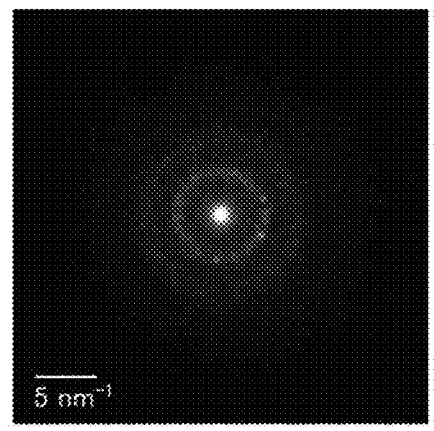

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 32A is observed. FIG. 32B shows a diffraction pattern obtained when an electron beam with a probe diameter of 1 nm is incident on the same sample. As shown in FIG. 32B, a plurality of spots are observed in a ring-like region. In other words, ordering in an nc-OS is not observed with an electron beam with a probe diameter of 50 nm but is observed with an electron beam with a probe diameter of 1 nm.

Figure 32C:
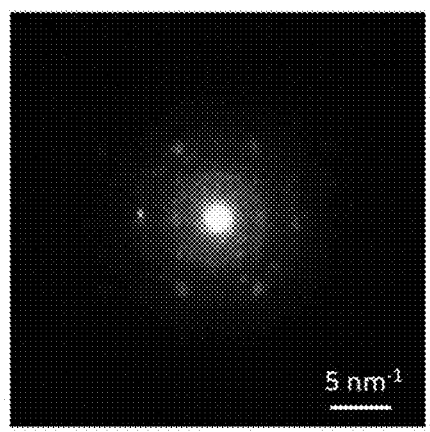

Furthermore, an electron diffraction pattern in which spots are arranged in an approximately hexagonal shape is observed in some cases as shown in FIG. 32C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 32D:
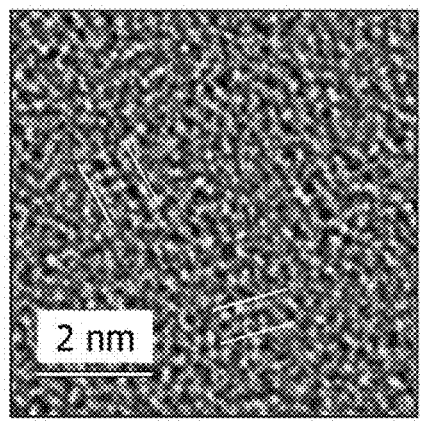

FIG. 32D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 32D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 33A:
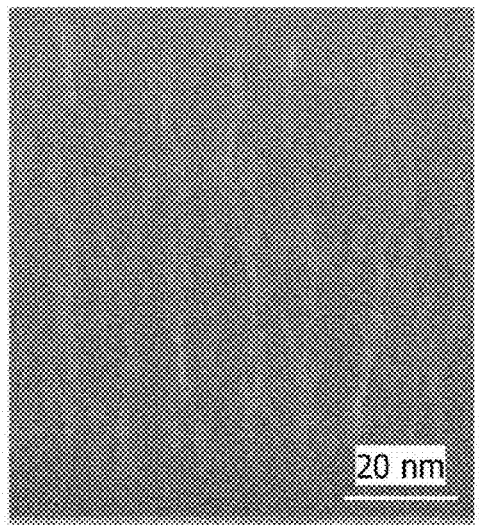
FIGS. 33A and 33B show cross-sectional TEM images of an a-like OS.
Figure 33B:
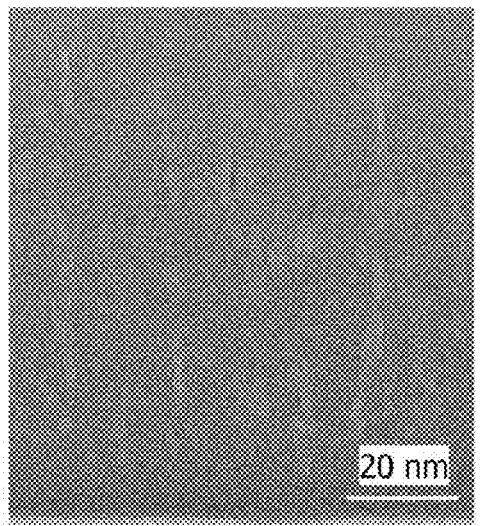

FIGS. 33A and 33B are high-resolution cross-sectional TEM images of an a-like OS. FIG. 33A is the high-resolution cross-sectional TEM image of the a-like OS at the start of the electron irradiation. FIG. 33B is the high-resolution cross-sectional TEM image of a-like OS after the electron (e) irradiation at $4.3\times10^8$ $e^-/nm^2$. FIGS. 33A and 33B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 34:
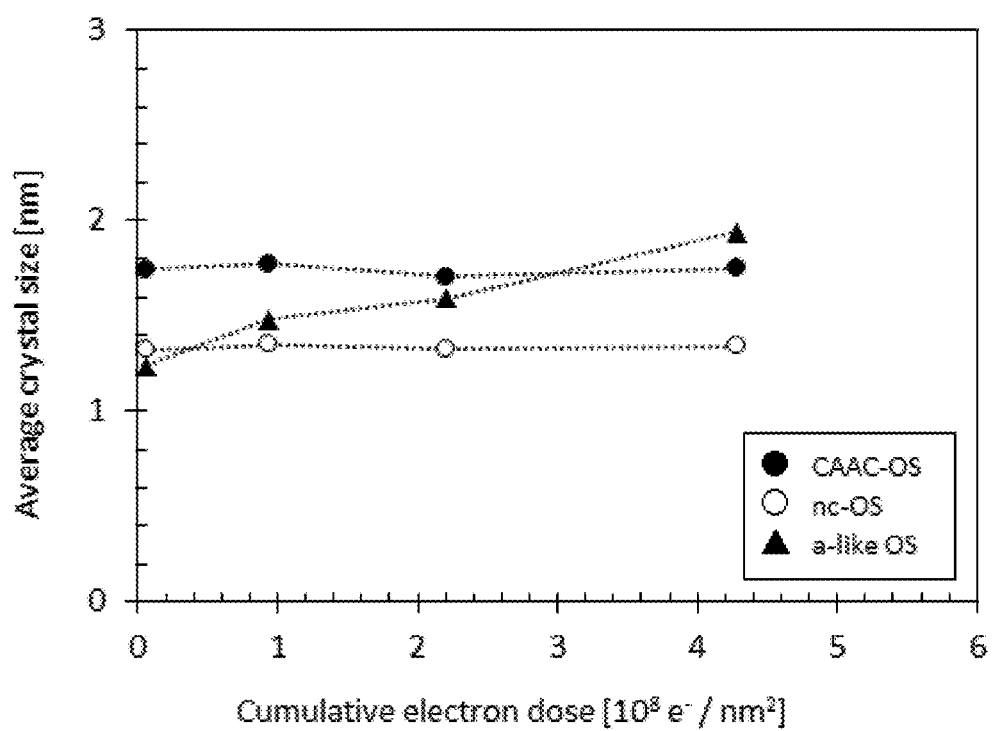
FIG. 34 shows a change in crystal part of an In—Ga—Zn oxide induced by electron irradiation.

FIG. 34 shows change in the average size of crystal parts (at 22 points to 30 points) in each sample. Note that the crystal part size corresponds to the length of a lattice fringe. FIG. 34 indicates that the crystal part size in the a-like OS increases with an increase in the cumulative electron dose in obtaining TEM images, for example. As shown in FIG. 34, a crystal part of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 34, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

This embodiment can be implemented in combination with any of the structures described in the other embodiments as appropriate.

Embodiment 6

In this embodiment, a touch panel that can be used in a light-emitting device of one embodiment of the present invention is described with reference to drawings. Note that the above description can be referred to for the components of the touch panel, which are similar to those of the light-emitting device described in the above embodiments. Although a touch panel including a light-emitting element is described as an example in this embodiment, one embodiment of the present invention is not limited thereto. For example, a touch panel including another element (e.g., a display element) described in Embodiment 2 can also be used in the light-emitting device of one embodiment of the present invention.

Structure Example 1

Figure 35A:
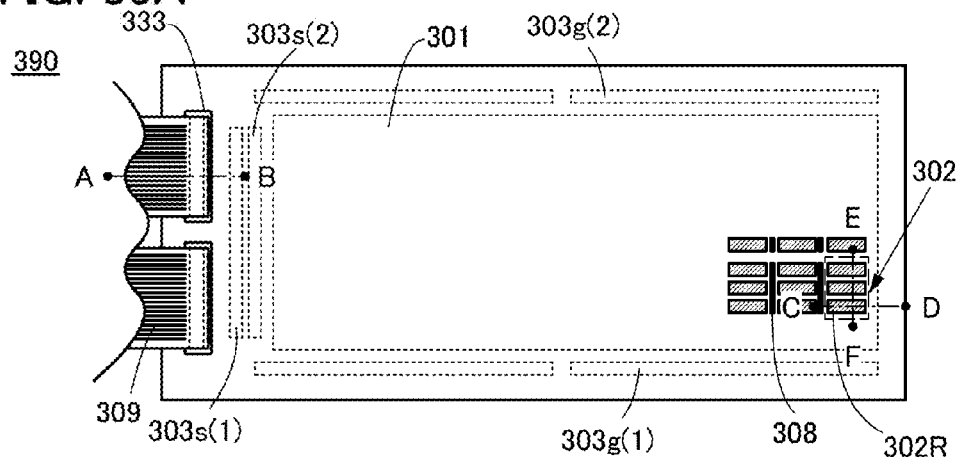
FIGS. 35A to 35C illustrate a structure example of a touch panel of an embodiment.
Figure 35B:
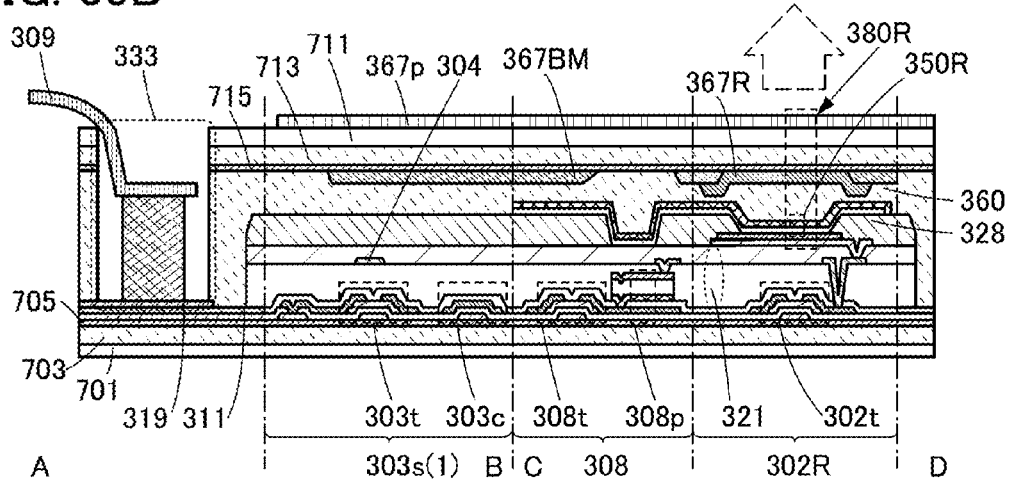
Figure 35C:
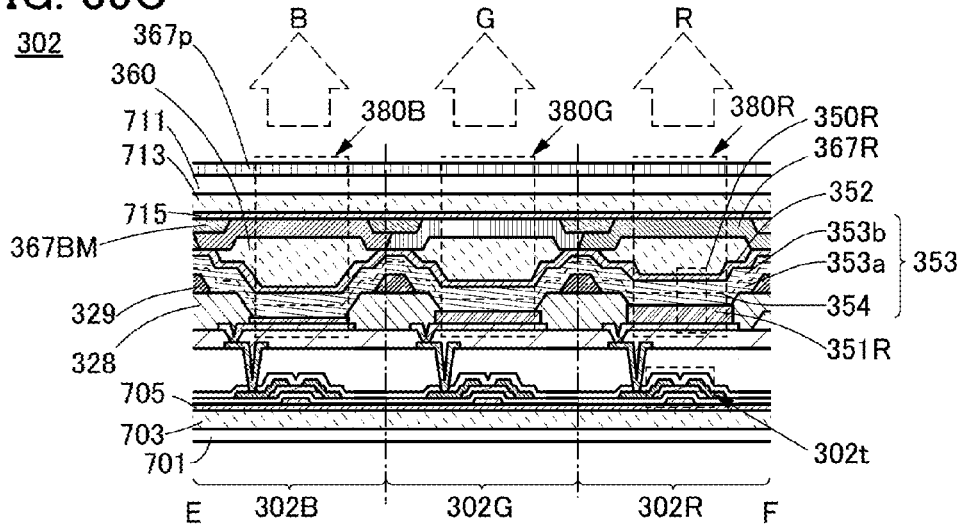

FIG. 35A is a top view of the touch panel. FIG. 35B is a cross-sectional view taken along the dashed-dotted line A-B and the dashed-dotted line C-D in FIG. 35A. FIG. 35C is a cross-sectional view taken along the dashed-dotted line E-F in FIG. 35A.

A touch panel 390 illustrated in FIG. 35A includes a display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor is formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303g(2) supplies control signals to the imaging pixels 308.

The imaging signal line driver circuit 303s(2) reads out imaging signals.

As illustrated in FIGS. 35B and 35C, the touch panel 390 includes a substrate 701, an adhesive layer 703, an insulating layer 705, a substrate 711, an adhesive layer 713, and an insulating layer 715. The substrates 701 and 711 are bonded to each other with an adhesive layer 360.

The substrate 701 and the insulating layer 705 are bonded to each other with the adhesive layer 703. The substrate 711 and the insulating layer 715 are bonded to each other with the adhesive layer 713.

The substrates 701 and 711 are preferably flexible.

The above embodiments can be referred to for materials used for the substrates, the adhesive layers, and the insulating layers.

Each of the pixels 302 includes a sub-pixel 302R, a sub-pixel 302G, and a sub-pixel 302B (see FIG. 35C). The sub-pixel 302R includes a light-emitting module 380R, the sub-pixel 302G includes a light-emitting module 380G, and the sub-pixel 302B includes a light-emitting module 380B.

For example, the sub-pixel 302R includes a light-emitting element 350R and a pixel circuit. The pixel circuit includes a transistor 302t for supplying electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 35C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 380R, for example, includes the adhesive layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the adhesive layer 360 and the coloring layer 367R and is emitted to the outside of the light-emitting module 380R as indicated by an arrow in FIG. 35B or 35C.

The touch panel 390 includes a light-blocking layer 367BM. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t and the like. Note that the insulating layer 321 can be used as a layer for covering unevenness caused by the pixel circuits and the imaging pixel circuits. An insulating layer on which a layer that can inhibit diffusion of impurities to the transistor 302t and the like is stacked can be used as the insulating layer 321.

The touch panel 390 includes a partition 328 that overlaps with an end portion of the lower electrode 351R. In addition, a spacer 329 that controls the distance between the substrate 701 and the substrate 711 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 35B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t.

For example, a PIN photodiode can be used as the photoelectric conversion element 308p.

The touch panel 390 includes a wiring 311 through which a signal is supplied. The wiring 311 is provided with a terminal 319. Note that an FPC 309 through which a signal such as an image signal or a synchronization signal is supplied is electrically connected to the terminal 319 in an opening 333. The opening 333 is formed in the substrate 711, the adhesive layer 713, the insulating layer 715, and the adhesive layer 360. For the formation method of the opening 333, the description in Embodiment 1 or 2 can be referred to. Note that a printed wiring board (PWB) may be attached to the FPC 309.

Note that transistors such as the transistors 302t, 303t, and 308t can be formed in the same process. Alternatively, the transistors may be formed in different processes.

Structure Example 2

Figure 36A:
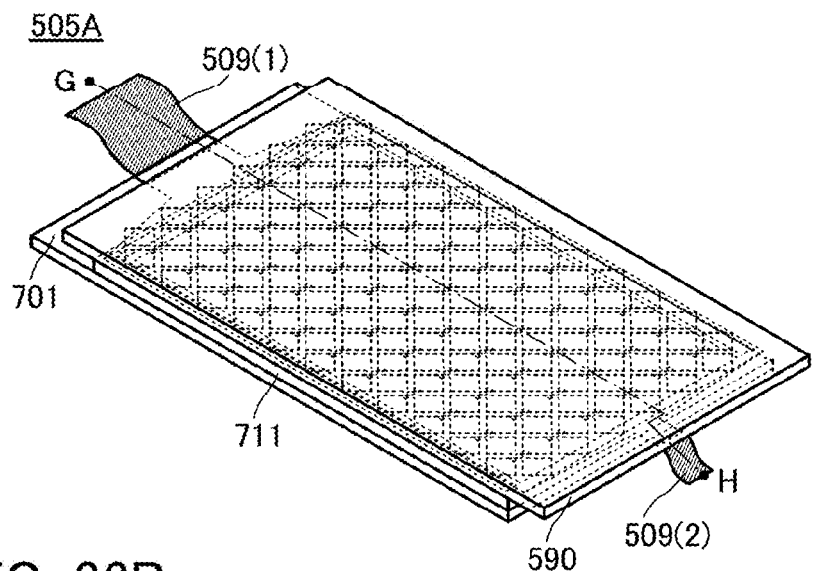
FIGS. 36A and 36B illustrate a structure example of a touch panel of an embodiment.
Figure 36B:
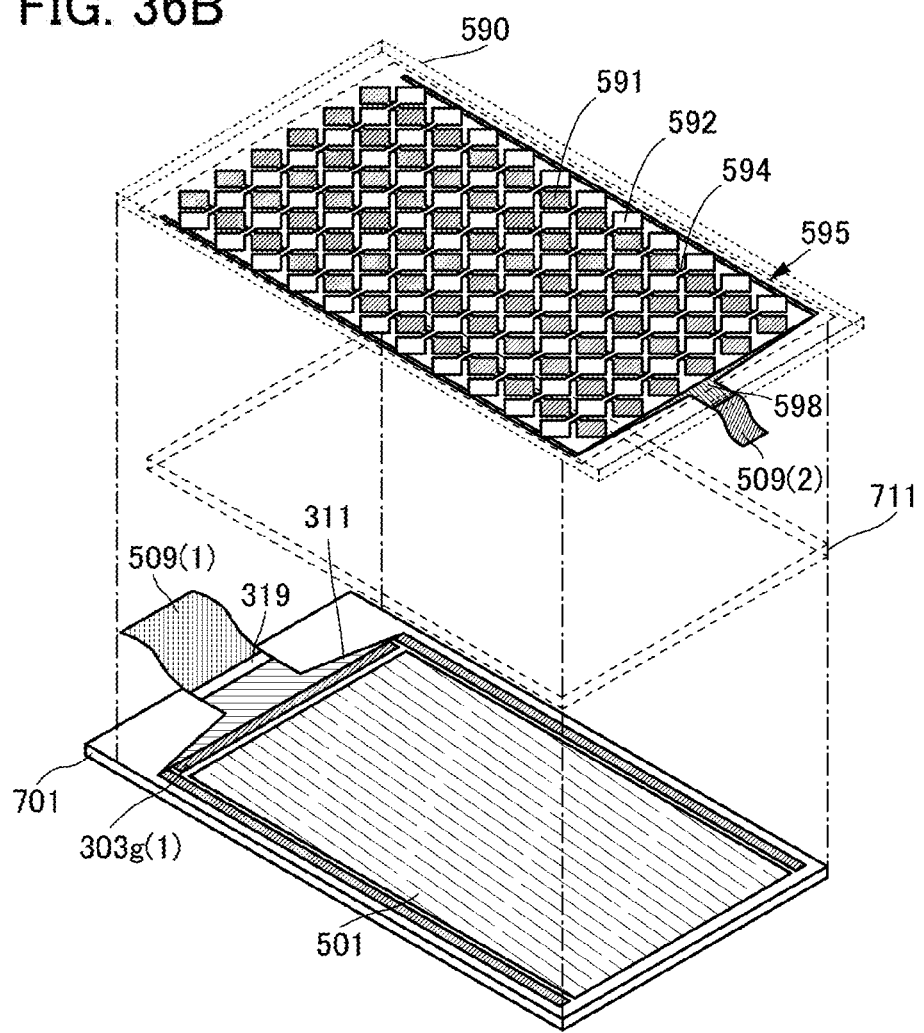
Figure 37A:
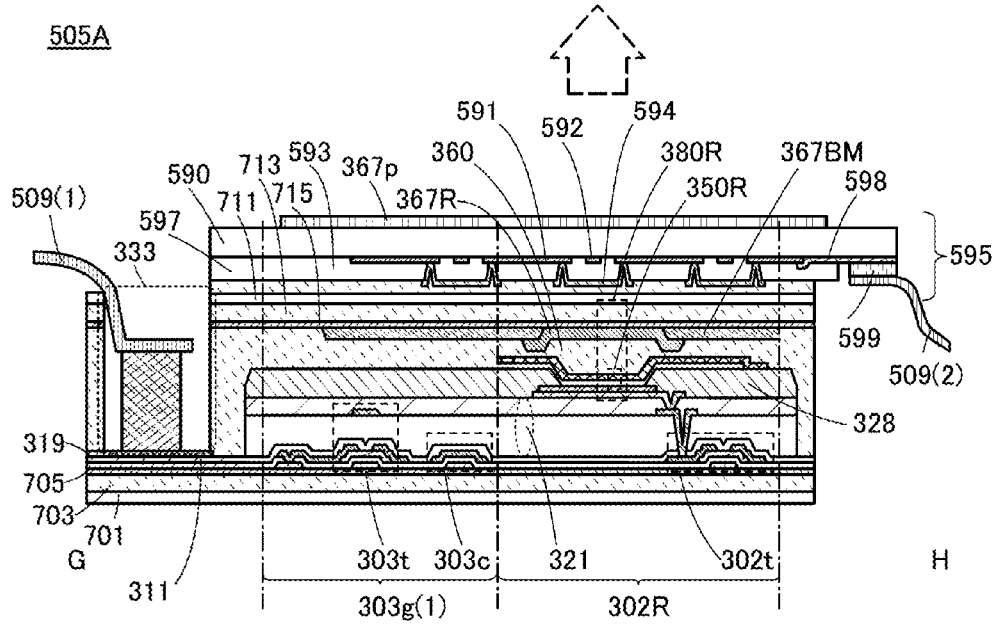
FIGS. 37A to 37C illustrate structure examples of a touch panel of an embodiment.

FIGS. 36A and 36B are perspective views of a touch panel 505A. Note that FIGS. 36A and 36B illustrate only main components for simplicity. FIG. 37A is a cross-sectional view taken along the dashed-dotted line G-H in FIG. 36A.

As illustrated in FIGS. 36A and 36B, the touch panel 505A includes a display portion 501, the scan line driver circuit 303g(1), a touch sensor 595, and the like. Furthermore, the touch panel 505A includes the substrate 701, the substrate 711, and a substrate 590.

The touch panel 505A includes a plurality of pixels and a plurality of wirings 311. The plurality of wirings 311 can supply signals to the pixels. The plurality of wirings 311 are led to a peripheral portion of the substrate 701, and part of the plurality of wirings 311 form the terminal 319. The terminal 319 is electrically connected to an FPC 509(1) in an opening 555. The opening 333 is formed in the substrate 711, the adhesive layer 713, the insulating layer 715, and the adhesive layer 360. For the formation method of the opening 333, the description in Embodiment 1 or 2 can be referred to.

The touch panel 505A includes the touch sensor 595 and a plurality of wirings 598. The plurality of wirings 598 are electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 36B, electrodes, wirings, and the like of the touch sensor 595 provided on the back side of the substrate 590 (the side facing the substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self capacitive touch sensor and a mutual capacitive touch sensor, which differ mainly in the driving method. The use of a mutual capacitive type is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 36A and 36B.

The electrodes 591 each have a quadrangular shape and are arranged in a direction intersecting with the direction in which the electrodes 592 extend. Note that the plurality of electrodes 591 is not necessarily arranged in the direction orthogonal to one electrode 592 and may be arranged to intersect with one electrode 592 at an angle of less than 90 degrees.

A wiring 594 intersects with the electrode 592. The wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 are reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode that is electrically insulated from these electrodes, whereby the area of a region having a different transmittance can be reduced.

Note that a more specific structure example of the touch sensor 595 is described later.

As illustrated in FIG. 37A, the touch panel 505A includes the substrate 701, the adhesive layer 703, the insulating layer 705, the substrate 711, the adhesive layer 713, and the insulating layer 715. The substrates 701 and 711 are bonded to each other with the adhesive layer 360.

An adhesive layer 597 bonds the substrate 590 to the substrate 711 so that the touch sensor 595 overlaps with the display portion 501. The adhesive layer 597 transmits light.

The electrodes 591 and the electrodes 592 are formed using a conductive material that transmits light. As a light-transmitting conductive material, a conductive oxide such as indium oxide, ITO, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

The resistance of a material used for conductive films such as the electrodes 591, the electrodes 592, and the wiring 594, i.e., a wiring and an electrode in the touch panel, is preferably low. Examples of the material include ITO, indium zinc oxide, zinc oxide, silver, copper, aluminum, a carbon nanotube, and graphene. Alternatively, a metal nanowire including a number of conductors with an extremely small width (for example, a diameter of several nanometers) may be used. Note that a metal nanowire, a carbon nanotube, graphene, or the like may be used for an electrode of the display element, e.g., a pixel electrode or a common electrode because of its high transmittance.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 509(2).

The display portion 501 includes a plurality of pixels arranged in a matrix. Each pixel has the same structure as Structure example 1; thus, description is omitted.

Any of various kinds of transistors can be used in the touch panel. A structure in the case of using bottom-gate transistors is illustrated in FIGS. 37A and 37B.

For example, a semiconductor layer containing an oxide semiconductor, amorphous silicon, or the like can be used in the transistor 302t and the transistor 303t illustrated in FIG. 37A.

Figure 37B:
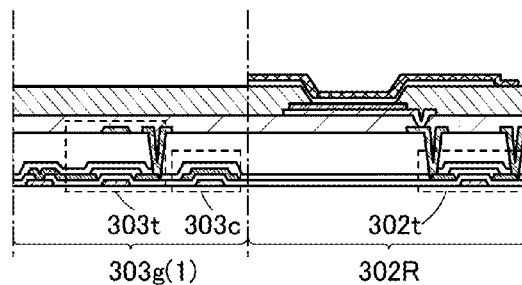

For example, a semiconductor layer containing polycrystalline silicon that is obtained by crystallization process such as laser annealing can be used in the transistor 302t and the transistor 303t illustrated in FIG. 37B.

Figure 37C:
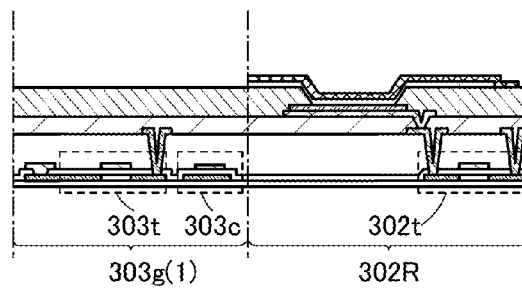

A structure in the case of using top-gate transistors is illustrated in FIG. 37C.

For example, a semiconductor layer including polycrystalline silicon, a single crystal silicon film that is transferred from a single crystal silicon substrate, or the like can be used in the transistor 302t and the transistor 303t illustrated in FIG. 37C.

Structure Example 3

Figure 38A:
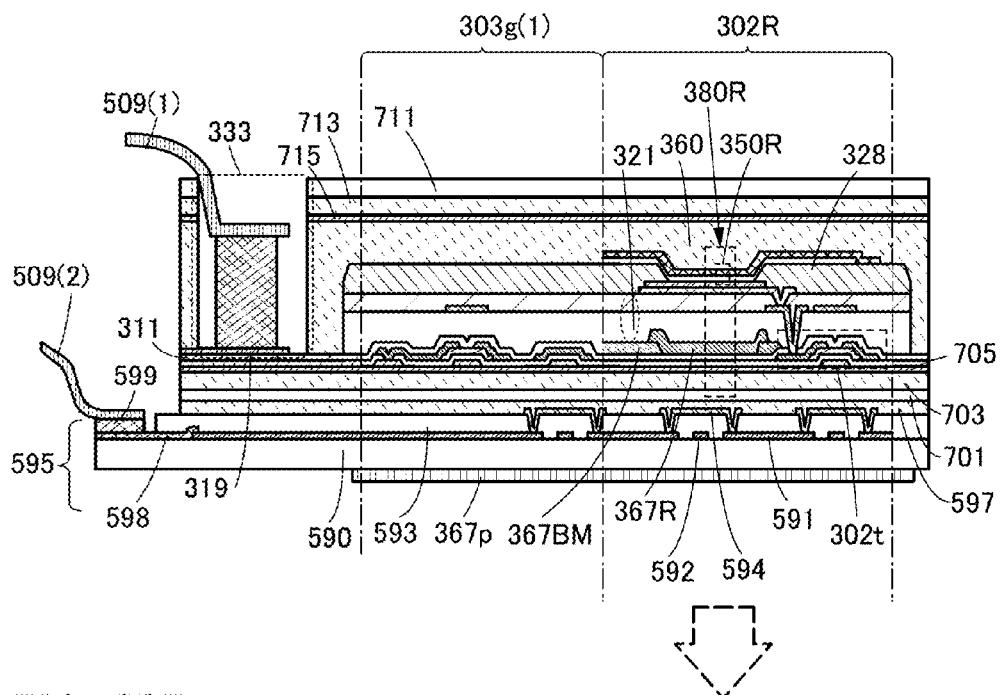
FIGS. 38A to 38C illustrate structure examples of a touch panel of an embodiment.
Figure 38B:
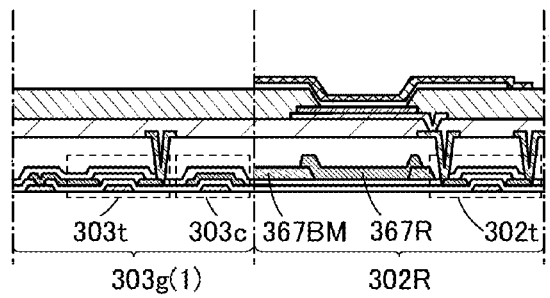
Figure 38C:
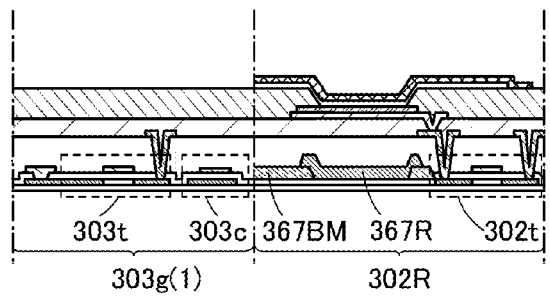

FIGS. 38A to 38C are cross-sectional views of a touch panel 505B. The touch panel 505B described in this embodiment is different from the touch panel 505A in Structure example 2 in that received image data is displayed on the side where the transistors are provided, that the touch sensor is provided on the substrate 701 side of the display portion, and that the FPC 509(2) is provided on the same side as the FPC 509(1). Different structures are described in detail below, and the above description is referred to for the other similar structures.

The coloring layer 367R is positioned in a region overlapping with the light-emitting element 350R. The light-emitting element 350R illustrated in FIG. 38A emits light to the side where the transistor 302t is provided. Accordingly, part of light emitted from the light-emitting element 350R passes through the coloring layer 367R and is emitted to the outside of the light-emitting module 380R as indicated by an arrow in FIG. 38A.

The touch panel 505B includes the light-blocking layer 367BM on the light extraction side. The light-blocking layer 367BM is provided so as to surround the coloring layer (e.g., the coloring layer 367R).

The touch sensor 595 is provided not on the substrate 711 side but on the substrate 701 side (see FIG. 38A).

The adhesive layer 597 bonds the substrate 590 to the substrate 701 so that the touch sensor 595 overlaps with the display portion. The adhesive layer 597 transmits light.

Note that a structure in the case of using bottom-gate transistors in the display portion 501 is illustrated in FIGS. 38A and 38B.

For example, a semiconductor layer containing an oxide semiconductor, amorphous silicon, or the like can be used in the transistor 302t and the transistor 303t illustrated in FIG. 38A.

For example, a semiconductor layer containing polycrystalline silicon or the like can be used in the transistor 302t and the transistor 303t illustrated in FIG. 38B.

A structure in the case of using top-gate transistors is illustrated in FIG. 38C.

For example, a semiconductor layer containing polycrystalline silicon, a single crystal silicon film that is transferred, or the like can be used in the transistor 302t and the transistor 303t illustrated in FIG. 38C.

[Structure Example of Touch Sensor]

A more specific structure example of the touch sensor 595 is described below with reference to drawings.

Figure 39A:
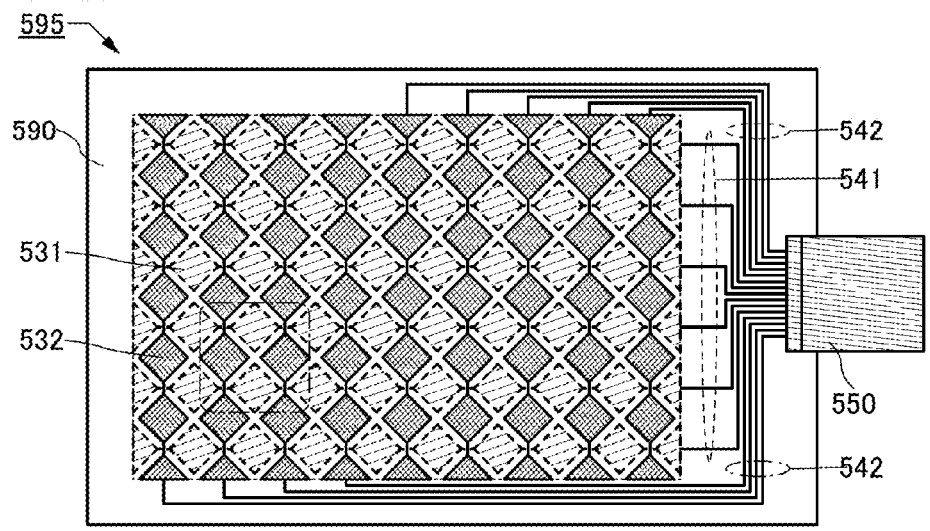
FIGS. 39A to 39D illustrate structure examples of a touch panel of an embodiment.

FIG. 39A is a schematic top view of the touch sensor 595. The touch sensor 595 includes a plurality of electrodes 531, a plurality of electrodes 532, a plurality of wirings 541, and a plurality of wirings 542 over the substrate 590. The substrate 590 is provided with an FPC 550 that is electrically connected to each of the plurality of wirings 541 and the plurality of wirings 542.

Figure 39B:
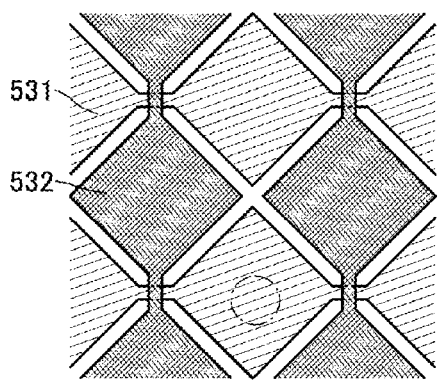

FIG. 39B shows an enlarged view of a region surrounded by a dashed dotted line in FIG. 39A. The electrodes 531 are each in the form of a series of rhombic electrode patterns aligned in a lateral direction of this figure. The rhombic electrode patterns aligned in a line are electrically connected to each other. The electrodes 532 are also each in the form of a series of rhombic electrode patterns aligned in a longitudinal direction in this figure and the rhombic electrode patterns aligned in a line are electrically connected. Part of the electrode 531 and part of the electrode 532 overlap and intersect with each other. At this intersection portion, an insulator is sandwiched in order to avoid an electrical short-circuit between the electrode 531 and the electrode 532.

Figure 39C:
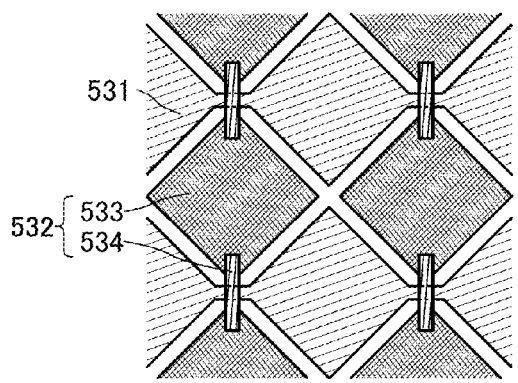

As shown in FIG. 39C, the electrodes 532 may form a plurality of island-shape rhombic electrodes 533 and bridge electrodes 534. The plurality of island-shape rhombic electrodes 533 are aligned in a longitudinal direction in this figure, and two adjacent electrodes 533 are electrically connected to each other by the bridge electrode 534. Such a structure makes it possible that the electrodes 533 and the electrodes 531 can be formed at the same time by processing the same conductive film. This can prevent variations in the thickness of these films, and can prevent the resistance value and the light transmittance of each electrode from varying from place to place. Note that although the electrodes 532 include the bridge electrodes 534 here, the electrodes 531 may have such a structure.

Figure 39D:
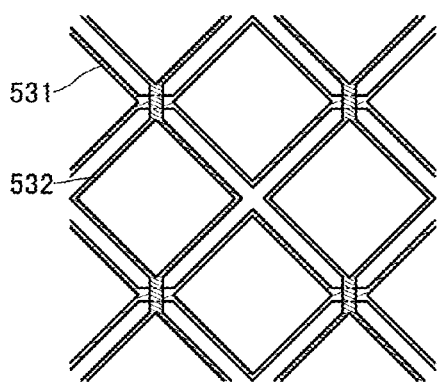

As shown in FIG. 39D, a design in which rhombic electrode patterns of the electrodes 531 and 532 shown in FIG. 39B are hollowed out and only edges are left may be used. At that time, when the electrodes 531 and the electrodes 532 are too small in width for the users to see, the electrodes 531 and the electrodes 532 can be formed using a light-blocking material such as a metal or an alloy, as described later. In addition, either the electrodes 531 or the electrodes 532 shown in FIG. 39D may include the above bridge electrodes 534.

One of the electrodes 531 is electrically connected to one of the wirings 541. One of the electrodes 532 is electrically connected to one of the wirings 542.

When a touch panel is formed in such a manner that the touch sensor 595 is stacked over a display surface of the light-emitting device, a light-transmitting conductive material is preferably used for the electrodes 531 and the electrodes 532. In the case where a light-transmitting conductive material is used for the electrodes 531 and the electrodes 532 and light from the light-emitting device is extracted through the electrodes 531 or the electrodes 532, it is preferable that a conductive film containing the same conductive material be arranged between the electrodes 531 and the electrodes 532 as a dummy pattern. Part of a space between the electrodes 531 and the electrodes 532 is filled with the dummy pattern, which can reduce variation in light transmittance. As a result, unevenness in luminance of light transmitted through the touch sensor 595 can be reduced.

As a light-transmitting conductive material, a conductive oxide such as indium oxide, ITO, indium zinc oxide, zinc oxide, or zinc oxide to which gallium is added can be used. Note that a film including graphene can be used as well. The film including graphene can be formed, for example, by reducing a film containing graphene oxide. As a reducing method, a method with application of heat or the like can be employed.

Further, a metal film or an alloy film that is thin enough to have a light-transmitting property can be used. For example, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material or the alloy material (e.g., titanium nitride), or the like may be used. Alternatively, a stacked film in which two or more of conductive films containing the above materials are stacked may be used.

For the electrodes 531 and the electrodes 532, a conductive film that is processed to be too thin to see by the users may be used. Such a conductive film is processed into a lattice shape (a mesh shape), for example, which makes it possible to achieve high conductivity and high visibility of the display device. It is preferable that the conductive film have a portion in which the width is greater than or equal to 30 nm and less than or equal to 100 μm, preferably greater than or equal to 50 nm and less than or equal to 50 μm, and further preferably greater than or equal to 50 nm and less than or equal to 20 μm. In particular, the conductive film having the pattern width of 10 μm or less is extremely difficult to see by the users, which is preferable.

Figure 40A:
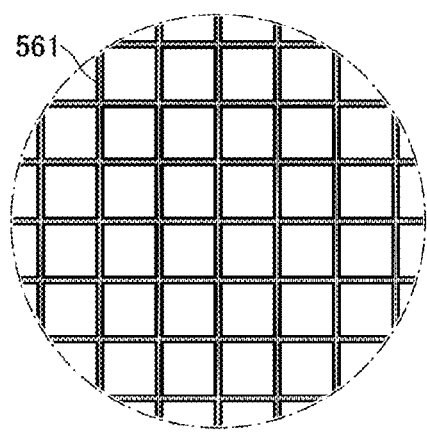
FIGS. 40A to 40D illustrate structure examples of a touch panel of an embodiment.

As examples, enlarged schematic views of part of the electrodes 531 or the electrodes 532 (part in a ring formed by a dashed-dotted line in FIG. 39B) are shown in FIGS. 40A to 40D. FIG. 40A shows an example of the case in which a lattice-shape conductive film 561 is used. The lattice-shape conductive film 561 is preferably placed so as not to overlap the display element included in the display device because light from the display device is not blocked. In that case, it is preferable that the direction of the lattice be provided so as to be the same as the direction of the display element arrangement and that the pitch of the lattice be an integer multiple of the pitch of the display element arrangement.

Figure 40B:
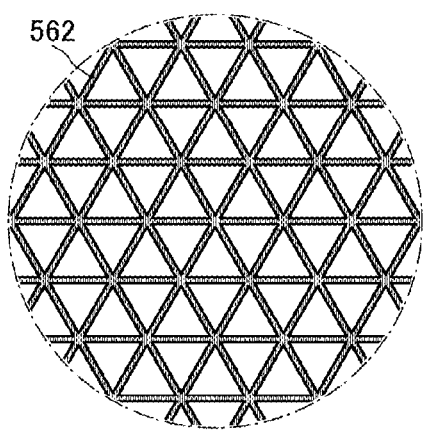

FIG. 40B shows an example of a lattice-shape conductive film 562, which is processed so as to be provided with triangle openings. Such a structure makes it possible to further reduce the resistance compared with the structure shown in FIG. 40A.

Figure 40C:
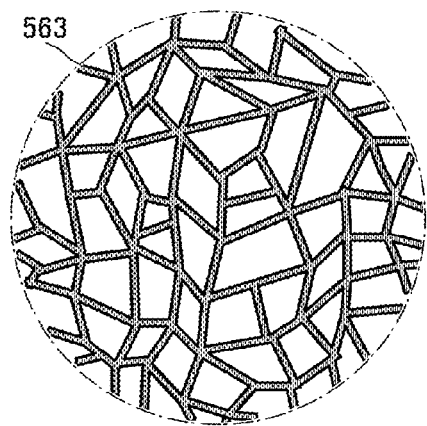

In addition, a conductive film 563, which has an irregular pattern shape, may be used as shown in FIG. 40C. Such a structure can prevent generation of moire when overlapping with the display portion of the display device. Note that "moire" refers to a fringe pattern created by diffraction or interference when external light or the like passes through or external light is reflected by narrow conductive films or the like spaced uniformly.

Figure 40D:
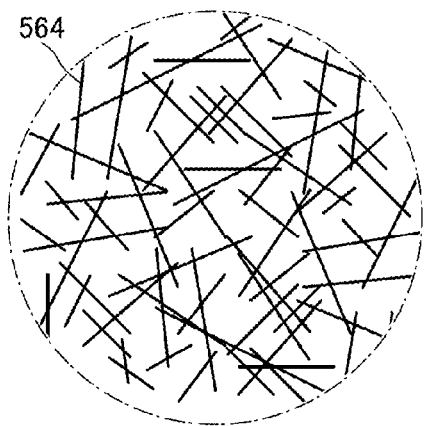

Conductive nanowires may be used for the electrodes 531 and the electrodes 532. FIG. 40D shows an example of the case in which nanowires 564 are used. The nanowires 564 are dispersed at appropriate density so as to be in contact with the adjacent nanowires, which can form a two-dimensional network; therefore, a conductive film with extremely high light-transmitting property can be provided. For example, a nanowire that has a mean value of the diameters of greater than or equal to 1 nm and less than or equal to 100 nm, preferably greater than or equal to 5 nm and less than or equal to 50 nm, further preferably greater than or equal to 5 nm and less than or equal to 25 nm can be used. As the nanowire 564, a metal nanowire such as an Ag nanowire, a Cu nanowire, and an Al nanowire, a carbon nanotube, or the like can be used. In the case of using an Ag nanowire, for example, light transmittance of 89% or more and a sheet resistance of 40 $\Omega/cm^2$ or more and 100 $\Omega/cm^2$ or less can be achieved.

Although examples in which a plurality of rhombuses are aligned in one direction are shown in FIG. 39A and the like as top surface shapes of the electrodes 531 and the electrodes 532, the shapes of the electrodes 531 and the electrodes 532 are not limited thereto and can have various top surface shapes such as a belt shape (a rectangular shape), a belt shape having a curve, and a zigzag shape. In addition, although the above shows the electrodes 531 and the electrodes 532 are arranged to be perpendicular to each other, they are not necessarily arranged to be perpendicular and the angle formed by two of the electrodes may be less than 90°.

Figure 41A:
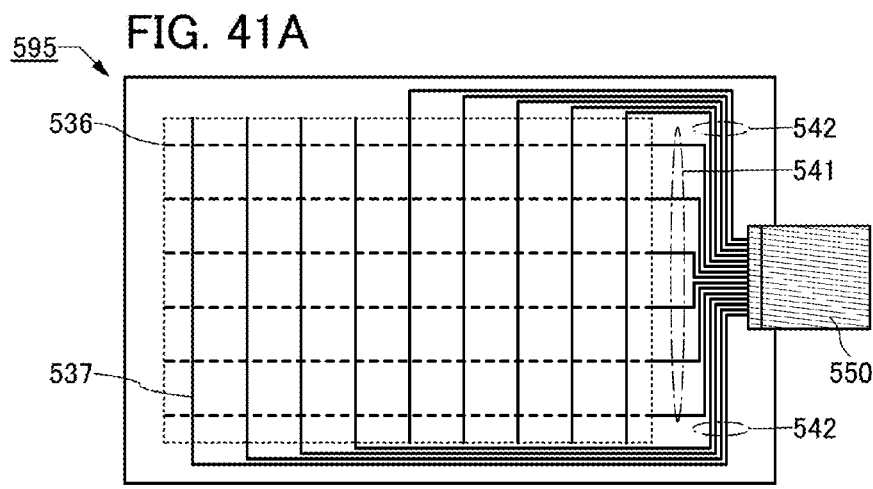
FIGS. 41A to 41C illustrate structure examples of a touch panel of an embodiment.
Figure 41B:
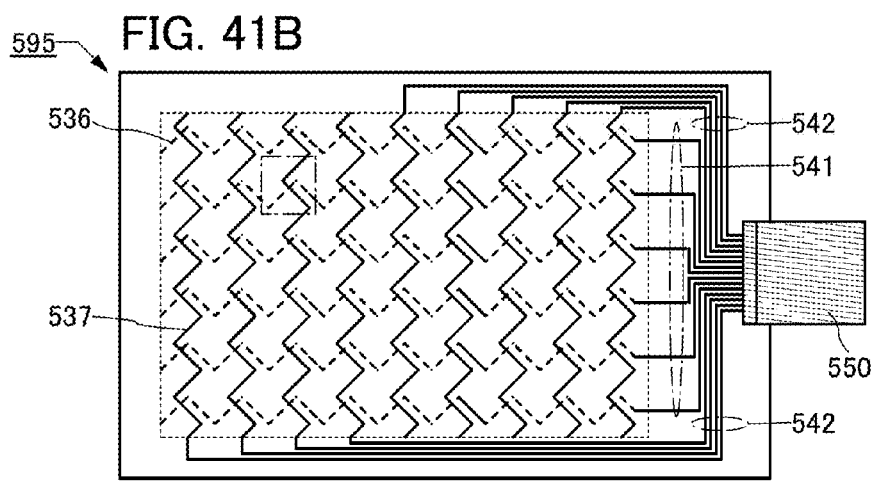
Figure 41C:
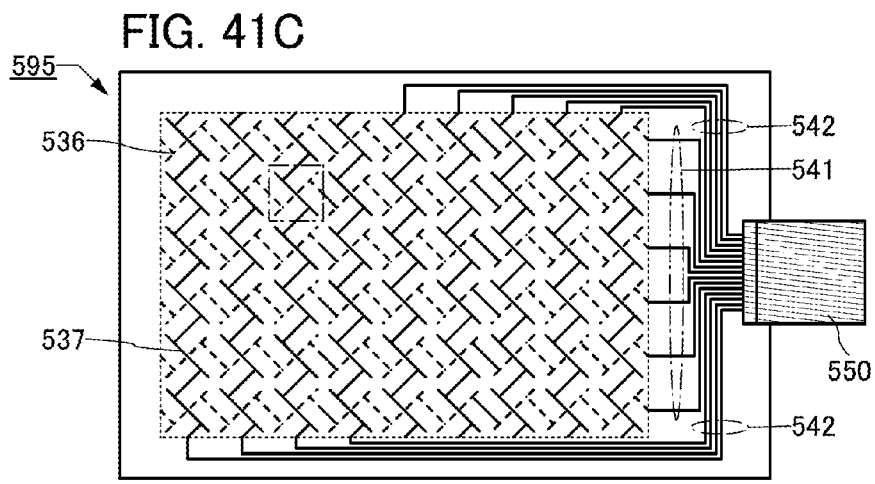

FIGS. 41A to 41C illustrate examples of the case where electrodes 536 and electrodes 537, which have a top surface shape of thin lines, are used instead of the electrodes 531 and the electrodes 532. FIG. 41A shows an example in which linear electrodes 536 and 537 are arranged so as to form a lattice shape.

FIG. 41B shows an example in which the electrodes 536 and the electrodes 537 have a top surface shape of a zigzag shape. As shown in FIG. 41B, the electrodes 536 and the electrodes 537 are arranged so as not to cross the straight-line portions at the centers but so as to place the centers of the straight-line portions in different positions from each other; therefore, the length of closely facing parallel parts of the electrodes 536 and the electrodes 537 can be longer. This is preferable because the mutual capacitance between the electrodes can be increased and the sensitivity can be increased. Alternatively, as shown in FIG. 41C, the electrodes 536 and the electrodes 537 are arranged so as to have a design in which part of the straight-line portion of a zigzag top shape is projected, which can increase the mutual capacitance between the electrodes because the length of the parts facing each other can be longer even when the centers of the straight-line portions are placed in the same position.

Figure 42A:
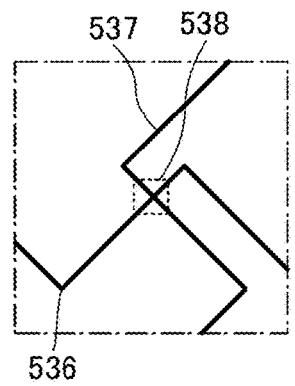
FIGS. 42A to 42F illustrate structure examples of a touch panel of an embodiment.
Figure 42B:
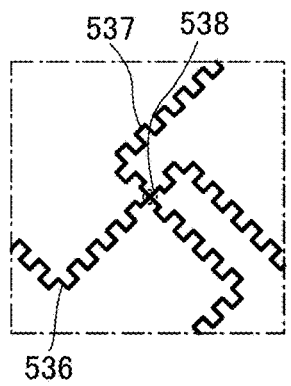
Figure 42C:
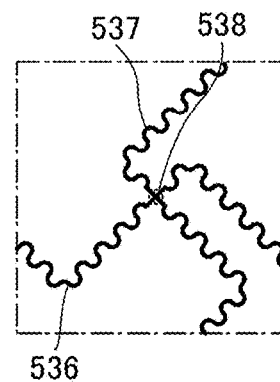
Figure 42D:
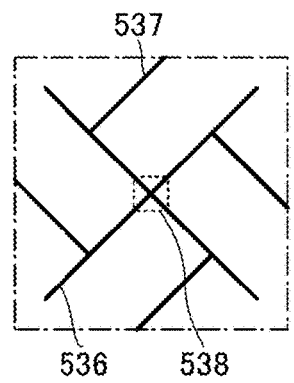
Figure 42E:
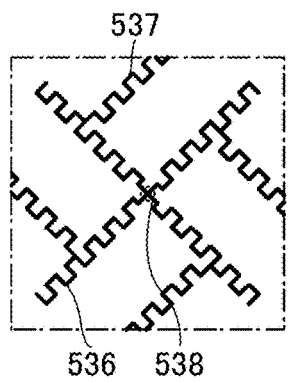
Figure 42F:
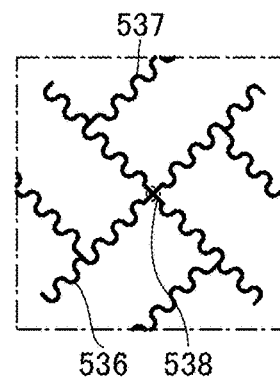

FIGS. 42A to 42C show enlarged views of a region surrounded by a dashed dotted line in FIG. 41B, and FIGS. 42D to 42F show enlarged views of a region surrounded by a dashed dotted line in FIG. 41C. In these drawings, the electrodes 536, the electrodes 537, and intersection portions 538 at which the electrodes 536 and the electrodes 537 intersect are illustrated. The straight-line portions of the electrodes 536 and the electrodes 537 shown in FIGS. 42A and 42D may have a serpentine shape that meanders with angled corners as shown in FIGS. 42B and 42E or may have a serpentine shape that continuously meanders as shown in FIGS. 42C and 42F.

At least part of this embodiment can be implemented in combination with any of the embodiments described in this specification as appropriate.

Embodiment 7

In this embodiment, electronic devices and lighting devices that can be manufactured by one embodiment of the present invention are described with reference to FIGS. 43A to 43G and FIGS. 44A to 44I.

The light-emitting device manufactured by the manufacturing method of one embodiment of the present invention can be flexible. Therefore, the light-emitting device can be used in electronic devices and lighting devices having flexibility.

Examples of electronic devices include television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

The light-emitting device of one embodiment of the present invention has flexibility and therefore can be incorporated along a curved inside/outside wall surface of a house or a building or a curved interior/exterior surface of a car.

Figure 43A:
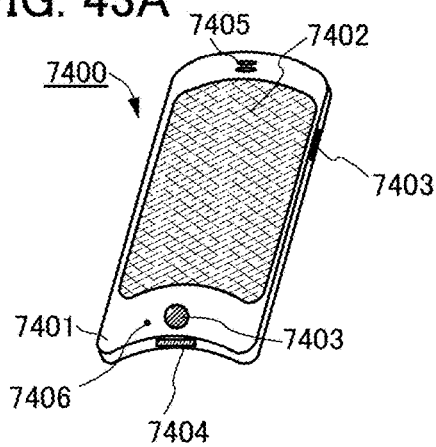
FIGS. 43A to 43G illustrate structure examples of an electronic device of an embodiment.

FIG. 43A illustrates an example of a cellular phone. A cellular phone 7400 includes a display portion 7402 incorporated in a housing 7401, an operation button 7403, an external connection port 7404, a speaker 7405, a microphone 7406, and the like. Note that the cellular phone 7400 is manufactured using the light-emitting device of one embodiment of the present invention for the display portion 7402. According to one embodiment of the present invention, a highly reliable cellular phone having a curved display portion can be provided.

When the display portion 7402 of the cellular phone 7400 in FIG. 43A is touched with a finger or the like, information can be input into the cellular phone 7400. Moreover, operations such as making a call and inputting a letter can be performed by touch on the display portion 7402 with a finger or the like.

With the operation button 7403, power ON or OFF can be switched. In addition, a variety of images displayed on the display portion 7402 can be switched; switching a mail creation screen to a main menu screen, for example.

Figure 43B:
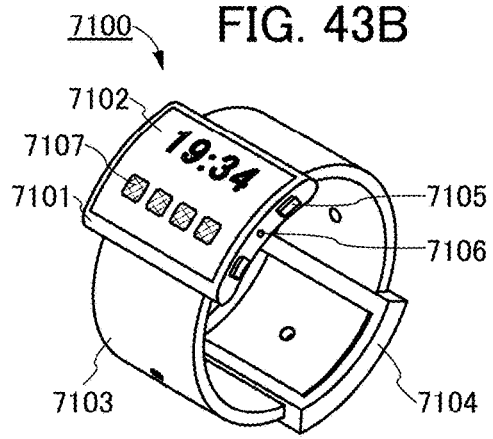

FIG. 43B is an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of silent mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting device manufactured by one embodiment of the present invention. According to one embodiment of the present invention, a highly reliable portable information terminal having a curved display portion can be provided.

Figure 43C:
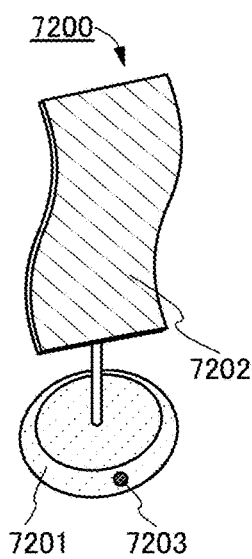
Figure 43D:
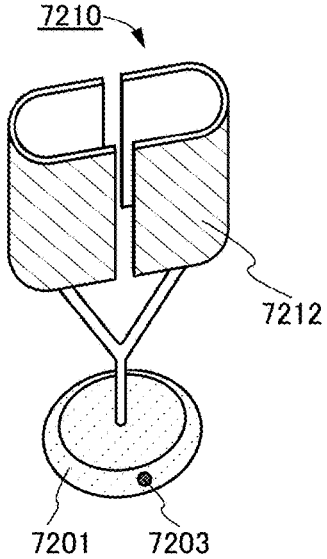
Figure 43E:
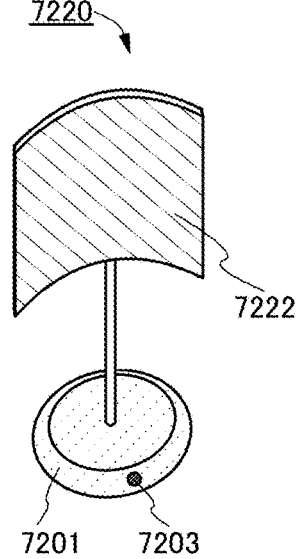

FIGS. 43C to 43E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 43C includes a light-emitting portion 7202 having a wave-shaped light-emitting surface, which is a good-design lighting device.

A light-emitting portion 7212 included in the lighting device 7210 in FIG. 43D has two convex-curved light-emitting portions symmetrically placed. Thus, all directions can be illuminated with the lighting device 7210 as a center.

The lighting device 7220 illustrated in FIG. 43E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device of one embodiment of the present invention. According to one embodiment of the present invention, a highly reliable lighting device having a curved display portion can be provided.

Figure 43F:
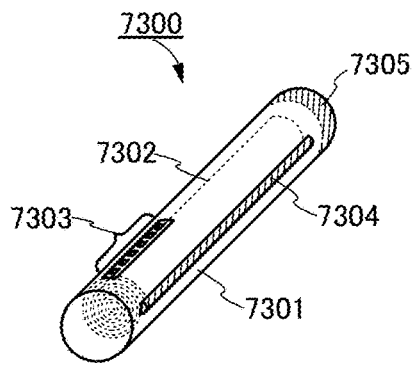

FIG. 43F illustrates an example of a portable touch panel. A touch panel 7300 includes a housing 7301, a display portion 7302, operation buttons 7303, a display portion pull 7304, and a control portion 7305.

The touch panel 7300 includes a rolled flexible display portion 7302 in the cylindrical housing 7301.

The touch panel 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power ON/OFF, switching of displayed videos, and the like can be performed.

Figure 43G:
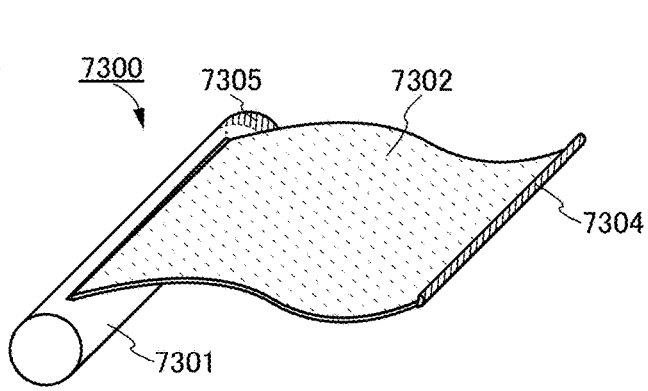

FIG. 43G illustrates the touch panel 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 43F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a light-emitting device of one embodiment of the present invention. According to one embodiment of the present invention, a lightweight and highly reliable touch panel can be provided.

Figure 44A:
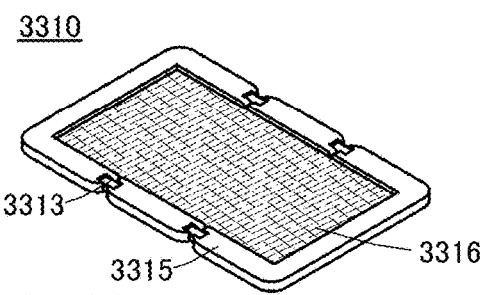
FIGS. 44A to 44I illustrate structure examples of an electronic device of an embodiment.
Figure 44B:
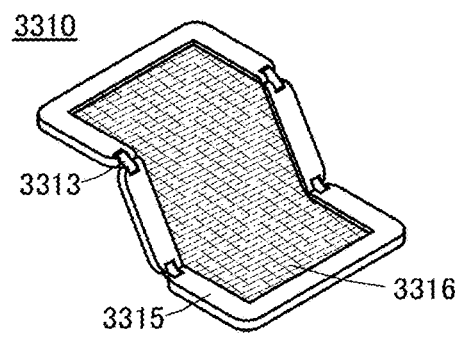
Figure 44C:
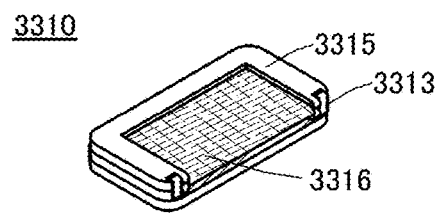

FIGS. 44A to 44C illustrate a foldable portable information terminal 3310. FIG. 44A illustrates the portable information terminal 3310 that is opened. FIG. 44B illustrates the portable information terminal 3310 that is being opened or being folded. FIG. 44C illustrates the portable information terminal 3310 that is folded. The portable information terminal 3310 is highly portable when folded. The portable information terminal 3310 is highly browsable when opened because of its seamless large display region.

A display panel 3316 is supported by three housings 3315 joined together by hinges 3313. By folding the portable information terminal 3310 at a connection portion between two housings 3315 with the hinges 3313, the portable information terminal 3310 can be reversibly changed in shape from an opened state to a folded state. A light-emitting device of one embodiment of the present invention can be used for the display panel 3316. For example, a light-emitting device that can be bent with a radius of curvature of greater than or equal to 1 mm and less than or equal to 150 mm can be used.

Figure 44D:
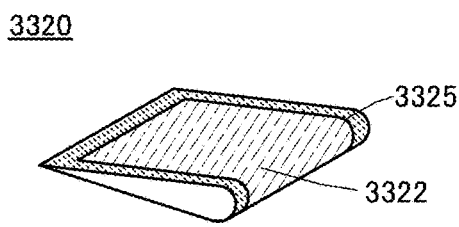
Figure 44E:
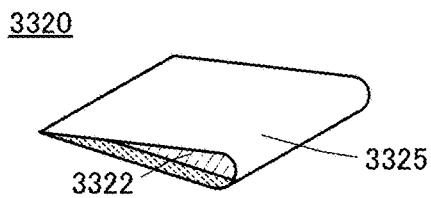

FIGS. 44D and 44E each illustrate a foldable portable information terminal 3320. FIG. 44D illustrates the portable information terminal 3320 that is folded so that a display portion 3322 is on the outside. FIG. 44E illustrates the portable information terminal 3320 that is folded so that the display portion 3322 is on the inside. When the portable information terminal 3320 is not used, the portable information terminal 3320 is folded so that a non-display portion 3325 faces the outside, whereby the display portion 3322 can be prevented from being contaminated or damaged. A light-emitting device of one embodiment of the present invention can be used for the display portion 3322.

Figure 44F:
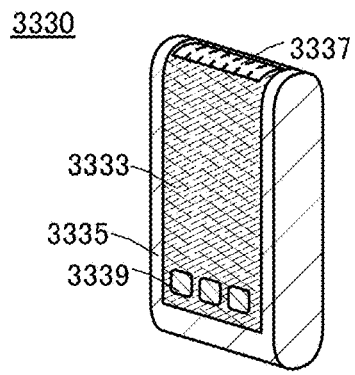
Figure 44G:
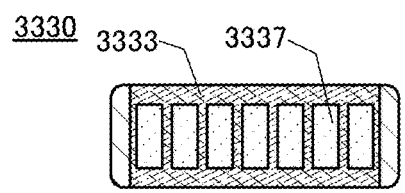
Figure 44H:
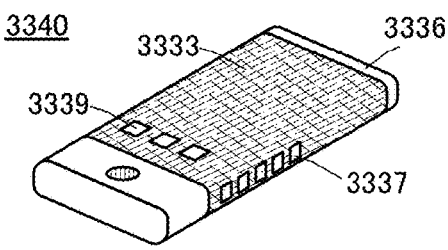

FIG. 44F is a perspective view illustrating an external shape of the portable information terminal 3330. FIG. 44G is a top view of the portable information terminal 3330. FIG. 44H is a perspective view illustrating an external shape of a portable information terminal 3340.

The portable information terminals 3330 and 3340 each function as, for example, one or more of a telephone set, a notebook, an information browsing system, and the like. Specifically, the portable information terminals 3330 and 3340 each can be used as a smartphone.

The portable information terminals 3330 and 3340 can display characters and image information on its plurality of surfaces. For example, three operation buttons 3339 can be displayed on one surface (FIGS. 44F and 44H). In addition, information 3337 indicated by dashed rectangles can be displayed on another surface (FIGS. 44G and 44H). Examples of the information 3337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 3339, an icon, or the like may be displayed in place of the information 3337. Although FIGS. 44F and 44G illustrate an example in which the information 3337 is displayed at the top, one embodiment of the present invention is not limited thereto. For example, the information may be displayed on the side as in the portable information terminal 3340 in FIG. 44H.

For example, a user of the portable information terminal 3330 can see the display (here, the information 3337) with the portable information terminal 3330 put in a breast pocket of his/her clothes.

Specifically, a caller's phone number, name, or the like of an incoming call is displayed in a position that can be seen from above the portable information terminal 3330. Thus, the user can see the display without taking out the portable information terminal 3330 from the pocket and decide whether to answer the call.

A light-emitting device of one embodiment of the present invention can be used for a display portion 3333 mounted in each of a housing 3335 of the portable information terminal 3330 and a housing 3336 of the portable information terminal 3340. One embodiment of the present invention makes it possible to provide a highly reliable touch panel having a curved display portion.

Figure 44I:
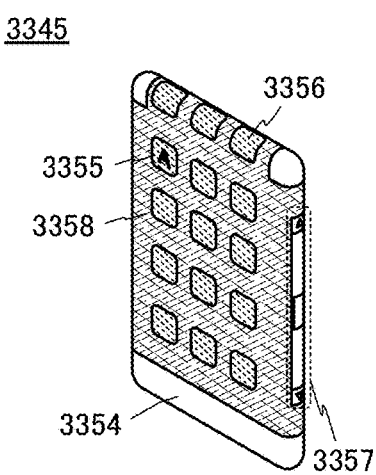

As in a portable information terminal 3345 illustrated in FIG. 44I, information may be displayed on three or more surfaces. Here, information 3355, information 3356, and information 3357 are displayed on different surfaces.

For a display portion 3358 included in a housing 3354 of the portable information terminal 3345, a light-emitting device of one embodiment of the present invention can be used. One embodiment of the present invention makes it possible to provide a highly reliable touch panel having a curved display portion.

This embodiment can be combined with any other embodiment as appropriate.

Note that content (or part of the content) described in one embodiment may be applied to, combined with, or replaced by different content (or part of the different content) described in the embodiment and/or content (or part of the content) described in another embodiment or other embodiments.

Note that in each embodiment, content described in the embodiment is content described with reference to a variety of diagrams or content described with a text described in the specification.

Note that by combining a diagram (or part of the diagram) illustrated in one embodiment with another part of the diagram, a different diagram (or part of the different diagram) illustrated in the embodiment, and/or a diagram (or part of the diagram) illustrated in another embodiment or other embodiments, much more diagrams can be formed.

Note that in the case where at least one specific example is described in a diagram or a text described in one embodiment in this specification and the like, it is readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

Example 1

In this example, a terminal electrode included in a light-emitting device was exposed by the method for manufacturing a light-emitting device of one embodiment of the present invention. The results are described below.

[Sample]

Figure 45A:
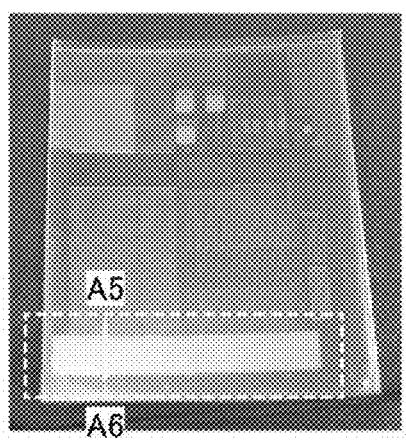
FIGS. 45A to 45C are a photograph, a schematic perspective view, and a cross-sectional view of a processing member of an example.
Figure 45B:
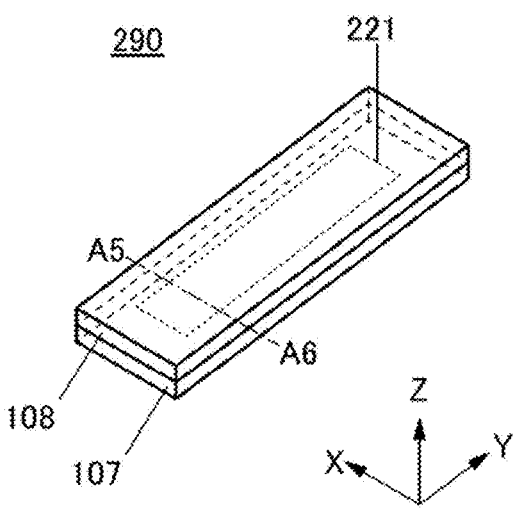
Figure 45C:
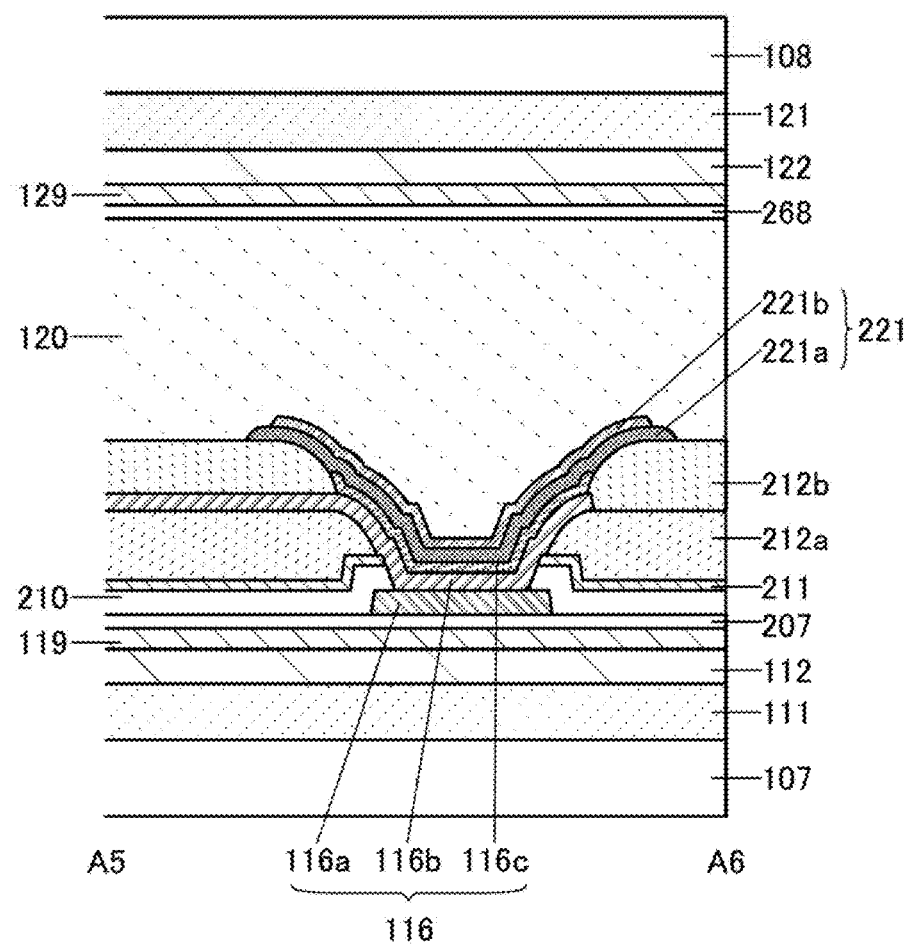

First, samples used in this example are described. FIG. 45A is a photograph of part of a light-emitting device of one embodiment of the present invention. FIG. 45B is a schematic perspective view of a portion surrounded by a dashed line in FIG. 45A. FIG. 45C is a cross-sectional view taken along the dashed-dotted line A5-A6 in FIGS. 45A and 45B. FIGS. 45B and 45C illustrate a processing member 290 that is part of the light-emitting device. FIG. 45A shows a portion that includes a terminal electrode and is separated from the light-emitting device of one embodiment of the present invention.

The processing member 290 includes the substrate 111, the terminal electrode 116, the separation layer 221, the bonding layer 120, and the substrate 121. A protective film 107 is provided on the surface of the substrate 111. A protective film 108 is provided on the surface of the substrate 121. The terminal electrode 116 has a stacked-layer structure including an electrode 116a, an electrode 116b, and an electrode 116c. The electrode 116b is electrically connected to a transistor, a light-emitting element, or the like included in the light-emitting device. The separation layer 221 is provided over the electrode 116c, and has a stacked-layer structure including the first layer 221a and the second layer 221b. In this example, grooves (a first groove and a second groove) are formed in the processing member 290 using a blade capable of cutting processing by being rotated, and in a portion overlapping with a region surrounded by the grooves, the layers over the terminal electrode 116 that are the protective film 108, the substrate 121, the bonding layer 122, the insulating layer 129, the overcoat layer 268, the bonding layer 120, and the second layer 221b are removed. The removal is performed by lifting up the layers to be removed that are floated in forming the grooves with tweezers.

The materials and thickness of the layers included in the processing member 290 are described below.

As the substrate 111 and the substrate 121, an approximately 20-μm-thick aramid film was used. As each of the protective films 107 and 108, a PET film with a thickness of approximately 100 μm was used. As each of the bonding layers 112 and 122, an approximately 2-μm-thick adhesive epoxy resin film was used. As the bonding layer 120, an approximately 5-μm-thick adhesive epoxy resin film was used. As the insulating layer 119, a layered film including an approximately 600-nm-thick silicon oxynitride film, an approximately 200-nm-thick silicon nitride film, an approximately 200-nm-thick silicon oxynitride film, an approximately 140-nm-thick silicon nitride oxide film, and an approximately 100-nm-thick silicon oxynitride film was used. As the insulating layer 129, a layered film including an approximately 600-nm-thick silicon oxynitride film, an approximately 280-nm-thick silicon nitride film, an approximately 180-nm-thick silicon oxynitride film, an approximately 140-nm-thick silicon nitride film, and an approximately 215-nm-thick silicon oxynitride film was used. As the overcoat layer 268, a layered film including an approximately 200-nm-thick alloy film (Al—Ti) of aluminum (Al) and titanium (Ti) and an approximately 10-nm-thick ITO film was used. As the insulating layer 207, a layered film including an approximately 400-nm-thick silicon nitride film and an approximately 50-nm-thick silicon oxynitride film nm was used. As the insulating layer 210, an approximately 450-nm-thick silicon oxynitride film was used. As the insulating layer 211, an approximately 100-nm-thick silicon nitride film was used. As each of an insulating layer 212a and an insulating layer 212b, an approximately 2-μm-thick polyimide film was used. As the terminal electrode 116a, a layered film including an approximately 50-nm-thick tungsten film, an approximately 400-nm-thick aluminum film, and an approximately 100-nm-thick titanium film was used. As the electrode 116b, a layered film including an approximately 100-nm-thick titanium film, an approximately 400-nm-thick aluminum film, and an approximately 100-nm-thick titanium film was used. As the electrode 116c, an approximately 100-nm-thick APC (Ag—Pd—Cu, an alloy of silver, palladium, and copper) film was used. As the first layer 221a, an approximately 800-nm-thick film that is formed of an organic material containing a light-emitting organic compound was used. As the second layer 221b, a layered film including an approximately 80-nm-thick alloy film of silver and magnesium and an ITO film was used.

[Apparatus for Cutting Processing]

The apparatus used for cutting processing in this example was DESKTOP ENGRAVER EGX-350 manufactured by Roland DG Corporation. The material of the blade used in the apparatus was cemented carbide. The blade was a cutter for letters having a tool diameter of 3.175 mm, a tool length of 114 mm, and a width of the edge of the blade of 0.127 mm.

[Experiments for Determining Cutting Conditions]

Next, the conditions for processing the grooves were examined to remove the layer to be removed with no damage to the terminal electrode 116.

First, the processing was performed while the scanning speed of the blade and the cutting depth were fixed and the rotation number of the blade was varied. The scanning speed of the blade was 15 mm/sec in X and Y directions and 5 mm/sec in Z direction. Here, the X and Y directions are the directions parallel to the surface of the processing member 290, and the Z direction is the direction perpendicular to the surface of the processing member 290 (see FIG. 45B). The cutting depth was 200 μm. Here, the origin of the cutting depth (0 μm) is a position where the surface of the processing member 290 (the protective film 108) is in contact with the edge of the blade when the processing member 290 is fixed on a stage of the apparatus. Note that the cutting depth described in this example is a set value of the apparatus and might be different from an actual cutting depth from the surface of the processing member 290 depending on the state of the blade, the horizontal accuracy of a stage where the processing member is fixed, or the like.

The rotated blade was inserted into the processing member 290 from the protective film 108 side by moving the blade in the Z direction. After the blade reached the above cutting depth, the blade was moved in the X and Y directions along a rectangle having round corners while maintaining the cutting depth. After the locus of the blade, in other words, the top shape of the grooves formed by the blade became a closed curve, the blade was moved in the Z direction to be separated from the processing member 290. The region surrounded by the rectangle was inside the second layer 221b when seen from the top. The long side of the rectangle was approximately 34 mm, and the short side was approximately 3 mm.

The cutting processing was performed, the layer to be removed was removed, and an opening was formed. The results are shown in FIGS. 46A, 46B1, 46B2, 46B3, 46C1, 46C2, and 46C3. FIG. 46A is a schematic perspective view illustrating the processing member 290 from which the layer to be removed has been removed. FIGS. 46B1 to 46B3 show the observation results of the opening formed in the processing member 290 through the cutting processing with a rotation number of the blade of 10,000 rpm. For the observation, an optical microscope in a transmissive mode was used. FIGS. 46C1 to 46C3 show the observation results of the opening formed in the processing member 290 through the cutting processing with a rotation number of the blade of 20,000 rpm. For the observation, an optical microscope in a transmissive mode was used. Note that FIGS. 46B1 and 46C1 correspond to a region P1 in FIG. 46A. FIGS. 46B2 and 46C2 correspond to a region P2 in FIG. 46A. FIGS. 46B3 and 46C3 correspond to a region P3 in FIG. 46A.

In the photographs shown in FIGS. 46B1 to 46C3, bright regions do not include a film blocking visible light, and striped portions in dark regions are the terminal electrode 116. Under the condition in which the rotation number of the blade was 10,000 rpm, the layer to be removed was removed without any problem. In contrast, under the condition in which the rotation number of the blade was 20,000 rpm, the terminal electrode 116 was broken at part of the scanning region of the blade, and light is transmitted (at portions surrounded by dashed lines in FIGS. 46C1 and 46C3). Furthermore, under the condition in which the rotation number of the blade was 20,000 rpm, surface roughness of edges of the opening (exposed portions of the protective film 108, the substrate 121, and the like) was large. These occurred probably because when the rotation number was large, a portion that was distanced from a portion in contact with the blade was also cut. According to these results, the rotation number of the blade was set to 10,000 rpm.

Next, the processing was performed while the rotation number of the blade and the cutting depth were fixed and the scanning speed of the blade was varied. The rotation number of the blade was 10,000 rpm. The cutting depth was 200 µm. The locus of the blade in cutting the processing member 290 was similar to that of the above experiment for determining the rotation number of the blade.

FIGS. 47A1 to 47A3 show the observation results of the processing member 290 on which the cutting processing was performed with a low scanning speed of the blade (3 mm/sec in the X and Y directions and 1 mm/sec in the Z direction). FIGS. 47B1 to 47B3 show the observation results of the processing member 290 on which the cutting processing was performed with a high scanning speed of the blade (25 mm/sec in the X and Y directions and 5 mm/sec in the Z direction). Note that FIGS. 47A1 and 47B1 correspond to the region P1 in FIG. 46A. FIGS. 47A2 and 47B2 correspond to the region P2 in FIG. 46A. FIGS. 47A3 and 47B3 correspond to the region P3 in FIG. 46A.

Under the condition in which the scanning speed of the blade was high, the layer to be removed was removed without any problem. In contrast, under the condition in which the scanning speed of the blade was low, the terminal electrode 116 was broken in a large part of the scanning region of the blade, and light is transmitted (see FIGS. 47A1 to 47A3). Furthermore, under the condition in which the scanning speed of the blade was low, surface roughness of edges of the opening was large. According to these results, a high scanning speed of the blade is preferable.

[Experimental Results]

On the basis of the above experiments for determining the processing conditions, an experiment for exposing the terminal electrode 116 in the processing member 290 by the method for manufacturing a light-emitting device of one embodiment of the present invention was conducted.

The rotation number of the blade was 10,000 rpm. The scanning speed of the blade was 30 mm/sec in the X and Y directions and 10 mm/sec in the Z direction. The cutting depth was varied among the sides of the rectangle along which the blade is moved. FIG. 48A illustrates a schematic top view of the processing member 290. The outermost surface of the processing member 290 is the protective film 108. The separation layer 221 and the terminal electrode 116 are shown by dotted lines. Furthermore, FIG. 48A shows a locus 235 along which the blade is moved in cutting the processing member 290.

The locus 235 starts at a point where the blade is inserted into the processing member 290 and ends at a point where the blade is pulled up. As illustrated in FIG. 48A, the locus 235 includes a locus 235a (dashed-two dotted line), a locus 235b (dashed line), a locus 235c (dashed-dotted line), and a locus 235d (dashed line). The cutting depth of the locus 235a was 230 µm, that of the locus 235b was 180 µm, that of the locus 235c was 120 µm, and that of the locus 235d was 170 µm. To perform cutting at a fixed depth, the blade was moved only in the X and Y directions at each locus, and the blade was moved in the Z direction only at boundaries between adjacent loci (black dots in FIG. 48A). The blade passed through the loci 235b to 235d to form the first groove and through the locus 235a to form the second groove. The depth of the second groove was greater than that of the first groove.

The cutting processing was performed, the layer to be removed was removed, and an opening was formed. The results are shown in FIG. 48B and FIGS. 48C1 to 48C6. FIG. 48B is a schematic perspective view illustrating the processing member 290 from which the layer to be removed has been removed. FIGS. 48C1 to 48C6 show the observation results of the opening with an optical microscope in a transmissive mode. Note that FIGS. 48C1 to 48C6 correspond to regions Q1 to Q6 in FIG. 48B, respectively. Note that after the layer to be removed was removed from the processing member 290, the first layer 221a remaining over the terminal electrode 116 was removed using acetone. As illustrated in FIGS. 48C1 to 48C6, the terminal electrode 116 was able to be exposed without being damaged by the cutting processing.

This example shows that damage to the terminal electrode can be reduced by the method for manufacturing a light-emitting device of one embodiment of the present invention.

[Process Margin in Depth Direction]

In relation to the method for manufacturing a light-emitting device of one embodiment of the present invention, an experiment for examining a process margin in depth direction in cutting by the blade was conducted.

The cutting apparatus used for the experiment for examining a process margin was MODELA MDX-40A manufactured by Roland DG Corporation. The material of the blade used in the cutting apparatus was cemented carbide. The blade was a cutter for letters having a tool diameter of 3.175 mm, a tool length of 114 mm, and a width of the edge of the blade of 0.127 mm. The resolution in cutting in the Z direction by the cutting apparatus was 2 µm/step.

A processing member similar to the processing member 290 was processed while the scanning speed of the blade and the rotation number were fixed and the cutting depth was varied. Specifically, the scanning speed of the blade was 25 mm/sec in the X and Y directions and 30 mm/sec in the Z direction. The rotation number of the blade was 11,000 rpm. The locus of the blade in cutting the processing member was similar to the locus 235 illustrated in FIG. 48A except the cutting depth. In this experiment, the processing was performed while the cutting depth at the locus 235a was fixed to 190 µm and the cutting depths at the loci 235b, 235c, and 235d (hereinafter, also referred to as the cutting depth at a terminal electrode portion) were varied as shown in Table 1.

Table 1 shows the experimental results.

TABLE 1

| Cutting depth at terminal electrode portion (µm) | Removal of layer to be removed | Damage to terminal electrode | Applicability of manufacturing method |
|---|---|---|---|
| 120 | not removed | not damaged | low |
| 122 | removed | not damaged | high |
| 124 | removed | not damaged | high |
| 130 | removed | not damaged | high |
| 134 | removed | not damaged | high |
| 142 | removed | not damaged | high |
| 144 | removed | damaged | low |
| 150 | removed | damaged | low |

In the case where the cutting depth at the terminal electrode portion was greater than or equal to 122 µm, the layer to be removed was able to be removed after the cutting processing. This shows that the blade penetrates the protective film 108 and reaches the substrate 121 in the cutting processing, so that the layer to be removed can be removed. In the case where the cutting depth at the terminal electrode portion was smaller than or equal to 142 μm, the cutting processing was able to be performed with no damage to the terminal electrode 116. These results show that the cutting depth of the cutting apparatus is set to greater than or equal to 122 μm and smaller than or equal to 142 μm, so that the terminal electrode 116 can be exposed without being damaged. That is, in the case where the cutting processing of a processing member similar to the processing member 290 is performed with the cutting apparatus, the process margin in depth direction is approximately 20 μm.

[Takt Time with Assumption of Mass Production]

Figure 49:
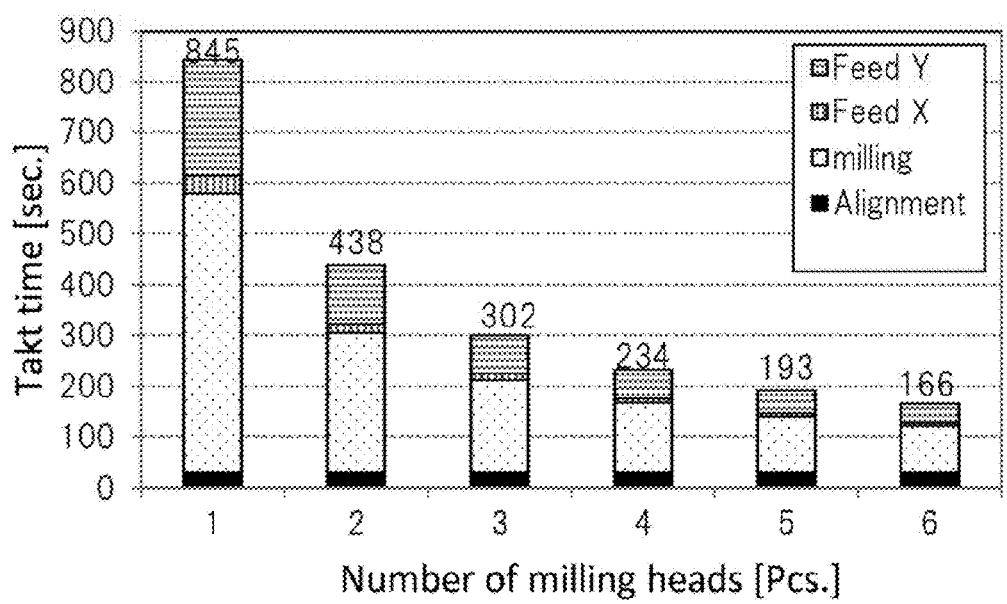
FIG. 49 shows calculation results of takt time.

FIG. 49 shows the calculation results of takt time for forming grooves with the cutting apparatus MODELA MDX-40A on the assumption of mass production of the display device of one embodiment of the present invention. Here, the takt time refers to time taken for performing the cutting processing on a plurality of display devices (here, 110 display devices) provided over one substrate.

The conditions in this calculation are as follows. Over a glass substrate having the size of 750 mm×1850 mm that is half the size of a large-sized glass substrate having the size of $6^{th}$ generation (1500 mm×1850 mm) (hereinafter the large-sized glass substrate is also referred to as G6), 110 (=5×22) display devices each with a 5-inch (diagonal) display region (131 mm×82 mm) are provided. Time for alignment of the blade in the cutting apparatus was assumed to be 30 seconds. Time for cutting in forming the grooves was assumed to be 5 sec/panel. The scanning speed of the blade in the X and Y directions was assumed to be 50 mm/sec. High productivity can be achieved by an increase in the number of heads of the cutting apparatus, that is, the number of heads of the blade that can perform processing simultaneously, and the takt time can be set to 180 seconds or less by using six heads (see FIG. 49).

Figure 50:
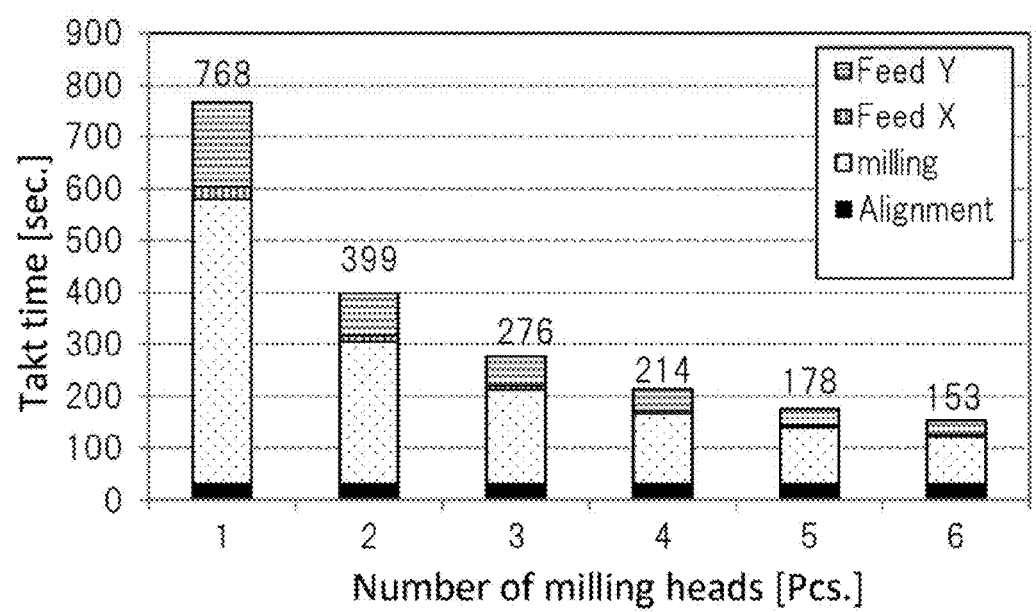
FIG. 50 shows calculation results of takt time.

Note that FIG. 49 shows the calculation results of the glass substrate whose short side is half that of the G6. Meanwhile, calculation results of a glass substrate whose long side is half that of the G6 are shown in FIG. 50. FIG. 50 is different from FIG. 49 in that 110 (=11×10) display devices each with a 5-inch (diagonal) display region are provided over the glass substrate having the size of 1500 mm×925 mm. According to FIG. 50, the takt time can be set to 180 seconds or less by using five or more heads.

Example 2

In this example, adhesion between a peeling layer and an insulating layer and adhesion between an EL layer and a cathode were evaluated.

When a stacked-layer structure of a light-emitting device of one embodiment of the present invention includes a portion having a low adhesion, a peeling at an desired interface (e.g., the interface between the peeling layer and the insulating layer) might become difficult at a step of manufacturing the light-emitting device. For example, adhesion between an EL layer and an electrode and adhesion between layers forming an EL layer are sometimes relatively low; and in such a case, films might be separated at the interface, leading to a decrease in yield.

In this example, the adhesion between the peeling layer and the insulating layer and the adhesion between the EL layer and the cathode were evaluated by measuring force required for peeling at the interface between the peeling layer and the insulating layer and force required for peeling at the interface between the EL layer and the cathode.

In this example, Sample A was used to measure the force required for peeling at the interface between the peeling layer and the insulating layer, and Sample B was used to measure the force required for peeling at the interface between the EL layer and the cathode.

Figure 51A:
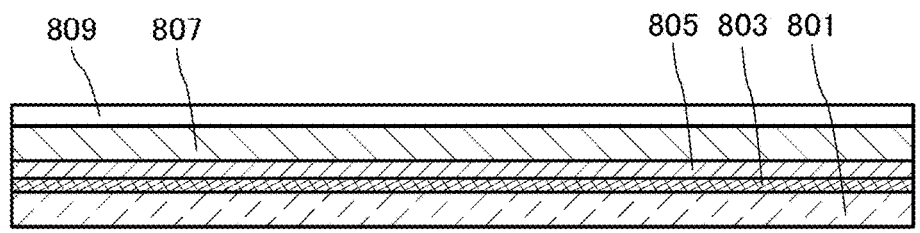
FIGS. 51A to 51C illustrate samples and a jig.

As illustrated in FIG. 51A, Sample A includes a glass substrate 801, a peeling layer 803, an insulating layer 805, an element layer 807, and a film substrate 809.

First, an approximately 30-nm-thick tungsten film was formed over the glass substrate 801 as the peeling layer 803 by a sputtering method.

Next, an approximately 600-nm-thick silicon oxynitride film, an approximately 200-nm-thick silicon nitride film, an approximately 200-nm-thick silicon oxynitride film, an approximately 100-nm-thick silicon nitride film, and an approximately 100-nm-thick silicon oxynitride film were formed over the peeling layer 803 as the insulating layer 805 by a plasma CVD method.

Then, heat treatment was performed at 450° C. in a nitrogen atmosphere for one hour.

After that, a transistor using an oxide semiconductor and other components were formed over the insulating layer 805 as the element layer 807. Then, the element layer 807 and the film substrate 809 were attached to each other. An organic resin film was used for the film substrate 809. In this manner, Sample A was fabricated.

Figure 51B:
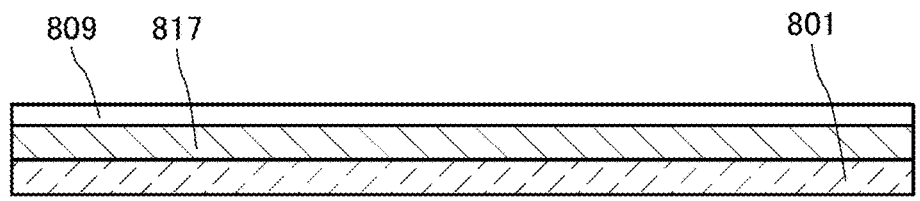

As illustrated in FIG. 51B, Sample B includes the glass substrate 801, an element layer 817, and the film substrate 809.

First, the element layer 817 was formed over the glass substrate 801. As the element layer 817, components similar to those of the element layer 807 (e.g., the transistor using an oxide semiconductor) were formed, and then an organic EL element was formed thereover.

For the organic EL element, a stacked layer including a fluorescent light-emitting unit including a light-emitting layer containing a blue fluorescent material as a light-emitting material and a phosphorescent light-emitting unit including light-emitting layers containing green and red phosphorescent materials as light-emitting materials was used. The organic EL element includes an anode, an EL layer, and a cathode positioned in this order from the glass substrate 801 side. As the cathode, an approximately 15-nm-thick magnesium-silver alloy film and an approximately 70-nm-thick ITO film were formed.

Note that depending on the formation conditions of the ITO film, the adhesion between the EL layer and the cathode is changed in some cases. In this example, an ITO film was formed under the following conditions: the flow rate of argon was 50 sccm, the flow rate of oxygen was 2 sccm, the pressured was 1 Pa, and the current was 2 A.

Then, the element layer 817 and the film substrate 809 were attached to each other. In this manner, Sample B was fabricated.

Figure 51C:
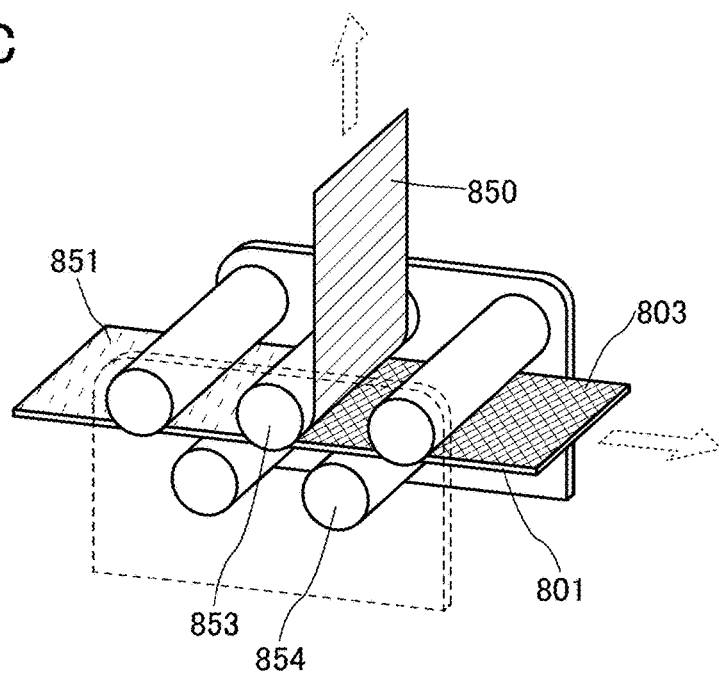

A jig illustrated in FIG. 51C was used for the evaluation of the adhesion of the samples in this example. The jig illustrated in FIG. 51C includes a plurality of guide rollers 854 and a support roller 853. A tape 851 was attached onto a stack 850 formed over the glass substrate 801 and an end portion of the tape 851 was partly peeled in advance. Next, the glass substrate 801 was mounted on the jig by hanging the tape 851 and the stack 850 on the support roller 853, and the peeled part of the tape 851 and the stack 850 is set to be perpendicular to the glass substrate 801. The force required for peeling can be measured as follows: when the tape 851 is pulled at a rate of 20 mm/min in a direction perpendicular to the glass substrate 801 to peel the stack 850 from the glass substrate 801, the pulling force in the perpendicular direction is measured. Here, the stack 850 of Sample A includes the insulating layer 805, the element layer 807, and the film substrate 809. That is, as illustrated in FIG. 51C, during the peeling, in Sample A, the glass substrate 801 is moved along the guide rollers 854 in the plane direction of the glass substrate 801 while the peeling layer 803 is exposed. In contrast, the stack 850 of Sample B includes the cathode and the film substrate 809. That is, during the peeling, in Sample B, the glass substrate 801 is moved along the guide rollers 854 in the plane direction of the glass substrate 801 while the EL layer is exposed. The support roller 853 and the guide rollers 854 are rotatable so that the stack 850 and the glass substrate 801 are not affected by friction during the move.

For the evaluation of the adhesion, a compact table-top universal tester (EZ-TEST EZ-S-50N) manufactured by Shimadzu Corporation was used. For the peeling test, an adhesive tape/adhesive sheet testing method based on standard number JIS Z0237 of Japanese Industrial Standards (JIS) was employed. Each sample had a size of 126 mm×25 mm.

In this example, the median of the force required for separation in the range of 20 mm to 50 mm inclusive from the start point of the measurement was obtained. Note that two Samples A and two Samples B were fabricated and evaluated, and the average value of the obtained medians was calculated.

As a result, the force required for peeling at the interface between the peeling layer 803 and the insulating layer 805 in Sample A was 0.094 N. The force required for peeling at the interface between the EL layer and the cathode in Sample B was 0.270 N. That is, in this example, the adhesion between the EL layer and the cathode was twice or more as large as that between the peeling layer 803 and the insulating layer 805.

According to the above description, this example shows that an organic EL element including the EL layer and the cathode between which the adhesion is higher than between the peeling layer and the insulating layer can be fabricated. Thus, with the manufacturing step of a light-emitting device, the film peeling of the organic EL element is reduced, and the yield of the peeling at the interface between the peeling layer and the insulating layer can be increased.

This application is based on Japanese Patent Application serial No. 2015-087728 filed with Japan Patent Office on Apr. 22, 2015, the entire contents of which are hereby incorporated by reference.

What is claimed is:

1. A method for manufacturing a circuit board, comprising the steps of:
   forming a processing member comprising a circuit and a terminal electrode over a first substrate, a separation layer over the terminal electrode, a bonding layer over the separation layer, and a second substrate over the bonding layer;
   forming a groove in the processing member by rotating a blade; and
   removing part of the separation layer, part of the bonding layer, and part of the second substrate to expose part of the terminal electrode,
   wherein the groove comprises a first groove and a second groove that have different depths.

2. The method for manufacturing a circuit board, according to claim 1, wherein the part of the separation layer, the part of the bonding layer, and the part of the second substrate are positioned in a region surrounded by the first groove and the second groove.

3. The method for manufacturing a circuit board, according to claim 2,
   wherein a top shape of the region surrounded by the first groove and the second groove has a plurality of corners, and
   wherein at least one of the plurality of corners has a round shape.

4. The method for manufacturing a circuit board, according to claim 1, wherein the second substrate is flexible.

5. The method for manufacturing a circuit board, according to claim 1, wherein at least part of the first groove and at least part of the second groove overlap with the separation layer.

6. The method for manufacturing a circuit board, according to claim 1, wherein the second groove is deeper than the first groove.

7. The method for manufacturing a circuit board, according to claim 1,
   wherein the first groove is formed in the second substrate, and
   wherein the second groove is formed in the second substrate, the bonding layer, and the separation layer.

8. A method for manufacturing an electronic device comprising the circuit board, comprising the step of providing the circuit board in a housing,
   wherein the circuit board is manufactured by the method for manufacturing a circuit board, according to claim 1, and
   wherein the electronic device comprises at least one of an antenna, a battery, a speaker, a microphone, and an operation button.

9. A method for manufacturing a circuit board, comprising the steps of:
   forming a processing member comprising a circuit and a terminal electrode over a first substrate, a separation layer over the terminal electrode, a bonding layer over the separation layer, and a second substrate over the bonding layer;
   forming a first groove and a second groove that have different depths in the processing member by rotating a blade; and
   removing part of the separation layer, part of the bonding layer, and part of the second substrate that are positioned in a region surrounded by the first groove and the second groove to expose the terminal electrode,
   wherein the second substrate is flexible.

10. The method for manufacturing a circuit board, according to claim 9, wherein at least part of the first groove and at least part of the second groove overlap with the separation layer.

11. The method for manufacturing a circuit board, according to claim 9, wherein the second groove is deeper than the first groove.

12. The method for manufacturing a circuit board, according to claim 9,
   wherein the first groove is formed in the second substrate, and
   wherein the second groove is formed in the second substrate, the bonding layer, and the separation layer.

13. The method for manufacturing a circuit board, according to claim 9,
   wherein a top shape of the region surrounded by the first groove and the second groove has a plurality of corners, and
   wherein at least one of the plurality of corners has a round shape.

14. A method for manufacturing an electronic device comprising the circuit board, comprising the step of providing the circuit board in a housing, wherein the circuit board is manufactured by the method for manufacturing a circuit board, according to claim 9, and wherein the electronic device comprises at least one of an antenna, a battery, a speaker, a microphone, and an operation button.

15. A method for manufacturing a light-emitting device, comprising the steps of:

providing a first peeling layer over a first surface of a first substrate;

providing a first insulating layer over the first peeling layer;

providing a terminal electrode over the first insulating layer;

providing a second insulating layer over the first insulating layer and the terminal electrode;

removing part of the second insulating layer to provide an opening;

providing a light-emitting element and a separation layer over the second insulating layer;

providing a second peeling layer over a second surface of a second substrate;

providing a third insulating layer over the second peeling layer;

overlapping the first substrate and the second substrate with a bonding layer interposed between the first substrate and the second substrate so that the first surface faces the second surface;

separating the first substrate from the first insulating layer together with the first peeling layer;

providing a third substrate so that the third substrate overlaps with the first insulating layer;

separating the second substrate from the third insulating layer together with the second peeling layer;

providing a fourth substrate so that the fourth substrate overlaps with the third insulating layer;

forming a first groove in the fourth substrate and a second groove in the fourth substrate, the third insulating layer, the bonding layer, and the separation layer by rotating a blade; and removing part of the separation layer, part of the bonding layer, and part of the second substrate that are positioned in a region surrounded by the first groove and the second groove to expose the terminal electrode, wherein at least part of the first groove and at least part of the second groove overlap with part of the separation layer, and wherein the second groove is deeper than the first groove.

16. The method for manufacturing a light-emitting device, according to claim 15, wherein the fourth substrate is flexible.

17. The method for manufacturing a light-emitting device, according to claim 15, wherein a top shape of the region surrounded by the first groove and the second groove is a rectangle, and wherein at least one corner of the rectangle has a round shape.

18. A method for manufacturing an electronic device comprising the light-emitting device, comprising the step of providing the light-emitting device in a housing, wherein the light-emitting device is manufactured by the method for manufacturing a light-emitting device, according to claim 15, and wherein the electronic device comprises at least one of an antenna, a battery, a speaker, a microphone, and an operation button.

* * * * *